(12) United States Patent
Lee et al.

(10) Patent No.: US 9,093,439 B2
(45) Date of Patent: Jul. 28, 2015

(54) SEMICONDUCTOR PACKAGE AND METHOD OF FABRICATING THE SAME

(71) Applicant: Samsung Electronics Co., Ltd., Suwon-Si, Gyeonggi-Do (KR)

(72) Inventors: Seok-Hyun Lee, Hwaseong-si (KR); Jin-Woo Park, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 75 days.

(21) Appl. No.: 13/944,224

(22) Filed: Jul. 17, 2013

(65) Prior Publication Data
US 2014/0070407 A1 Mar. 13, 2014

(30) Foreign Application Priority Data
Sep. 12, 2012 (KR) .................. 10-2012-0101153

(51) Int. Cl.
*H01L 23/498* (2006.01)
*H01L 23/00* (2006.01)
(Continued)

(52) U.S. Cl.
CPC ........ *H01L 23/49811* (2013.01); *H01L 21/486* (2013.01); *H01L 21/4853* (2013.01); *H01L 23/49816* (2013.01); *H01L 23/49822* (2013.01); *H01L 23/49827* (2013.01); *H01L 23/5389* (2013.01); *H01L 24/24* (2013.01); *H01L 24/82* (2013.01); *H01L 25/105* (2013.01); *H01L 25/50* (2013.01); *H01L 21/568* (2013.01); *H01L 25/0657* (2013.01); *H01L 2224/24145* (2013.01); *H01L 2224/24226* (2013.01); *H01L 2224/32145* (2013.01); *H01L 2224/73267* (2013.01); *H01L 2224/8203* (2013.01);
(Continued)

(58) Field of Classification Search
CPC ............ H01L 23/49811; H01L 23/498; H01L 2225/06548
USPC .......................... 257/686, 734, 773, 774, 777
See application file for complete search history.

(56) References Cited

U.S. PATENT DOCUMENTS

| 4,463,498 A | 8/1984 | Everts |
| 5,886,412 A * | 3/1999 | Fogal et al. .................. 257/777 |

(Continued)

FOREIGN PATENT DOCUMENTS

| JP | 2008182225 A | 8/2008 |
| JP | 2008211213 A | 9/2008 |

(Continued)

*Primary Examiner* — Peniel M Gumedzoe
(74) *Attorney, Agent, or Firm* — Harness, Dickey & Pierce, P.L.C.

(57) ABSTRACT

According to example embodiments, a semiconductor package includes: a lower molding element; a lower semiconductor chip in the lower molding element and having lower chip pads on an upper surface and at an areas close to first and second sides of the lower molding element; conductive pillars surrounding the lower semiconductor chip and passing through the lower molding element; an upper semiconductor chip on the upper surface of the lower molding element and lower semiconductor chip, the upper semiconductor chip having upper chip pads on a top surface and at areas close to third and the fourth sides of the upper semiconductor chip, and a connecting structure on the lower molding element and the upper semiconductor chip and electrically connecting each of the lower chip pads and upper chip pads to a corresponding conductive pillar. The upper semiconductor chip is substantially orthogonal to the lower semiconductor chip.

19 Claims, 41 Drawing Sheets

(51) Int. Cl.
  *H01L 21/48* (2006.01)
  *H01L 23/538* (2006.01)
  *H01L 25/10* (2006.01)
  *H01L 25/00* (2006.01)
  *H01L 21/56* (2006.01)
  *H01L 25/065* (2006.01)

(52) U.S. Cl.
  CPC ............... *H01L 2224/92244* (2013.01); *H01L 2225/06524* (2013.01); *H01L 2225/1035* (2013.01); *H01L 2225/1058* (2013.01); *H01L 2924/15311* (2013.01); *H01L 2924/18162* (2013.01)

(56) References Cited

U.S. PATENT DOCUMENTS

| | | | |
|---|---|---|---|
| 7,262,081 B2 | 8/2007 | Yang et al. | |
| 8,178,963 B2 | 5/2012 | Yang | |
| 8,178,964 B2 | 5/2012 | Yang | |
| 2008/0088004 A1 | 4/2008 | Yang et al. | |
| 2008/0197469 A1 | 8/2008 | Yang et al. | |
| 2008/0258288 A1 | 10/2008 | Park et al. | |
| 2009/0014876 A1 | 1/2009 | Youn et al. | |
| 2009/0230533 A1 | 9/2009 | Hoshino et al. | |
| 2009/0302445 A1* | 12/2009 | Pagaila et al. | 257/678 |
| 2010/0320585 A1* | 12/2010 | Jiang et al. | 257/686 |
| 2012/0217644 A1* | 8/2012 | Pagaila | 257/774 |

FOREIGN PATENT DOCUMENTS

| | | |
|---|---|---|
| JP | 2009038335 A | 2/2009 |
| KR | 20060007528 A | 1/2006 |
| KR | 20080111211 A | 12/2008 |
| KR | 100997791 B1 | 12/2010 |
| KR | 20110030089 A | 3/2011 |

\* cited by examiner

SEMICONDUCTOR PACKAGE AND METHOD OF FABRICATING THE SAME

CROSS-REFERENCE TO RELATED APPLICATION

This application claims priority under 35 U.S.C. §119 to Korean Patent Application No. 10-2012-0101153 filed on Sep. 12, 2012, the disclosure of which is hereby incorporated by reference in its entirety.

BACKGROUND

1. Field

Example embodiments of inventive concepts relate to a semiconductor package including a semiconductor chip having chip pads disposed on an upper surface thereof close to two opposite sides, and a method of fabricating the same.

2. Description of Related Art

A semiconductor package may include at least one semiconductor chip. Various studies for achieving high integration and improving reliability have been conducted on semiconductor packages.

SUMMARY

Example embodiments of inventive concepts relate to a semiconductor package including a semiconductor chip having chip pads disposed on an upper surface thereof close to two opposite sides, and/or a method of fabricating the same.

Example embodiments of inventive concepts relate to a semiconductor package that limits (and/or prevents) damage to an electrical connection between chip pads of a semiconductor chip from an external environment, and/or a method of fabricating the same.

Features and/or advantages of example embodiments of inventive concepts are not limited to the foregoing; other features and/or advantages may become apparent to those of ordinary skill in the art based on the following descriptions.

In accordance with example embodiments of inventive concepts, a semiconductor package includes: a lower molding element including a first side, a second side opposite the first side, a third side substantially perpendicular to the first side, and a fourth side opposite the third side; a lower semiconductor chip in the lower molding element, the lower semiconductor chip including lower chip pads on an upper surface of the lower semiconductor chip and at areas close to the first side and the second side of the lower molding element; conductive pillars surrounding the lower semiconductor chip and passing through the lower molding element; an upper semiconductor chip on the upper surface of the lower molding element and the lower semiconductor chip, the upper semiconductor chip including upper chip pads on a top surface of the supper semiconductor chip and at areas close to the third side and the fourth side of the lower molding element, and a connecting structure on the lower molding element and the upper semiconductor chip, the connecting structure electrically connecting each of the lower chip pads and upper chip pads to a corresponding one of conductive pillars. A level of the upper surface of the lower semiconductor chip is equal to a level of an upper surface of the lower molding element. The upper semiconductor chip is substantially orthogonal to the lower semiconductor chip.

In example embodiments, the connecting structure may include a first upper insulating layer in direct contact with the upper surface of the lower molding element, the upper surface of the lower semiconductor chip, and side and upper surfaces of the upper semiconductor chip. The connecting structure may further include a first redistribution pattern on the first upper insulating layer, and a second upper insulating layer on the first redistribution pattern. The first redistribution pattern may include first contact plugs in direct contact with upper surfaces of the conductive pillars, second contact plugs in direct contact with upper surfaces of the lower chip pads, and third contact plugs in direct contact with upper surfaces of the upper chip pads.

In example embodiments, sides of the second upper insulating layer may be farther away from the upper semiconductor chip than outermost sides of the first redistribution pattern.

In example embodiments, the sides of the second upper insulating layer may be vertically aligned with sides of the first upper insulating layer.

In example embodiments, the connecting structure may further include a second redistribution pattern on the second upper insulating layer, and a third insulating layer on the second redistribution pattern. The second redistribution pattern may include fourth contact plugs in direct contact with an upper surface of the first redistribution pattern.

In example embodiments, sides of the third upper insulating pattern may be farther away from the semiconductor chip than outermost sides of the second redistribution pattern, and vertically aligned with the sides of the second upper insulating layer.

In example embodiments, some of the lower chip pads may be electrically connected to corresponding upper chip pads, and the second redistribution pattern may be configured to supply a same signal to the some of the lower chip pads and the corresponding upper chip pads.

In example embodiments, the semiconductor package may further include external terminals, and each of the external terminals may be in direct contact with a lower surface of one of the conductive pillars.

In example embodiments, a vertical height of the upper semiconductor chip may be smaller than a vertical height of the lower semiconductor chip.

In example embodiments, the vertical height of the lower semiconductor chip may be the same as a vertical height of the lower molding element.

In example embodiments, the semiconductor package may further include an adhesive layer between the lower semiconductor chip and the upper semiconductor chip. The adhesive layer may be in direct contact with the upper surface of the lower semiconductor chip and a lower surface of the upper semiconductor chip.

In example embodiments, the adhesive layer may extend between the upper semiconductor chip and the lower molding element.

In accordance with example embodiments of inventive concepts, a semiconductor package includes: a lower semiconductor chip including: lower chip pads disposed on an upper surface thereof, the lower chip pads being close to two opposite sides of the lower semiconductor chip; a lower molding element surrounding sides of the lower semiconductor chip; conductive pillars penetrating the lower molding element along edges of the lower molding element; external terminals in direct contact one-to-one with lower surfaces of the conductive pillars; an upper semiconductor chip on the upper surface of the lower semiconductor chip, the upper semiconductor chip including upper chip pads on an upper surface thereof, the upper semiconductor chip not covering the lower chip pads; a connecting structure on the lower molding element and the upper semiconductor chip, the connecting structure including sides that are vertically aligned with sides of the lower molding element, the connecting structure electrically connecting each of the lower chip pads and the upper chip pads to corresponding ones of the external terminals through corresponding ones of the conductive pillars; and an upper molding element on an upper surface of the connecting structure, the upper molding element including sides that are vertically aligned with sides of the connecting structure.

In example embodiments, a coefficient of the thermal expansion of the lower molding element may be smaller than a coefficient of the thermal expansion of the upper molding element.

In example embodiments, the lower molding element may be harder than the upper molding element.

In accordance with example embodiments of inventive concepts, a semiconductor package includes: a lower semiconductor chip including a plurality of lower chip pads on two opposite ends of an upper surface, and a plurality of sides; a lower molding element surrounding the plurality of sides of the lower semiconductor chip and exposing the upper surface of the lower semiconductor chip; an upper semiconductor chip orthogonally crossing over the upper surface of the semiconductor chip between the plurality of lower chip pads on opposite ends, the upper semiconductor chip including a plurality of upper chip pads on two portions of the upper semiconductor chip, the two portions of the upper semiconductor chip extending over the lower molding element from two sides of the plurality of sides of the lower semiconductor chip; a plurality of conductive pillars that are spaced apart from the lower semiconductor chip and extend through the lower molding element; and a connecting structure that electrically connects upper surfaces of the plurality of lower chip pads and upper surfaces of the plurality of upper chip pads to upper surfaces of the plurality of conductive pillars.

In example embodiments, a plurality of external terminals may be electrically connected one-to-one to bottom surfaces of the plurality of conductive pillars.

In example embodiments, the connecting structure may include a first insulating layer on the molding layer, the two opposite ends of the lower semiconductor chip, and the upper semiconductor chip. The first insulating layer may define first upper via holes that expose the upper surfaces of the plurality of conductive pillars, second upper via holes that expose the upper surfaces of the plurality of lower chip pads, and third upper via holes that expose the upper surfaces of the plurality of upper chip pads. The connecting structure may include a first redistribution pattern on the first insulating layer.

In example embodiments, the connecting structure may further include a second insulating layer on the first redistribution pattern. Sides of the second insulating layer may be farther away from the upper semiconductor chip than outermost sides of the first redistribution pattern.

In example embodiments, an upper molding element may be on the upper semiconductor chip and the lower molding element. A coefficient of the thermal expansion of the lower molding element may be smaller than a coefficient of the thermal expansion of the upper molding element. A hardness of the lower molding element may be harder than a hardness of the upper molding element.

BRIEF DESCRIPTION OF THE DRAWINGS

The foregoing and other features and advantages of example embodiments of inventive concepts will be more apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIGS. 7A to 28A, 7B to 28B, and 7C to 28C are cross-sectional views sequentially describing a method of fabricating a semiconductor package in accordance with example embodiments of inventive concepts;

FIGS. 29A to 35A, 29B to 35B, and 29C to 35C are cross-sectional views sequentially describing a method of fabricating a semiconductor package in accordance with example embodiments of inventive concepts;

DETAILED DESCRIPTION OF THE EMBODIMENTS

Figure 1:
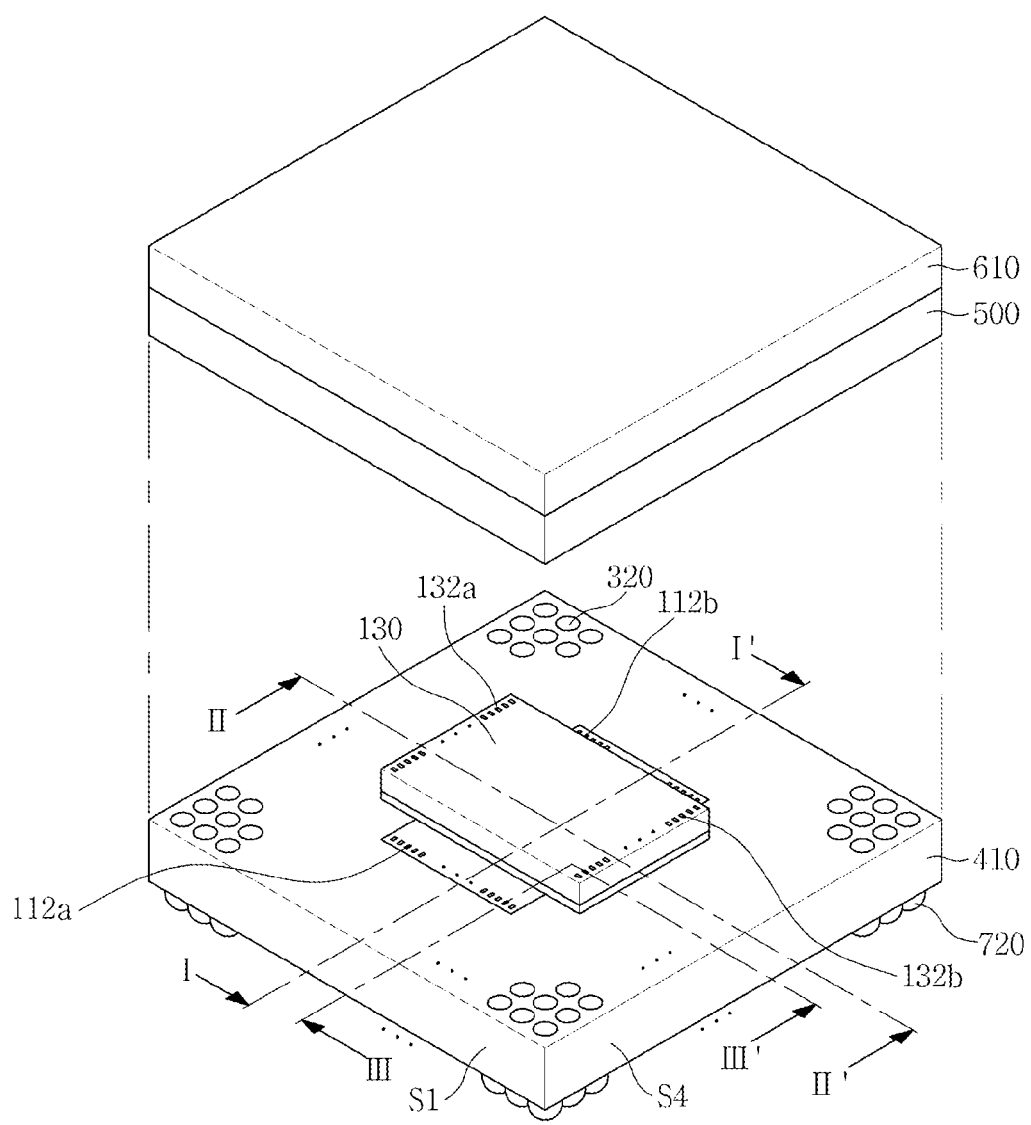
FIG. 1 is a separated perspective view showing a semiconductor package in accordance with example embodiments of inventive concepts.

Example embodiments of inventive concepts will now be described more fully with reference to the accompanying drawings in which some example embodiments of inventive concepts are shown. Example embodiments of inventive concepts, however, be embodied in different forms and should not be construed as limited to the embodiments set forth herein. Rather, these example embodiments of inventive concepts are provided so that this disclosure is thorough and complete and fully conveys the scope of example embodiments of inventive concepts to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Example embodiments of inventive concepts are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments of inventive concepts.

Unless otherwise defined, all terms (including technical and scientific terms) used herein are to be interpreted as is customary in the art to which example embodiments of inventive concepts belong. It will be further understood that terms in common usage should also be interpreted as is customary in the relevant art and not in an idealized or overly formal sense unless expressly so defined herein.

Figure 2A:
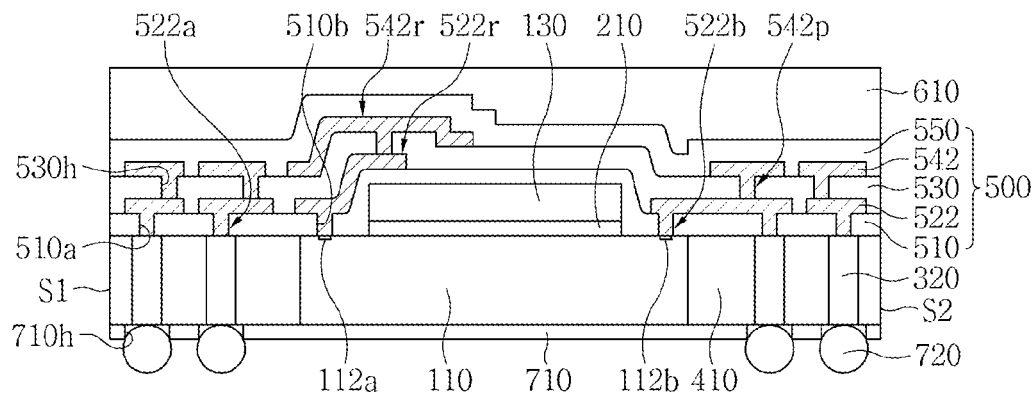
FIG. 2A shows a cross-sectional view taken along line I-I' in FIG. 1.
Figure 2B:
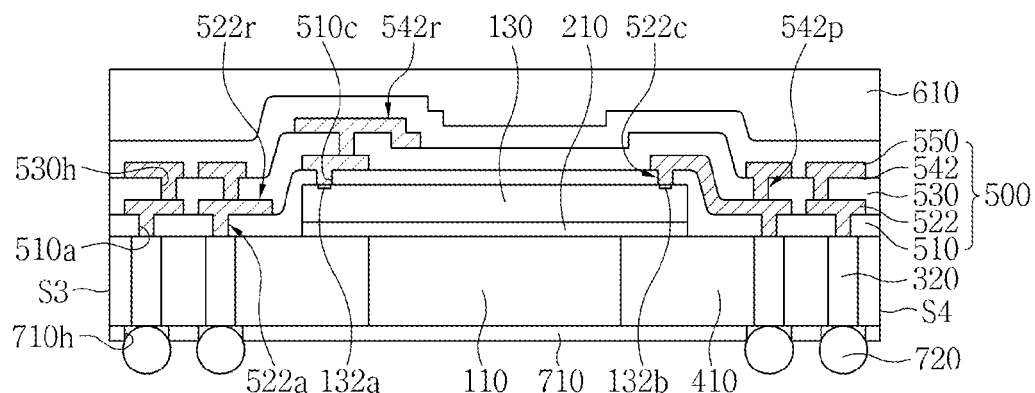
FIG. 2B shows a cross-sectional view taken along line II-II' in FIG. 1.
Figure 2C:
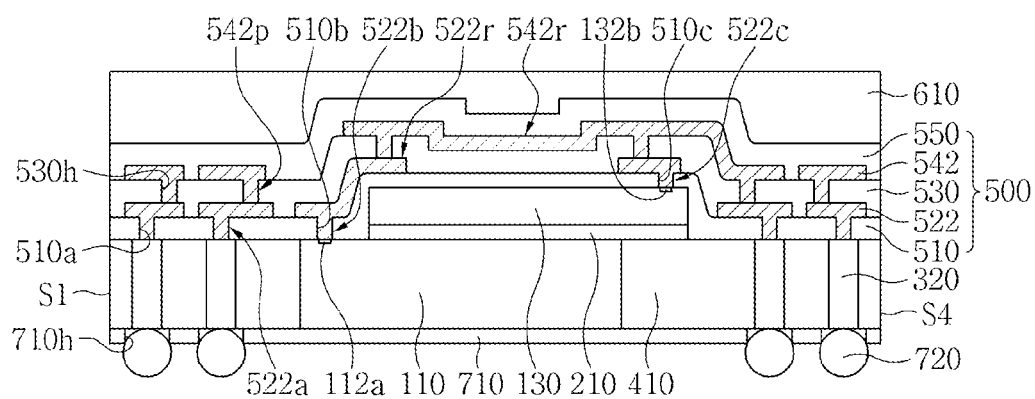
FIG. 2C shows a cross-sectional view taken along line III-III' in FIG. 1.

FIG. 1 is a separated perspective view showing a semiconductor package in accordance with example embodiments of inventive concepts. FIG. 2A is a cross-sectional view taken along line I-I' in FIG. 1. FIG. 2B is a cross-sectional view taken along line II-II' in FIG. 1. FIG. 2C is a cross-sectional view taken along line III-III' in FIG. 1.

Referring to FIG. 1 and FIGS. 2A to 2C, a semiconductor package in accordance with example embodiments of inventive concepts may include a lower semiconductor chip 110, an upper semiconductor chip 130, conductive pillars 320, a lower molding element 410, a connecting structure 500, and an upper molding element 610.

The semiconductor package may further include external terminals 720 disposed on lower surfaces of the conductive pillars 320. Each of the external terminals 720 may be in direct contact with the lower surface of a corresponding conductive pillar 320. The external terminals 720 may include a solder ball, a solder bump, a grid array, or a conductive tab.

The lower semiconductor chip 110 may include a memory device. For example, the lower semiconductor chip 110 may include a dynamic random access memory (DRAM) device; a flash memory device, or a variable resistance memory device, but example embodiments of inventive concepts are not limited thereto.

The lower semiconductor chip 110 may be disposed under the upper semiconductor chip 130. The lower semiconductor chip 110 may be orthogonal to the upper semiconductor chip 130. The lower semiconductor chip 110 may be disposed in the lower molding element 410. The lower semiconductor chip 110 may be disposed in the middle of the lower molding element 410. The level of an upper surface of the lower semiconductor chip 110 may be the same as that of an upper surface of the lower molding element 410.

The vertical height of the lower semiconductor chip 110 may be the same as a vertical height of the lower molding element 410. The lower semiconductor chip 110 may pass through the lower molding element 410.

The lower semiconductor chip 110 may include lower chip pads 112a and 112b. The lower chip pads 112a and 112b may be disposed on the upper surface of the lower semiconductor chip 110. The lower chip pads 112a and 112b may be disposed on the upper surface of the lower semiconductor chip 110 exposed by the upper semiconductor chip 130. The lower chip pads 112a and 112b may be arranged so they are not vertically overlapped by the upper semiconductor chip 130.

The lower chip pads 112a and 112b may include first lower chip pads 112a and second lower chip pads 112b. The second lower chip pads 112b and the first lower chip pads 112a may be symmetrical. The first lower chip pads 112a and the second lower chip pads 112b may be disposed at areas close to two opposite sides on the upper surface of the lower semiconductor chip 110. For example, the first lower chip pads 112a may be disposed close to a first side S1 of the lower molding element 410. The second lower chip pads 112b may be disposed close to a second side S2 of the lower molding element 410. The second side S2 of the lower molding element 410 may be opposite the first side S1 of the lower molding element 410. A data signal, an address/control signal, and a power voltage signal may be supplied to the lower chip pads 112a and 112b. A different signal may be supplied to each of the lower chip pads 112a and 112b. For example, the power voltage signal may be supplied to one of the first lower chip pads 112a. A first data signal may be supplied to another one of the first lower chip pads 112a. A second data signal may be supplied to one of the second lower chip pads 112b. The address/control signal may be supplied to another one of the second lower chip pads 112b.

The lower chip pads 112a and 112b may include a conductive material. For example, the lower chip pads 112a and 112b may include a metal such as Au, Ag, Cu, Ni, or Al, but example embodiments of inventive concepts are not limited thereto.

The upper semiconductor chip 130 may include a memory device. For example, the upper semiconductor chip 130 may include a DRAM device, a flash memory device, or a variable resistance memory device, but example embodiments of inventive concepts are not limited thereto. The upper semiconductor chip 130 may be the same kind of chip as the lower semiconductor chip 110.

In a semiconductor package in accordance with example embodiments of inventive concepts, both of the lower semiconductor chip 110 and the upper semiconductor chip 130 may include memory devices. However, example embodiments of inventive concepts are not limited thereto. For example, the lower semiconductor chip 110 or the upper semiconductor chip 130 may include a logic device. For example, the lower semiconductor chip 110 may include a logic device such as a microprocessor (MP).

The upper semiconductor chip 130 may be disposed on the upper surface of the lower semiconductor chip 110. The upper semiconductor chip 130 may be orthogonally stacked on the upper surface of the lower semiconductor chip 110. Some area of the upper semiconductor chip 130 may be arranged to not vertically overlap the lower semiconductor chip 110. The area of the upper semiconductor chip 130 that may be arranged to not vertically overlap the lower semiconductor chip 110 may vertically overlap the lower molding element 410.

The horizontal area of the upper semiconductor chip 130 may be the same as that of the lower semiconductor chip 110. For example, the horizontal length and width of the upper semiconductor chip 130 may be the same as the horizontal length and width of the lower semiconductor chip 110. The vertical height of the upper semiconductor chip 130 may be smaller than that of the lower semiconductor chip 110. The vertical height of the upper semiconductor chip 130 may be smaller than that of the lower molding element 410.

The upper semiconductor chip 130 may include upper chip pads 132a and 132b. The upper chip pads 132a and 132b may be disposed on an upper surface of the upper semiconductor chip 130. The upper chip pads 132a and 132b may not vertically overlap the lower semiconductor chip 110. The upper chip pads 132a and 132b may be disposed at some areas on the upper surface of the upper semiconductor chip 130 which do not vertically overlap the lower semiconductor chip 110. The upper chip pads 132a and 132b may vertically overlap the lower molding element 410.

The upper chip pads 132a and 132b may include first upper chip pads 132a and second upper chip pads 132b. The second upper chip pads 132b and the first upper chip pads 132a may be symmetrical. The first upper chip pads 132a and the second upper chip pads 132b may be disposed at the areas close to two opposite sides on the upper surface of the upper semiconductor chip 130. For example, the first upper chip pads 132a may be disposed close to a third side S3 of the lower molding element 410. The second upper chip pads 132b may be disposed close to a fourth side S4 of the lower molding element 410. The fourth side S4 of the lower molding element 410 may be opposite the third side S3 of the lower molding element 410.

A data signal, an address/control signal, and a power voltage signal may be supplied to the upper chip pads 132a and 132b. A different signal may be supplied to each of the upper chip pads 132a and 132b. For example, the power voltage signal may be supplied to one of the first upper chip pads 132a. A third data signal may be supplied to another one of the first upper chip pads 132a. A fourth data signal may be supplied to one of the second upper chip pads 132b. The address/control signal may be supplied to another one of the second upper chip pads 132b.

The upper chip pads 132a and 132b may include a conductive material. For example, the upper chip pads 132a and 132b may include a metal such as Au, Ag, Cu, Ni, or Al, but example embodiments of inventive concepts are not limited thereto. The upper chip pads 132a and 132b may include the same material as the lower chip pads 112a and 112b.

In accordance with the embodiment of inventive concepts, the semiconductor package may further include an adhesive layer 210 disposed between the lower semiconductor chip 110 and the upper semiconductor chip 130. The adhesive layer 210 may be in direct contact with the upper surface of the lower semiconductor chip 110 and a lower surface of the upper semiconductor chip 130. The upper semiconductor chip 130 may be attached to the upper surface of the lower semiconductor chip 110 by the adhesive layer 210.

The adhesive layer 210 may cover the entire lower surface of the upper semiconductor chip 130. For example, sides of the adhesive layer 210 may be vertically aligned with sides of the upper semiconductor chip 130. The adhesive layer 210 may have the same shape as the lower surface of the upper semiconductor chip 130. The adhesive layer 210 may extend between the lower molding element 410 and the upper semiconductor chip 130. The adhesive layer 210 may be orthogonal to the lower semiconductor chip 110.

The adhesive layer 210 may include an epoxy resin. For example, the adhesive layer 210 may include a die attach film (DAF).

The conductive pillars 320 may pass through the lower molding element 410. The conductive pillars 320 may surround the lower semiconductor chip 110. The conductive pillars 320 may be disposed at the outside of the lower semiconductor chip 110 and upper semiconductor chip 130. For example, the conductive pillars 320 may be disposed along edges of the lower molding element 410.

The level of lower surfaces of the conductive pillars 320 may be the same as that of a lower surface of the lower molding element 410. The vertical height of the conductive pillars 320 may be the same as that of the lower molding element 410. The level of upper surfaces of the conductive pillars 320 may be the same as that of the upper surface of the lower semiconductor chip 110.

Sides of the conductive pillars 320 may be perpendicular to the upper surfaces of the conductive pillars 320. The sides of the conductive pillars 320 may be parallel to sides of the lower semiconductor chip 110. The sides of the conductive pillars 320 may be parallel to each other. The horizontal width at the lower surfaces of the conductive pillars 320 may be the same as the horizontal width at the upper surfaces of the conductive pillars 320. For example, the conductive pillars 320 may have a cylindrical shape.

The conductive pillars 320 may include a conductive material. For example, the conductive pillars 320 may include a metal such as Au, Ag, Cu, Ni, or Al, but example embodiments of inventive concepts are not limited thereto.

The lower molding element 410 may include the first side S1, the second side S2, the third side S3, and the fourth side S4. The second side S2 may be opposite the first side S1. The third side S3 and the fourth side S4 may be disposed between the first side S1 and the second side S2. The third side S3 may be perpendicular to the first side S1. The fourth side S4 may be opposite the third side S3. The fourth side S4 may be perpendicular to the second side S2.

The lower molding element 410 may cover the sides of the lower semiconductor chip 110. The lower molding element 410 may cover the sides of the conductive pillars 320. The lower molding element 410 may fill a space between the lower semiconductor chip 110 and the conductive pillars 320. The lower molding element 410 may surround the sides of the lower semiconductor chip 110 and the sides of the conductive pillars 320.

The level of the upper surface of the lower molding element 410 may be the same as that of the upper surface of the lower semiconductor chip 110. The upper surface of the lower molding element 410 may be in direct contact with a lower surface of the adhesive layer 210 under the upper semiconductor chip 130. The lower molding element 410 may be vertically overlapped by the upper chip pads 132a and 132b.

The lower molding element 410 may include a thermosetting material. For example, the lower molding element 410 may include an epoxy molding compound (EMC).

In accordance with the embodiment of inventive concepts, the semiconductor package may further include a lower insulating layer 710 disposed on the lower surface of the lower molding element 410. The lower insulating layer 710 may reduce (and/or prevent) unintended electrical connection between the lower semiconductor chip 110 and the external terminals 720. Each of the conductive pillars 320 may be electrically connected to a corresponding external terminal 720 by the lower insulating layer 710. The lower insulating layer 710 may include a solder resist.

The lower insulating layer 710 may include lower via holes 710h. The lower via holes 710h may expose the lower surfaces of the conductive pillars 320. The horizontal width of the lower via holes 710h may be greater than that of the lower surfaces of the conductive pillars 320. Each of the external terminals 720 may be in direct contact with a lower surface of a corresponding conductive pillar 320 through the lower via holes 710h.

The connecting structure 500 may electrically connect each of the lower chip pads 112a and 112b and upper chip pads 132a and 132b to a corresponding conductive pillar 320. The lower semiconductor chip 110 and the upper semiconductor chip 130 may be rerouted by connecting structure 500. Each of the lower chip pads 112a and 112b and upper chip pads 132a and 132b may be electrically connected to a corresponding external terminal 720 by the connecting structure 500 and conductive pillars 320.

The connecting structure 500 may be disposed on the lower molding element 410 and the upper semiconductor chip 130. The connecting structure 500 may cover the upper surfaces of the lower chip pads 112a and 112b, the upper surfaces of the upper chip pads 132a and 132b, and the upper surfaces of the conductive pillars 320. The connecting structure 500 may include a first upper insulating layer 510, a first redistribution pattern 522, a second upper insulating layer 530, a second redistribution pattern 542, and a third upper insulating layer 550.

The first upper insulating layer 510 may be in direct contact with the upper surface of the lower semiconductor chip 110 which is not vertically overlapped by the upper semiconductor chip 130 and the upper surface of the lower molding element 410. The first upper insulating layer 510 may be in direct contact with the side and upper surfaces of the upper semiconductor chip 130. Sides of the first upper insulating layer 510 may be vertically aligned with the sides of the lower molding element 410.

The first upper insulating layer 510 may include first upper via holes 510a, second upper via holes 510b, and third upper via holes 510c. The first upper via holes 510a may be disposed on the upper surface of the lower molding element 410. The first upper via holes 510a may expose the upper surface of the conductive pillars 320. The second upper via holes 510b may be disposed on the upper surface of the lower semiconductor chip 110. The second upper via holes 510b may expose the upper surfaces of the lower chip pads 112a and 112b. The third upper via holes 510c may be disposed on the upper surface of the upper semiconductor chip 130. The third upper via holes 510c may expose the upper surfaces of the upper chip pads 132a and 132b.

The horizontal width of the first upper via holes 510a may be smaller than that of the upper surfaces of the conductive pillars 320. The horizontal width of the second upper via holes 510b may be greater than that of the lower chip pads 112a and 112b. The horizontal width of the third upper via holes 510c may be greater than that of the upper chip pads 132a and 132b. The horizontal width of the second upper via holes 510b may be the same as that of the first upper via holes 510a. The horizontal width of the third upper via holes 510c may be the same as that of the second upper via holes 510b.

The first redistribution pattern 522 may reroute the lower chip pads 112a and 112b and the upper chip pads 132a and 132b. The first redistribution pattern 522 may electrically connect at least one of the lower chip pads 112a and 112b and upper chip pads 132a and 132b to a corresponding conductive pillar 320. For example, some of the lower chip pads 112a and 112b and some of the upper chip pads 132a and 132b may be electrically connected to corresponding conductive pillars 320 by the first redistribution pattern 522.

The first redistribution pattern 522 may be disposed on the first upper insulating layer 510. The outermost sides of the first redistribution pattern 522 may be disposed more inside than the sides of the first upper insulating layer 510. The first redistribution pattern 522 may include first contact plugs 522a, second contact plugs 522b, third contact plugs 522c, and a first interconnection portion 522r.

The first contact plugs 522a may be disposed in the first upper via holes 510a of the first upper insulating layer 510. The first contact plugs 522a may be in direct contact with the upper surfaces of the conductive pillars 320.

The second contact plugs 522b may be disposed in the second upper via holes 510b of the first upper insulating layer 510. The second contact plugs 522b may be in direct contact with the upper surfaces of the lower chip pads 112a and 112b.

The third contact plugs 522c may be disposed in the third upper via holes 510c of the first upper insulating layer 510. The third contact plugs 522c may be in direct contact with the upper surfaces of the upper chip pads 132a and 132b.

The first interconnection portion 522r may reroute the lower chip pads 112a and 112b through the second contact plugs 522b. The first interconnection portion 522r may reroute the upper chip pads 132a and 132b through the third contact plugs 522c. The first interconnection portion 522r may selectively connect the first contact plugs 522a, the second contact plugs 522b, and the third contact plugs 522c.

The first interconnection portion 522r may be disposed on the upper surface of the first upper insulating layer 510. The first interconnection portion 522r may be in direct contact with upper surfaces of the first contact plugs 522a, second contact plugs 522b, and third contact plugs 522c. The first interconnection portion 522r may include the same material as the first contact plugs 522a, second contact plugs 522b, and third contact plugs 522c.

The second upper insulating layer 530 may be disposed on the first redistribution pattern 522. The second upper insulating layer 530 may cover the side and upper surfaces of the first redistribution pattern 522. Sides of the second upper insulating layer 530 may be disposed outer than the outermost sides of the first redistribution pattern 522. The sides of the second upper insulating layer may be vertically aligned with the sides of the first upper insulating layer 510.

The second upper insulating layer 530 may include fourth upper via holes 530h. The fourth upper via holes 530h may be disposed on the upper surface of the first redistribution pattern 522. The fourth upper via holes 530h may expose an upper surface of the first interconnection portion 522r of the first redistribution pattern 522.

The second redistribution pattern 542 may electrically connect the lower chip pads 112a and 112b and the upper chip pads 132a and 132b which are not electrically connected to corresponding conductive pillars 320 by the first redistribution pattern 522, to the corresponding conductive pillars 320. The second redistribution pattern 542 may electrically connect some of the lower chip pads 112a and 112b to the upper chip pads 132a and 132b to which the same signal as the signal supplied to corresponding lower chip pads 112a and 112b is supplied. Some of the first redistribution pattern 522 may be connected by the second redistribution pattern 542. For example, one of the lower chip pads 112a and 112b to which a power voltage signal is supplied, may be electrically connected to one of the upper chip pads 132a and 132b to which the power voltage signal is supplied, by the second redistribution pattern 542.

The second redistribution pattern 542 may be disposed on the second upper insulating layer 530. The outermost sides of the second redistribution pattern 542 may be disposed more inside than the sides of the second upper insulating layer 530. The second redistribution pattern 542 may include fourth contact plugs 542p and a second interconnection portion 542r.

The fourth contact plugs 542p may be disposed in the fourth upper via holes 530h of the second upper insulating layer 530. The fourth contact plugs 542p may be in direct contact with the upper surface of the first interconnection portion 522r of the first redistribution pattern 522.

Some of the first redistribution pattern 522 may be connected by the second interconnection portion 542r through the fourth contact plugs 542p. The second interconnection portion 542r may be disposed on an upper surface of the second upper insulating layer 530. The second interconnection portion 542r may be in direct contact with upper surfaces of the fourth contact plugs 542p. The second interconnection portion 542r may include the same material as the fourth contact plugs 542p.

The third upper insulating layer 550 may be disposed on the second redistribution pattern 542. The third upper insulating layer 550 may cover side and upper surfaces of the second redistribution pattern 542. Sides of the third upper insulating layer 550 may be disposed outer than the outermost sides of the second redistribution pattern 542. The sides of the third upper insulating layer 550 may be vertically aligned with the sides of the second upper insulating layer 530.

Sides of the connecting structure 500 may consist of the sides of the first upper insulating layer 510, the sides of the second upper insulating layer 530, and the sides of the third upper insulating layer 550. The sides of the connecting structure 500 may be vertically aligned with the sides of the lower molding element 410.

Although the connecting structure 500 may include the first redistribution pattern 522 and the second redistribution pattern 542, example embodiments of inventive concepts are not limited thereto. However, the connecting structure 500 may include one or both of the redistribution patterns 522 and 542. For example, in a semiconductor package in accordance with example embodiments of inventive concepts, the connecting structure 500 may include only the first upper insulating layer 510, the first redistribution pattern 522, and the second upper insulating layer 530. In this case, the first redistribution pattern 522 may electrically connect all of the lower chip pads 112a and 112b and upper chip pads 132a and 132b to corresponding conductive pillars 320.

In a semiconductor package in accordance with example embodiments of inventive concepts, the lower chip pads 112a and 112b and the upper chip pads 132a and 132b may be rerouted by the connecting structure 500. That is, in a semiconductor package in accordance with example embodiments of inventive concepts, the lower semiconductor chip 110 and the upper semiconductor chip 130 may be simultaneously rerouted by the connecting structure 500.

In addition, in a semiconductor package in accordance with example embodiments of inventive concepts, the lower chip pads 112a and 112b and the upper chip pads 132a and 132b may be electrically connected to corresponding external terminals 720 by the conductive pillars 320 and the connecting structure 500. That is, in a semiconductor package in accordance with example embodiments of inventive concepts, the lower semiconductor chip 110 and the upper semiconductor chip 130 may be electrically connected to the external terminals 720, without any circuit board. Accordingly, in a semiconductor package in accordance with example embodiments of inventive concepts, the overall vertical height may decrease. Accordingly, a semiconductor package in accordance with example embodiments of inventive concepts may achieve high integration and/or small size.

In addition, in a semiconductor package in accordance with example embodiments of inventive concepts, the lower semiconductor chip 110 and the upper semiconductor chip 130 may be electrically connected to the external terminals 720 without a wire. That is, in a semiconductor package in accordance with example embodiments of inventive concepts, damage to the electrical connection between the lower semiconductor chip 110 and upper semiconductor chip 130 and the external terminals 720 by a subsequent process, may be reduced (and/or prevented). Accordingly, a semiconductor package in accordance with example embodiments of inventive concepts may improve reliability.

The upper molding element 610 may be disposed on the connecting structure 500. The upper molding element 610 may be in direct contact with an upper surface of the connecting structure 500. Sides of the upper molding element 610 may be vertically aligned with the sides of the connecting structure 500. The sides of the upper molding element 610 may be vertically aligned with the sides of the lower molding element 410.

The upper molding element 610 may include a thermosetting material. For example, the upper molding element 610 may include an epoxy molding compound (EMC). The upper molding element 610 may include the same material as the lower molding element 410.

Here, in a semiconductor package in accordance with example embodiments of inventive concepts, the upper semiconductor chip 130 and the connecting structure 500 may be supported by the lower molding element 410. Accordingly, in a semiconductor package in accordance with example embodiments of inventive concepts, the lower molding element 410 may be harder than the upper molding element 610.

In addition, in a semiconductor package in accordance with example embodiments of inventive concepts, if the lower molding element 410 is deformed, the whole structure may become unstable. Accordingly, in a semiconductor package in accordance with example embodiments of inventive concepts, the thermal expansion rate of the lower molding element 410 may be smaller than that of the upper molding element 610.

Figure 3A:
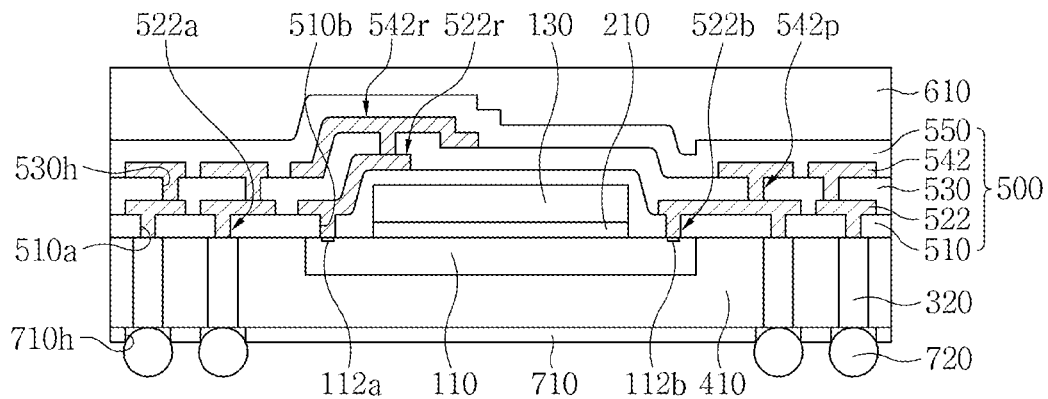
FIGS. 3A to 3C are cross-sectional views showing a semiconductor package in accordance with example embodiments of inventive concepts.
Figure 3B:
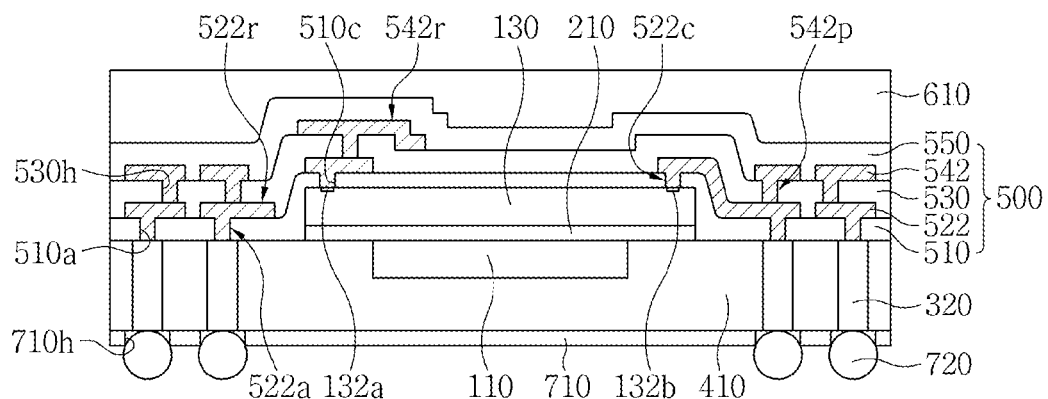
Figure 3C:
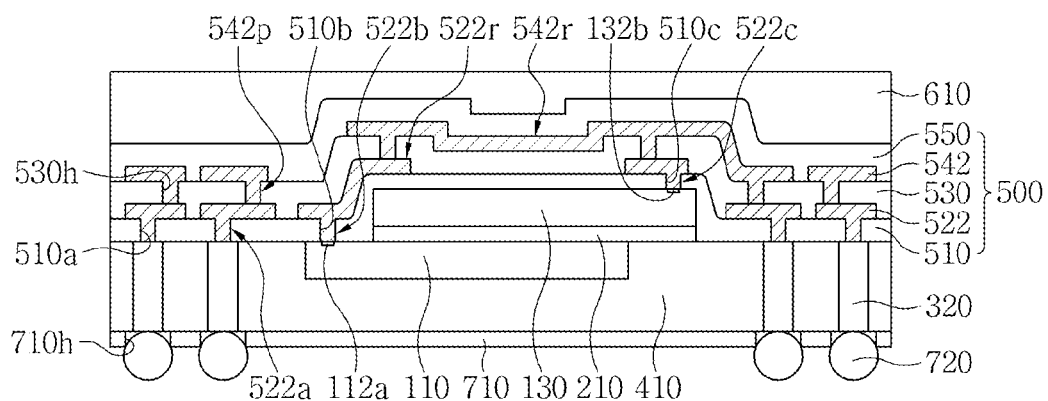

FIGS. 3A to 3C are cross-sectional views showing a semiconductor package in accordance with example embodiments of inventive concepts.

Referring to FIGS. 3A to 3C, the semiconductor package in accordance with example embodiments of inventive concepts may include a lower semiconductor chip 110, an upper semiconductor chip 130 disposed on the lower semiconductor chip 110, a lower molding element 410 covering sides of the lower semiconductor chip 110, conductive pillars 320 passing through the lower molding element 410, a connecting structure 500 disposed on the lower molding element 410 and upper semiconductor chip 130, an upper molding element 610 disposed on the connecting structure 500, and external terminals 720 disposed on lower surfaces of the conductive pillars 320. The lower semiconductor chip 110 may include lower chip pads 112*a* and 112*b* exposed by the upper semiconductor chip 130. The upper semiconductor chip 130 may include upper chip pads 132*a* and 132*b* which do not vertically overlap the lower semiconductor chip 110. The upper semiconductor chip 130 may be orthogonal to the lower semiconductor chip 110.

The semiconductor package in accordance with example embodiments of inventive concepts may further include an adhesive layer 210 disposed between the lower semiconductor chip 110 and the upper semiconductor chip 130, and a lower insulating layer 710 disposed on a lower surface of the lower molding element 410. The lower insulating layer 710 may include lower via holes 710*h* disposed on the lower surfaces of the conductive pillars 320.

The connecting structure 500 may include a first upper insulating layer 510, a first redistribution pattern 522 disposed on the first upper insulating layer 510, a second upper insulating layer 530 disposed on the first redistribution pattern 522, a second redistribution pattern 542 disposed on the second upper insulating layer 530, and a third upper insulating layer 550*a* disposed on the second redistribution pattern 542.

The first upper insulating layer 510 may include first upper via holes 510*a* disposed on an upper surface of the lower molding element 410, second upper via holes 510*b* disposed on an upper surface of the lower semiconductor chip 110, and third upper via holes 510*c* disposed on an upper surface of the upper semiconductor chip 130.

The first redistribution pattern 522 may include first contact plugs 522*a* in direct contact with the conductive pillars 320, second contact plugs 522*b* in direct contact with the lower chip pads 112*a* and 112*b*, third contact plugs 522*c* in direct contact with the upper chip pads 132*a* and 132*b*, and a first interconnection portion 522*r*. The second upper insulating layer 530 may include fourth upper via holes 530*h* disposed on an upper surface of the first interconnection portion 522*r*. The second redistribution pattern 542 may include fourth contact plugs 542*p* in direct contact with the first interconnection portion 522*r* and a second interconnection portion 542*r*.

The level of the upper surface of the lower semiconductor chip 110 may be the same as that of the upper surface of the lower molding element 410. The vertical height of the lower semiconductor chip 110 may be smaller than that of the lower molding element 410. The lower molding element 410 may cover side and lower surfaces of the lower semiconductor chip 110. The vertical height of the lower semiconductor chip 110 may be the same as that of the upper semiconductor chip 130.

Figure 4A:
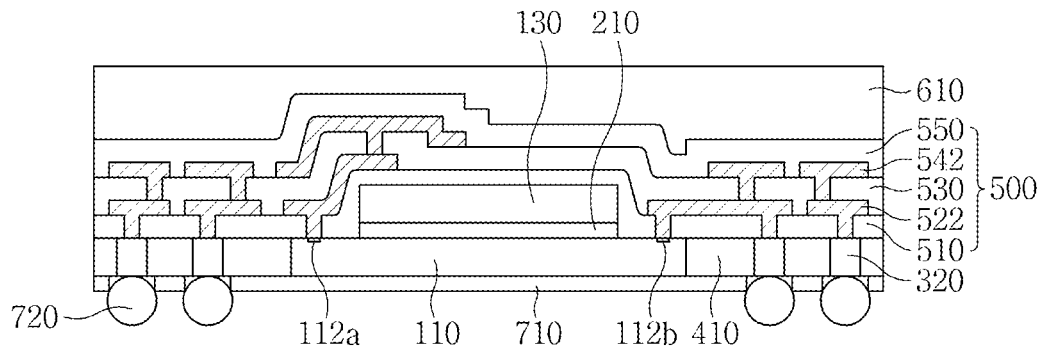
FIGS. 4A to 4C are cross-sectional views showing a semiconductor package in accordance with example embodiments of inventive concepts.
Figure 4B:
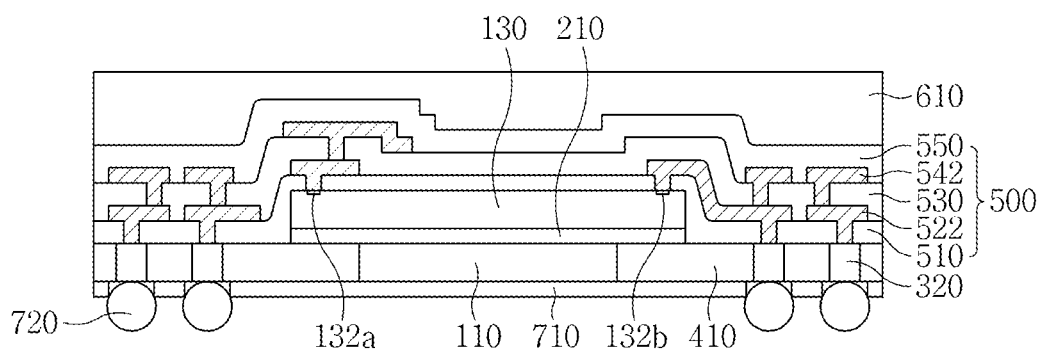
Figure 4C:
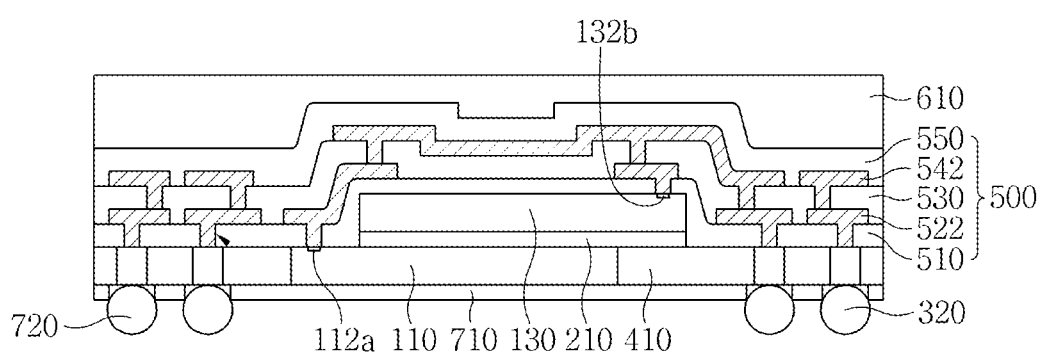

FIGS. 4A to 4C are cross-sectional views showing a semiconductor package in accordance with example embodiments of inventive concepts.

Referring to FIGS. 4A to 4C, the semiconductor package in accordance with example embodiments of inventive concepts may include a lower semiconductor chip 110 having lower chip pads 112*a* and 112*b* disposed at areas of an upper surface thereof close to two opposite sides, a lower molding element 410 covering sides of the lower semiconductor chip 110, an upper semiconductor chip 130 which has upper chip pads 132*a* and 132*b* disposed at areas of an upper surface thereof close to two opposite sides and is orthogonally attached to the upper surface of the lower semiconductor chip 110 by an adhesive layer 210, a connecting structure 500 disposed on the upper semiconductor chip 130 and redistribution the lower chip pads 112*a* and 112*b* and the upper chip pads 132*a* and 132*b*, conductive pillars 320 passing through the lower molding element 410 and electrically connecting the connecting structure 500 to external terminals 720, and an upper molding element 610 disposed on the connecting structure 500. The semiconductor package in accordance with example embodiments of inventive concepts may further include a lower insulating layer 710 disposed on a lower surface of the lower molding element 410.

The connecting structure 500 may include first and second redistribution patterns 522 and 542 which connect each of the lower chip pads 112*a* and 112 band upper chip pads 132*a* and 132*b* to a corresponding conductive pillar 320, and first to third upper insulating layers 510, 530, and 550 surrounding the first redistribution pattern 522 and the second redistribution pattern 542.

The level of the upper surface of the lower semiconductor chip 110 may be the same as that of an upper surface of the lower molding element 410. The vertical height of the lower semiconductor chip 110 may be the same as that of the upper semiconductor chip 130. The level of a lower surface of the lower semiconductor chip 110 may be the same as that of the lower surface of the lower molding element 410. The vertical height of the lower molding element 410 may be the same as that of the upper semiconductor chip 130. The vertical height of the conductive pillars 320 may be the same as that of the upper semiconductor chip 130.

Figure 5A:
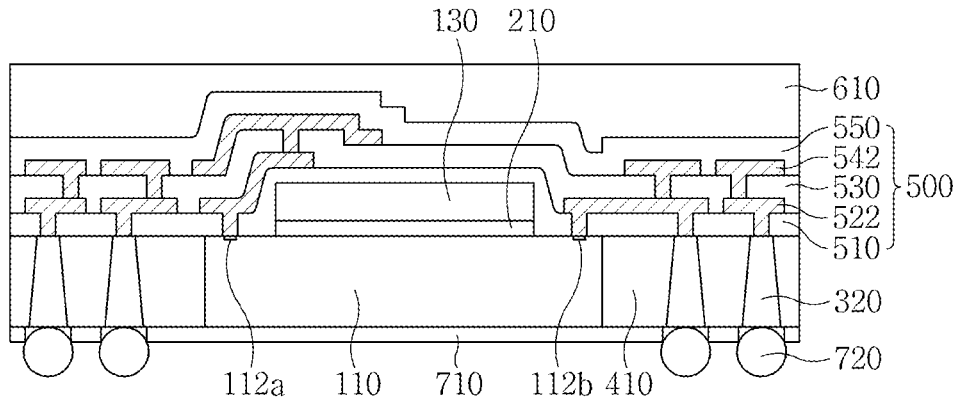
FIGS. 5A to 5C are cross-sectional views showing a semiconductor package in accordance with example embodiments of inventive concepts.
Figure 5B:
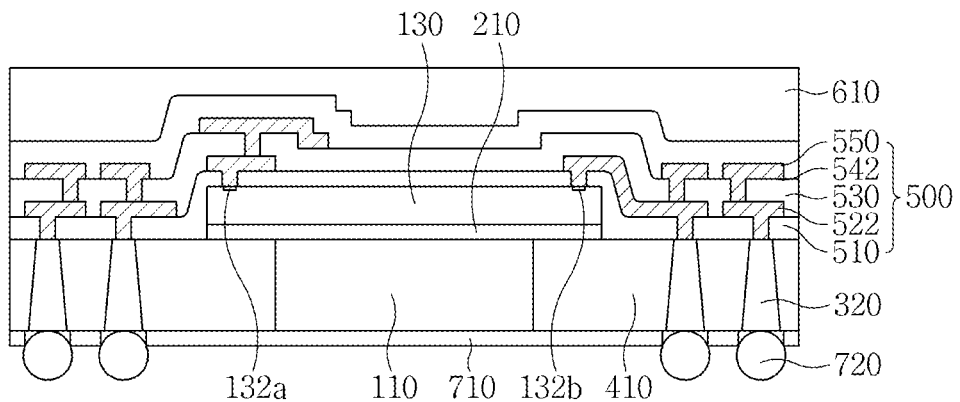
Figure 5C:
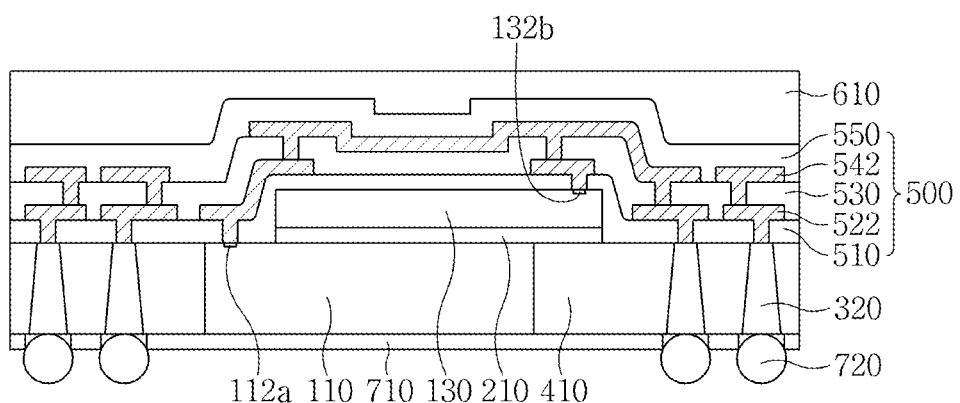

FIGS. 5A to 5C are cross-sectional views showing a semiconductor package in accordance with example embodiments of inventive concepts.

Referring to FIGS. 5A to 5C, the semiconductor package in accordance with example embodiments of inventive concepts may include a lower molding element 410, a lower semiconductor chip 110 passing through a central area of the lower molding element 410, conductive pillars 320 passing through an edge area of the lower molding element 410, an upper semiconductor chip 130 orthogonally stacked on the lower semiconductor chip 110, a connecting structure 500 covering the lower molding element 410 and the upper semiconductor chip 130, and an upper molding element 610 disposed on the connecting structure 500. The semiconductor package in accordance with the embodiment of inventive concepts may further include a lower insulating layer 710 disposed on a lower surface of the lower molding element 410, and external terminals 720.

The connecting structure 500 may include a first upper insulating layer 510 covering side and upper surfaces of the upper semiconductor chip 130 and an upper surface of the lower molding element 410, lower chip pads 112a and 112b, upper chip pads 132a and 132b, and a first redistribution pattern 522 in direct contact with the conductive pillars 320, a second upper insulating layer 520 covering the first redistribution pattern 522, a second redistribution pattern 542 in direct contact with the first redistribution pattern 522, and a third upper insulating layer 550 covering the second redistribution pattern 542.

The horizontal width at lower surfaces of the conductive pillars 320 may be greater than that at upper surfaces of the conductive pillars 320. The horizontal width of the conductive pillars 320 may become small from the lower surface of the lower molding element 410 toward the upper surface of the lower molding element 410. Sides of the conductive pillars 320 may be tilted toward the center of the conductive pillars 320. For example, the conductive pillars 320 may be a circular truncated cone shape. The vertical cross-section of the conductive pillars 320 may be a trapezoidal shape.

Figure 6A:
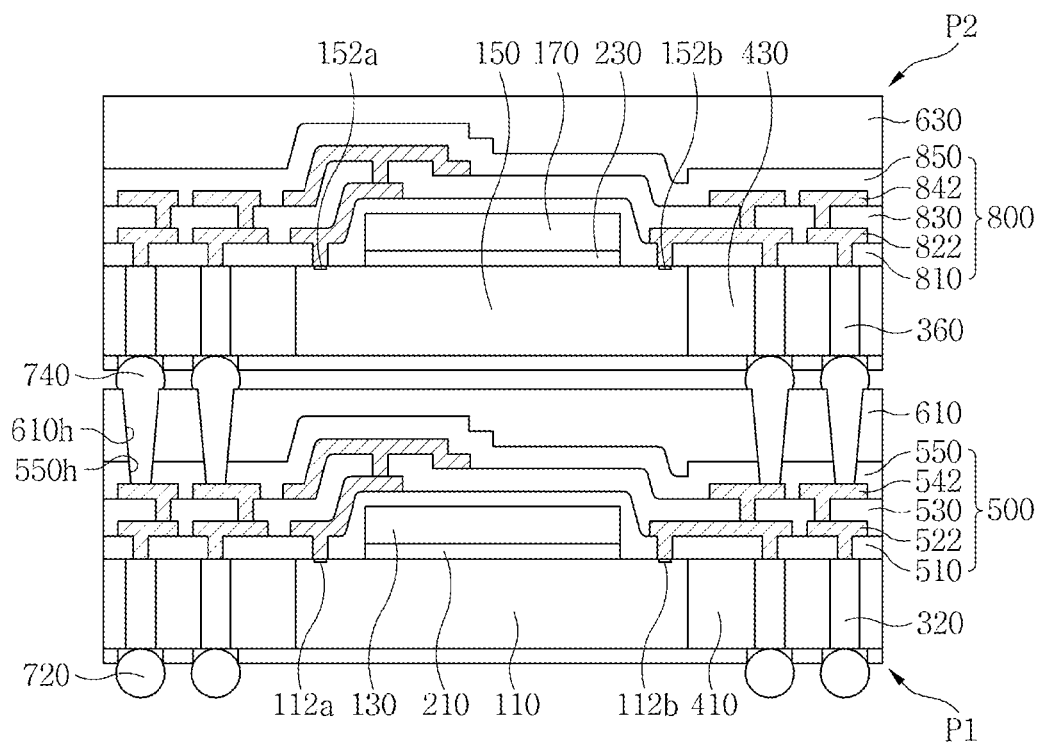
FIGS. 6A to 6C are cross-sectional views showing a semiconductor package in accordance with example embodiments of inventive concepts.
Figure 6B:
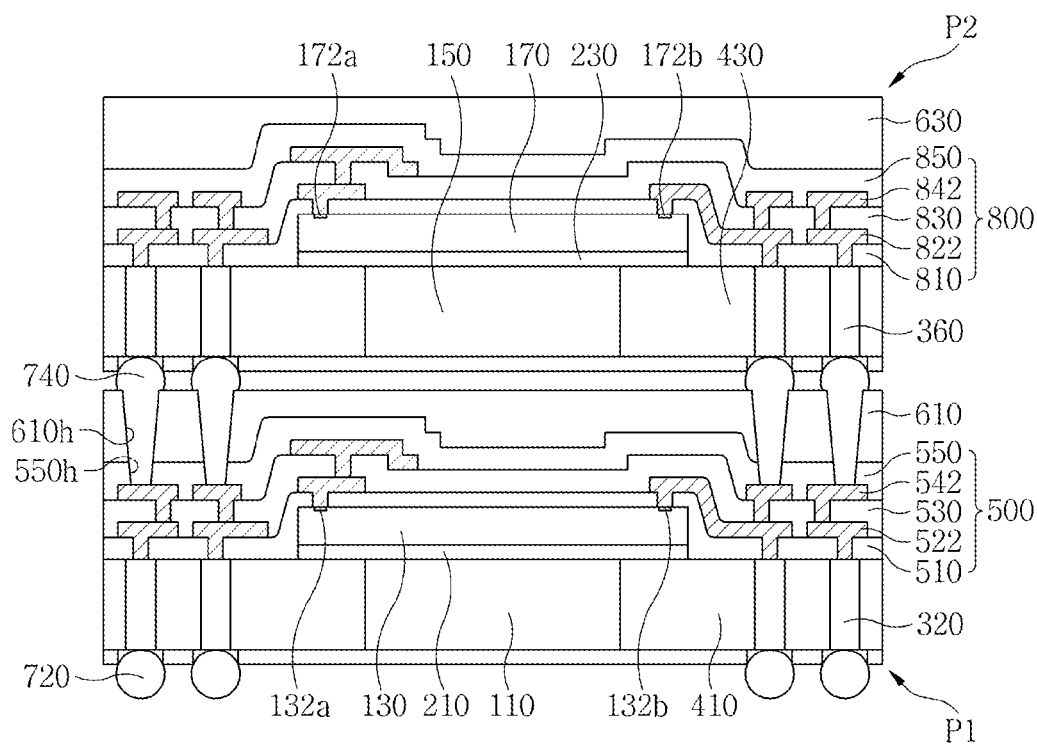
Figure 6C:
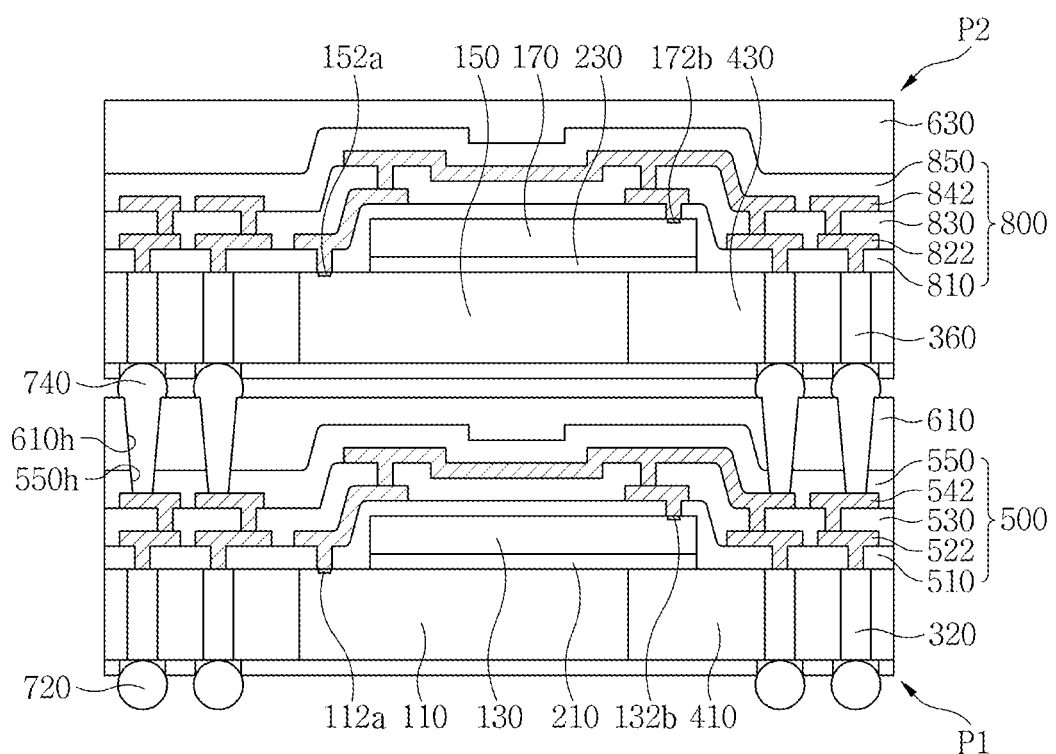
Figure 7A:
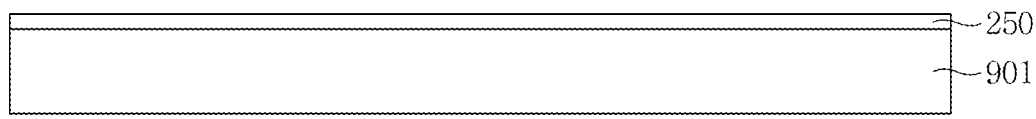
Figure 7B:
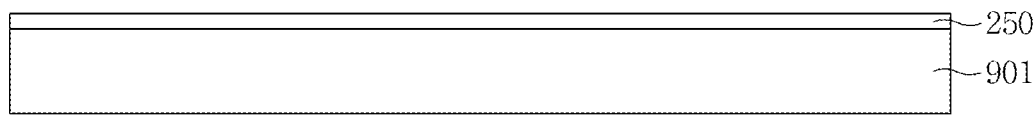
Figure 7C:
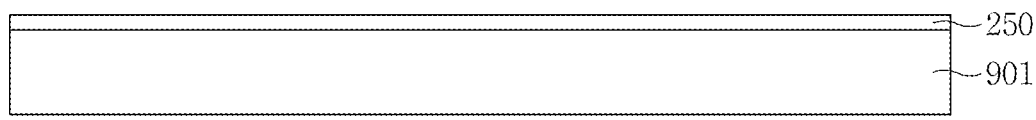

FIGS. 6A to 6C are cross-sectional views showing a semiconductor package in accordance with example embodiments of inventive concepts.

Referring to FIGS. 6A to 6C, the semiconductor package in accordance with example embodiments of inventive concepts may include a lower package P1, an upper package P2 disposed on an upper surface of the lower package P1, and package connecting elements 740 electrically connecting the upper package P2 to the lower package P1.

The lower package P1 may include a lower semiconductor chip 110, an upper semiconductor chip 130, conductive pillars 320, a lower molding element 410, a connecting structure 500, and an upper molding element 610. The connecting structure 500 may include a first upper insulating layer 510, a first redistribution pattern 522, a second upper insulating layer 530, a second redistribution pattern 542, and a third upper insulating layer 550.

The third upper insulating layer 550 of the connecting structure 500 may include first package via holes 550h disposed on an upper surface of the lower molding element 410. The upper molding element 610 may include second package via holes 610h disposed on the upper surface of the lower molding element 410. The first package via holes 550h and the second package via holes 610h may be disposed on upper surfaces of the conductive pillars 320.

Sidewalls of the first package via holes 550h may continue to sidewalls of the second package via holes 610h. For example, the shape of the first package via holes 550h on an upper surface of the third upper insulating layer 550 may be the same as that of the second package via holes 610h on a lower surface of the upper molding element 610. The horizontal width of the first package via holes 550h on the upper surface of the third upper insulating layer 550 may be the same as that of the second package via holes 610h on the lower surface of the upper molding element 610.

The upper package P2 may include a lower semiconductor chip 150, an upper semiconductor chip 170, conductive pillars 360, a lower molding element 430, a connecting structure 800, and an upper molding element 630. The connecting structure 800 may include a fourth upper insulating layer 810, a third redistribution pattern 822, a fifth upper insulating layer 830, a fourth redistribution pattern 842, and a sixth upper insulating layer 850. The upper package P2 may be the same kind of package as the lower package P1. For example, the connecting structure 800 of the upper package P2 may be the same as the connecting structure 500 of the lower package P1.

The package connecting elements 740 may be disposed on a lower surface of the lower molding element 430 of the upper package P2. The package connecting elements 740 may be in direct contact with lower surfaces of the conductive pillars 360 of the upper package P2. The package connecting elements 740 may be disposed in the first package via holes 550h and the second package via holes 610h. The package connecting elements 740 may be in direct contact with an upper surface of the second redistribution pattern 542 of the lower package P1. The conductive pillars 360 of the upper package P2 may be electrically connected to the connecting structure 500 of the lower package P1 by the package connecting elements 740. The connecting structure 800 of the upper package P2 may be electrically connected to the conductive pillars 320 of the lower package P1 by the package connecting elements 740.

For example, the package connecting elements 740 may include a solder ball, a solder bump, a grid array, or a conductive tap. The package connecting elements 740 may include the same material as external terminals 720.

The semiconductor package in accordance with example embodiments of inventive concepts may further include the external terminals (720) disposed on lower surfaces of the conductive pillars 320 of the lower package P1. Lower chip pads 152a and 152b and upper chip pads 172a and 172b of the upper package P2 may be electrically connected to corresponding external terminals 720 through the conductive pillars 320 of the lower package P1, the package connecting elements 740, the conductive pillars 360 of the upper package P2, and the connecting structure 800 of the upper package P2, respectively.

FIGS. 7A to 28A, 7B to 28B, and 7C to 28C are cross-sectional views sequentially describing a method of fabricating a semiconductor package in accordance with example embodiments of inventive concepts.

A method of fabricating a semiconductor package in accordance with example embodiments of inventive concepts will be described with reference to FIGS. 1, 2A to 2C, 7A to 28A, 7B to 28B, and 7C to 28C. First, referring to FIGS. 7A to 7C, the method of fabricating a semiconductor package in accordance with example embodiments of inventive concepts may include a process of providing a first carrier 901.

The process of providing the first carrier 901 may include a process of forming a first carrier adhesive layer 250 on an upper surface of the first carrier 901.

Figure 8A:
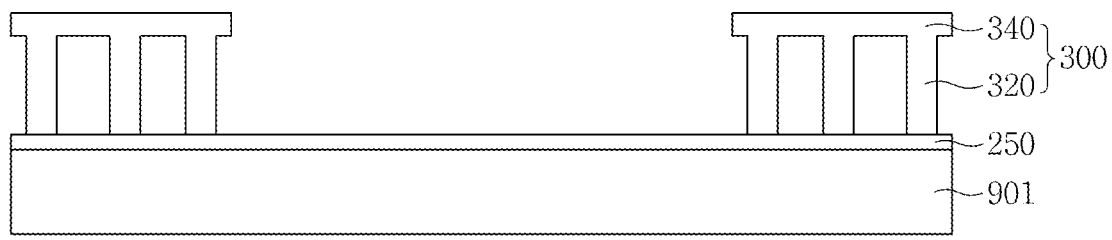
Figure 8B:
Figure 8C:
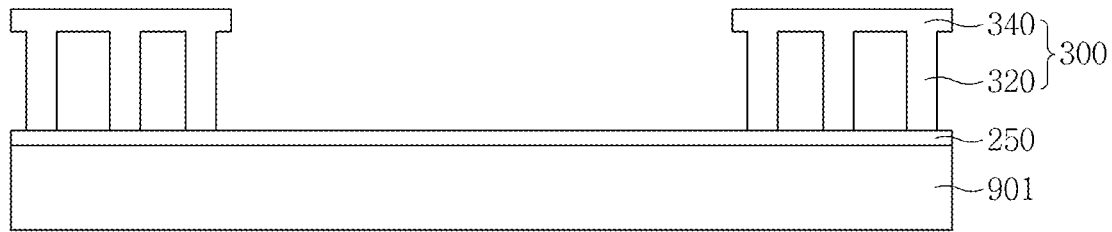

Referring to FIGS. 8A to 8C, the method of fabricating a semiconductor package in accordance with example embodiments of inventive concepts may include a process of arranging conductive structure 300 on the upper surface of the first carrier 901.

The process of arranging the conductive structure 300 on the upper surface of the first carrier 901 may include a process of aligning the conductive structure 300 on an upper surface of the first carrier adhesive layer 250, and a process of attaching the conductive structure 300 to the upper surface of the first carrier adhesive layer 250. The conductive structure 300 may include conductive pillars 320 and a pillar interconnection portion 340.

The process of aligning the conductive structure 300 on the upper surface of the first carrier adhesive layer 250 may include a process of aligning the conductive structure 300 on the upper surface of the first carrier adhesive layer 250 so that lower surfaces of the conductive pillars 320 of the conductive structure 300 face the upper surface of the first carrier adhesive layer 250.

The process of attaching the conductive structure 300 to the upper surface of the first carrier adhesive layer 250 may include a process of attaching the lower surfaces of the conductive pillars 320 of the conductive structures 300 to the upper surface of the first carrier adhesive layer 250.

Figure 9A:
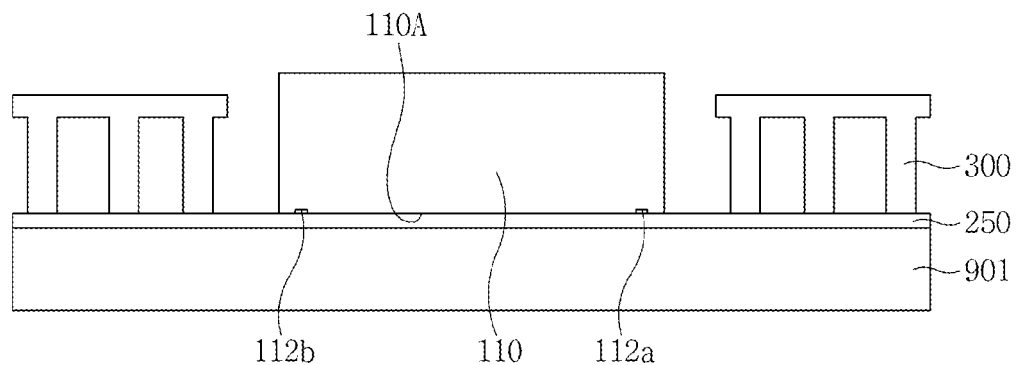
Figure 9B:
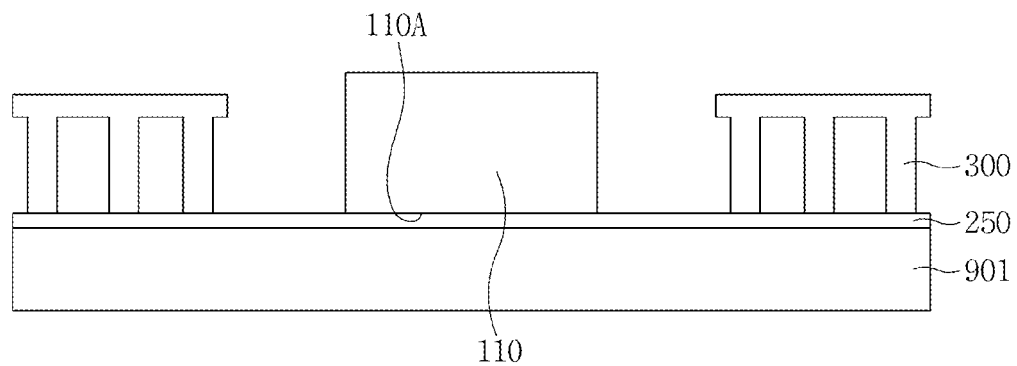
Figure 9C:
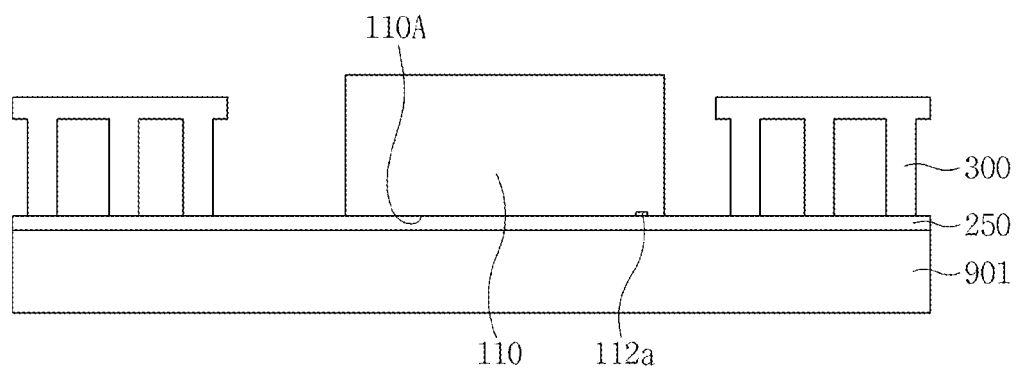

Referring to FIGS. 9A to 9C, the method of fabricating a semiconductor package in accordance with example embodiments of inventive concepts may include a process of arranging the lower semiconductor chip 110 between the conductive pillars 320 of the conductive structure 300. The lower semiconductor chip 110 may be stay apart from the pillar interconnection portion 340 of the conductive structure 300.

The process of arranging the lower semiconductor chip 110 may include a process of providing the lower semiconductor chip 110, a process of aligning the lower semiconductor chip 110 on the upper surface of the first carrier adhesive layer 250, and a process of attaching the lower semiconductor chip 110 to the upper surface of the first carrier adhesive layer 250. The lower semiconductor chip 110 may include lower chip pads 112a and 112b. The lower chip pads 112a and 112b may be disposed on areas of an active surface 110A close to two opposite sides.

The process of aligning the lower semiconductor chip 110 on the upper surface of the first carrier adhesive layer 250 may include a process of aligning the lower semiconductor chip 110 on the upper surface of the first carrier adhesive layer 250 so that the active surface 110A of the lower semiconductor chip 110 faces the upper surface of the first carrier adhesive layer 250, and a process of aligning the lower semiconductor chip 110 between the conductive pillars 320 of the conductive structure 300 so that the lower semiconductor chip 110 stays apart from the pillar interconnection portion 340 of the conductive structure 300.

The process of attaching the lower semiconductor chip 110 to the upper surface of the first carrier adhesive layer 250 may include a process of attaching the active surface 110A of the lower semiconductor chip 110 to the upper surface of the first carrier adhesive layer 250.

The vertical height of the lower semiconductor chip 110 may be greater than that of the conductive structures 300. For example, the lower semiconductor chip 110 may be a unit semiconductor chip on which a backside grinding process or a backside etch back process has not been performed.

Figure 10A:
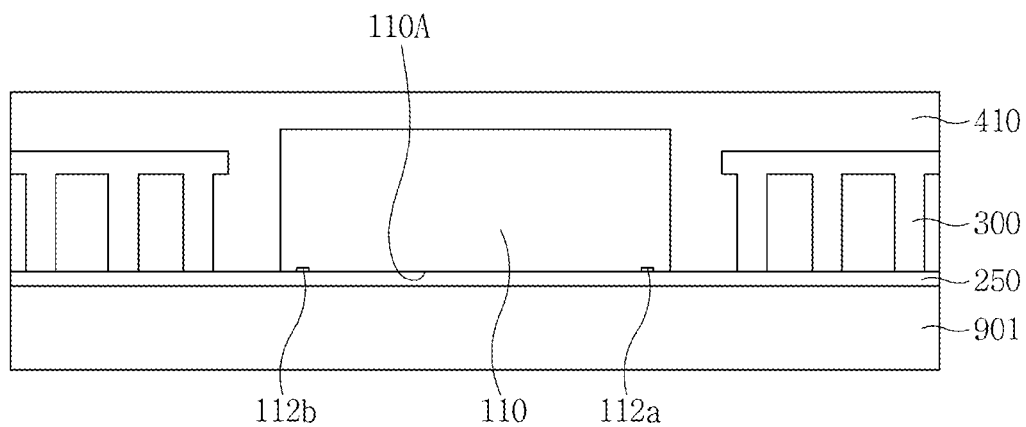
Figure 10B:
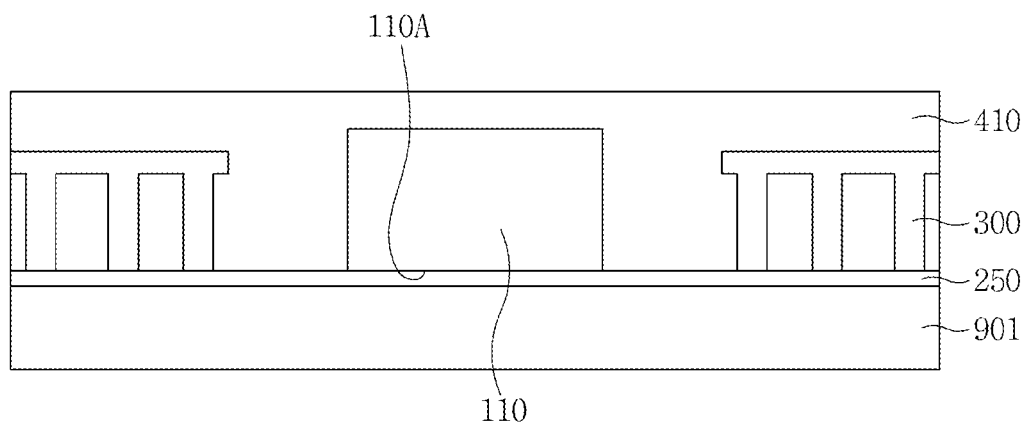
Figure 10C:
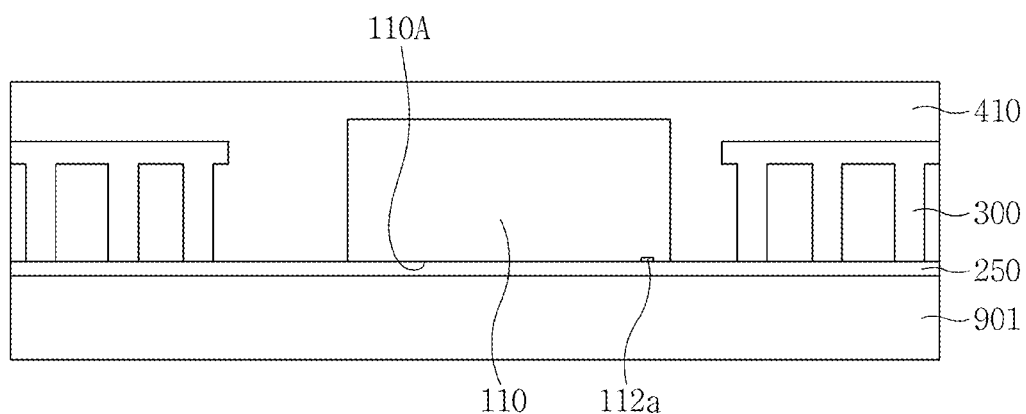

Referring to FIGS. 10A to 10C, the method of fabricating a semiconductor package in accordance with example embodiments of inventive concepts may include a process of forming a lower molding element 410 on the upper surface of the first carrier 901.

The process of forming the lower molding element 410 on the upper surface of the first carrier 901 may include a process of surrounding the conductive structures 300 and the lower semiconductor chip 110 with the lower molding element 410. The process of surrounding the conductive structures 300 and the lower semiconductor chip 110 with the lower molding element 410 may include a process of covering side and upper surfaces of the conductive structures 300 with the lower molding element 410. The process of surrounding the conductive structures 300 and the lower semiconductor chip 110 with the lower molding element 410 may include a process of covering side and upper surfaces of the lower semiconductor chip 110 with the lower molding element 410. The vertical height of the lower molding element 410 may be greater than that of the lower semiconductor chip 110.

Figure 11A:
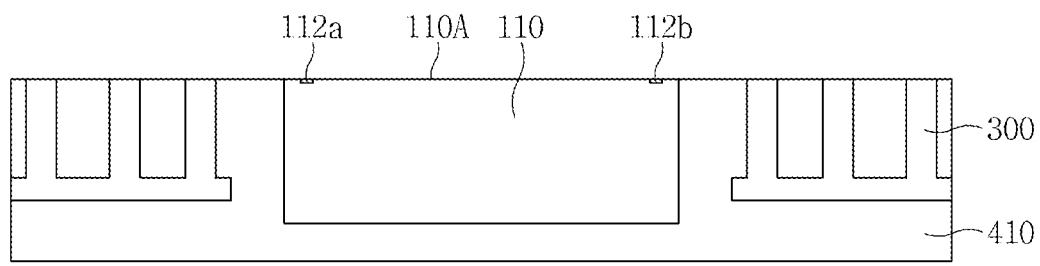
Figure 11B:
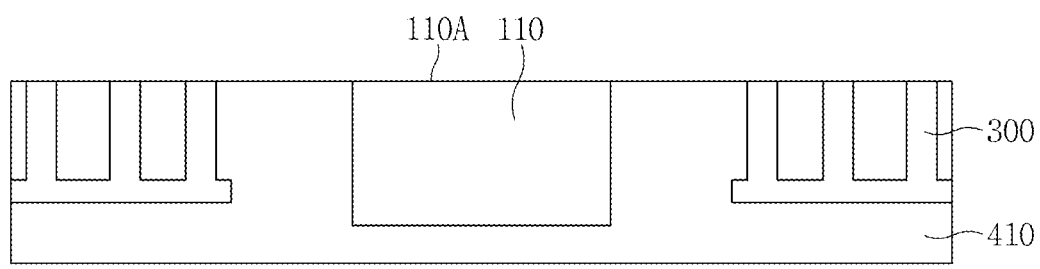
Figure 11C:
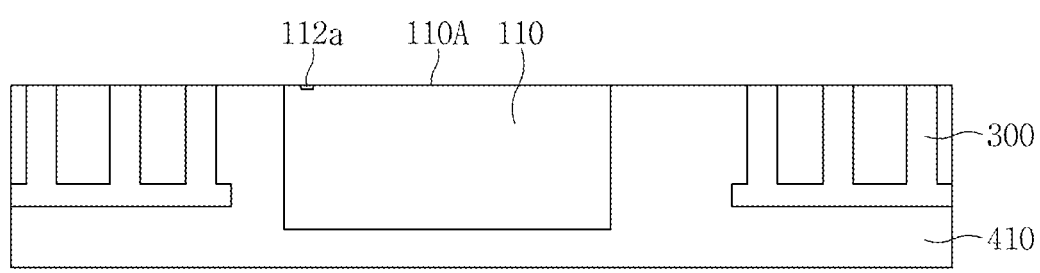

Referring to FIGS. 11A to 11C, the method of fabricating a semiconductor package in accordance with example embodiments of inventive concepts may include a process of rotating the lower molding element 410 so that the active surface 110A of the lower semiconductor chip 110 becomes an upper surface of the lower semiconductor chip 110.

The process of rotating the lower molding element 410 may include a process of rotating the lower semiconductor chip 110, the lower molding element 410, and the conductive structures 300 up and down, and a process of removing the first carrier 901 and the first carrier adhesive layer 250. Accordingly the active surface 110A of the lower semiconductor chip 110 may be exposed out of the lower molding element 410. In addition, upper surfaces of the conductive pillars 320 of the conductive structures 300 may be exposed out of the lower molding element 410.

Figure 12A:
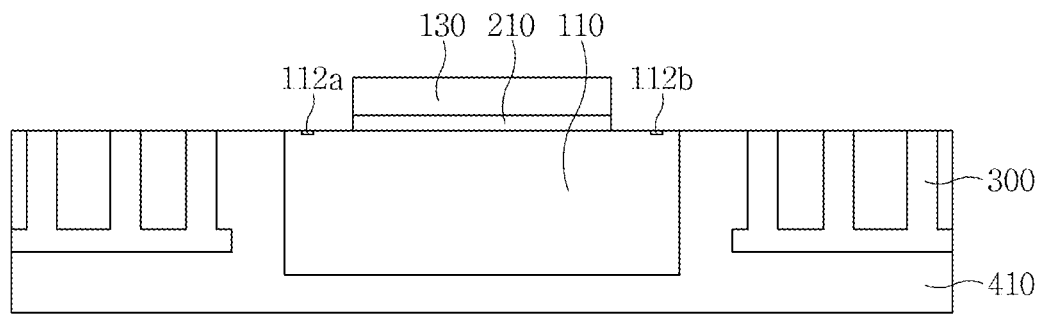
Figure 12B:
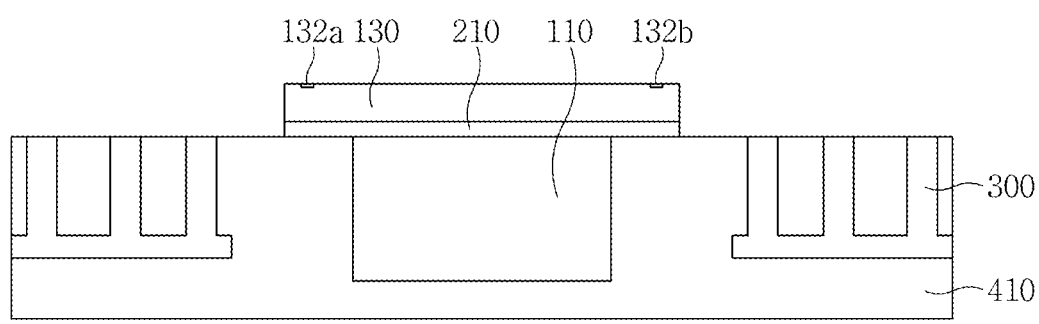
Figure 12C:
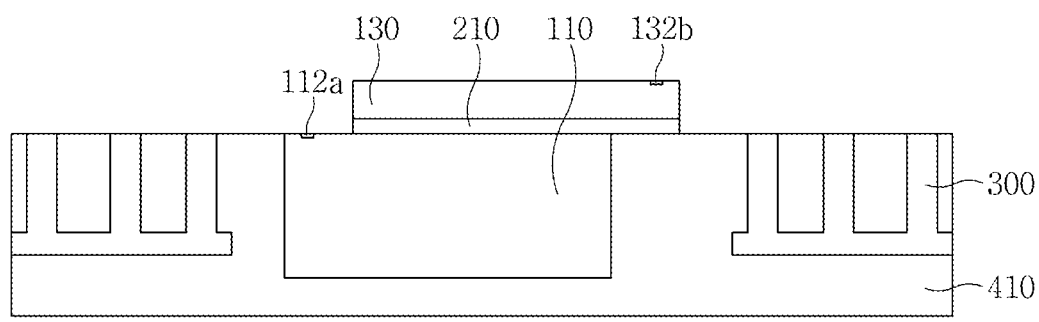

Referring to FIGS. 12A to 12C, the method of fabricating a semiconductor package in accordance with example embodiments of inventive concepts may include a process of orthogonally stacking the upper semiconductor chip 130 on the upper surface of the lower semiconductor chip 110.

The process of orthogonally stacking the upper semiconductor chip 130 on the upper surface of the lower semiconductor chip 110 may include a process of providing the upper semiconductor chip 130, a process of attaching the adhesive layer 210 to a lower surface of the upper semiconductor chip 130, a process of aligning the upper semiconductor chip 130 to be orthogonal to the lower semiconductor chip 110 on the upper surface of the lower semiconductor chip 110, and a process of attaching the upper semiconductor chip 130 to the upper surface of the lower semiconductor chip 110 using the adhesive layer 210. Accordingly, the lower chip pads 112a and 112b of the lower semiconductor chip 110 may not be vertically overlapped by the upper semiconductor chip 130.

The upper semiconductor chip 130 may include upper chip pads 132a and 132b. The upper chip pads 132a and 132b may be disposed on an upper surface of the upper semiconductor chip 130. The upper chip pads 132a and 132b may be disposed on areas of the upper surface close to two opposite sides. The upper chip pads 132a and 132b may not vertically overlap the lower semiconductor chip 110.

The vertical height of the upper semiconductor chip 130 may be smaller than that of the lower semiconductor chip 110. For example, the upper semiconductor chip 130 may be a unit semiconductor chip on which the backside grinding process has been performed.

Figure 13A:
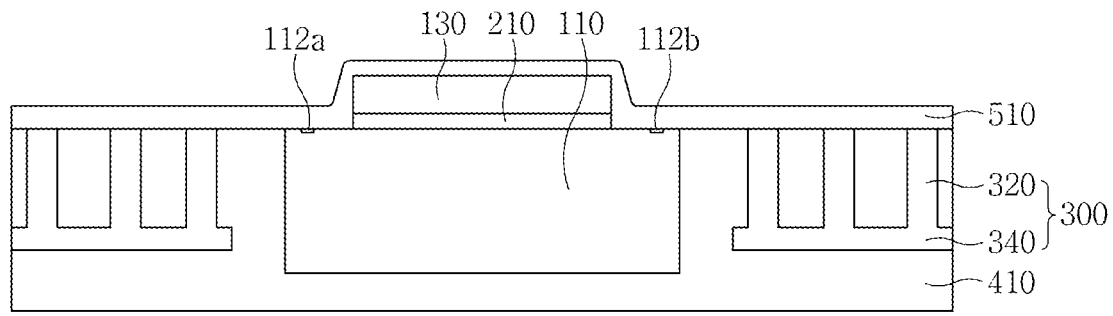
Figure 13B:
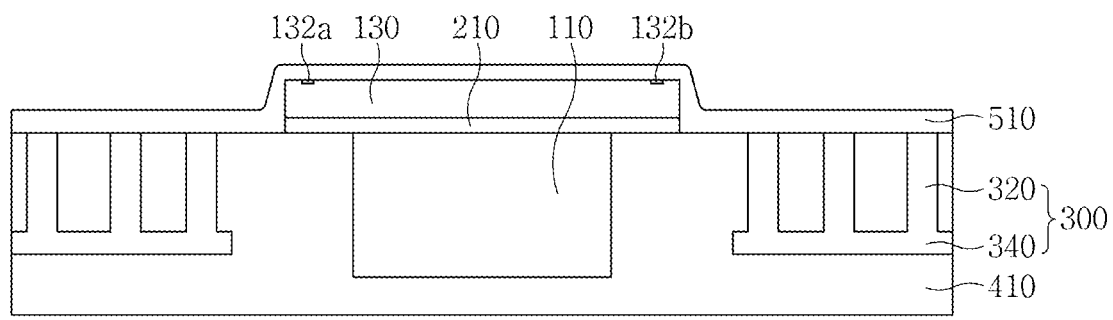
Figure 13C:
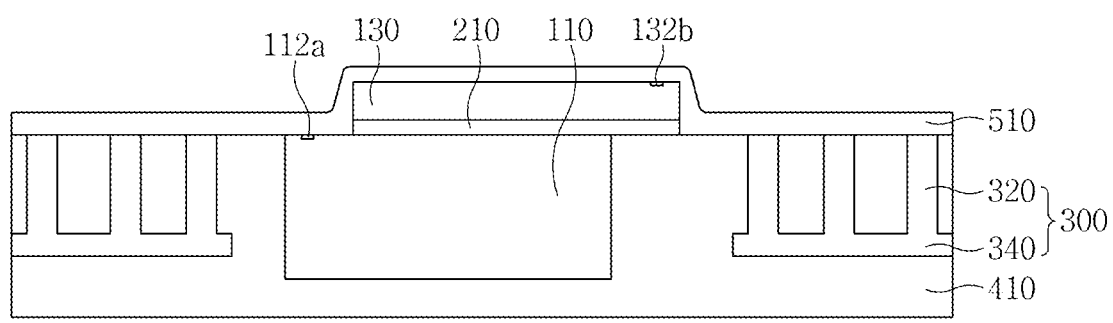

Referring to FIGS. 13A to 13C, the method of fabricating a semiconductor package in accordance with example embodiments of inventive concepts may include a process of forming a first upper insulating layer 510 on the lower molding element 410 and the upper semiconductor chip 130.

The process of forming the first upper insulating layer 510 on the lower molding element 410 and the upper semiconductor chip 130 may include a process of covering upper surfaces of the lower molding element 410 and lower semiconductor chip 110 which are not overlapped by the upper semiconductor chip 130, with the first upper insulating layer 510. The process of forming the first upper insulating layer 510 on the lower molding element 410 and the upper semiconductor chip 130 may include a process of covering side and upper surfaces of the upper semiconductor chip 130 with the first upper insulating layer 510.

Figure 14A:
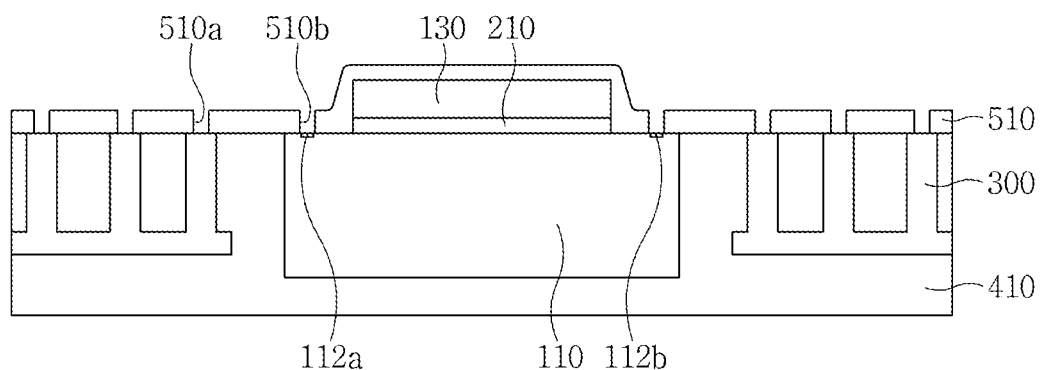
Figure 14B:
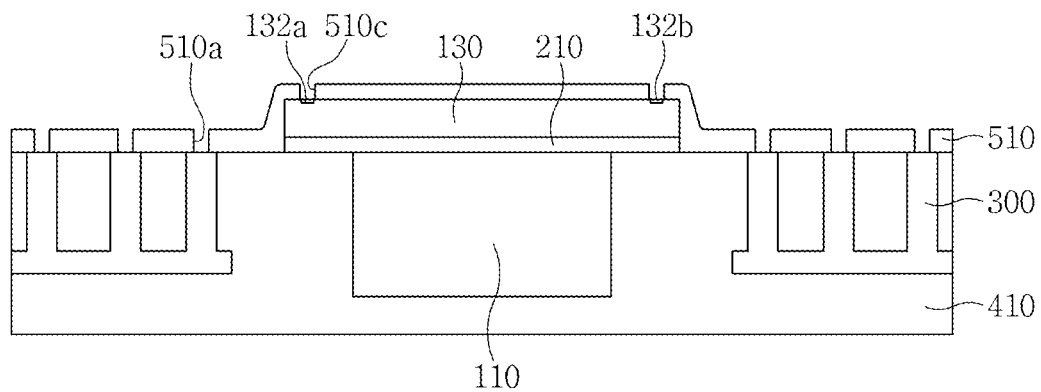
Figure 14C:
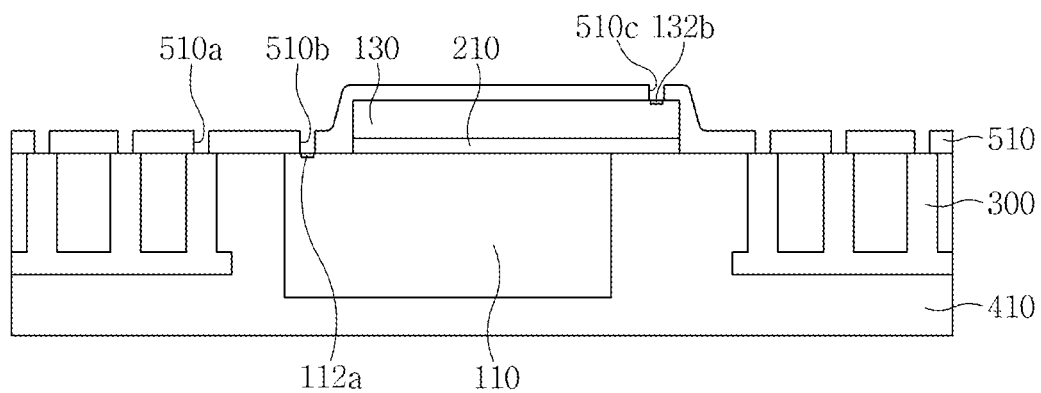

Referring to FIGS. 14A to 14C, the method of fabricating a semiconductor package in accordance with example embodiments of inventive concepts may include a process of forming first upper via holes 510a, second upper via holes 510b, and third upper via holes 510c in the first upper insulating layer 510.

The process of forming the first upper via holes 510a, the second upper via holes 510b, and the third upper via holes 510c in the first upper insulating layer 510 may include a process of forming the first upper via holes 510a in the first upper insulating layer 510 disposed on the upper surfaces of the conductive pillars 320, a process of forming the second upper via holes 510b in the first upper insulating layer 510 disposed on upper surfaces of the lower chip pads 112a and 112b, and a process of forming the third upper via holes 510c in the first upper insulating layer 510 disposed on upper surfaces of the upper chip pads 132a and 132b. The process of forming the first upper via holes 510a, the second upper via holes 510b, and the third upper via holes 510c may be simultaneously performed.

Figure 15A:
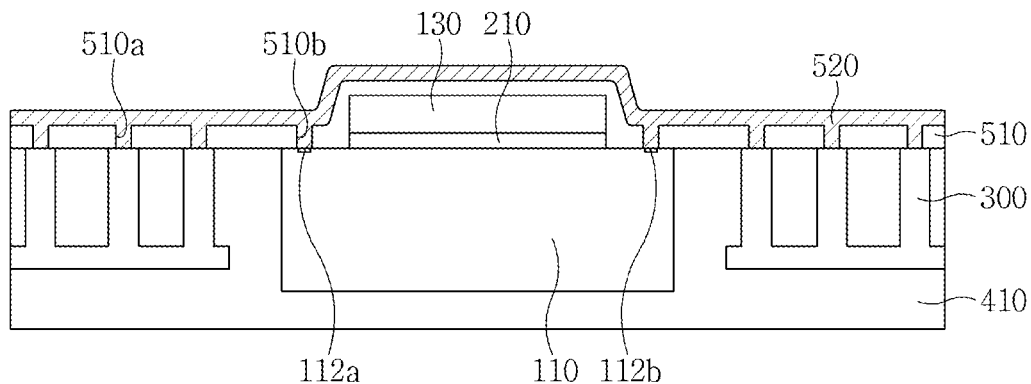
Figure 15B:
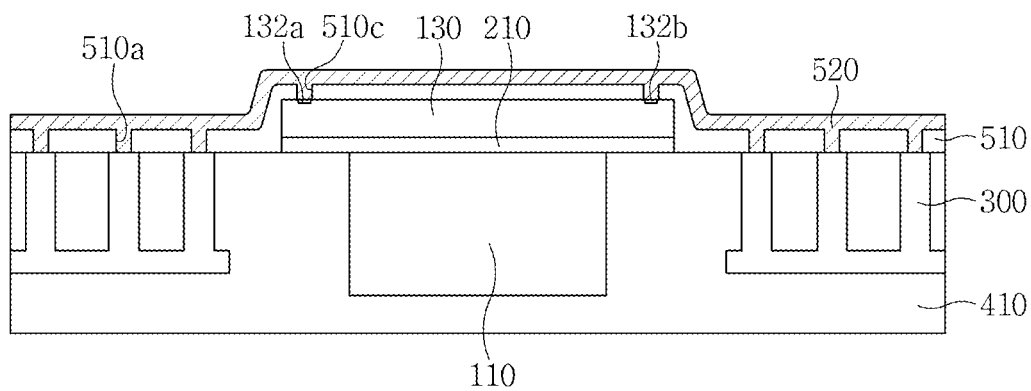
Figure 15C:
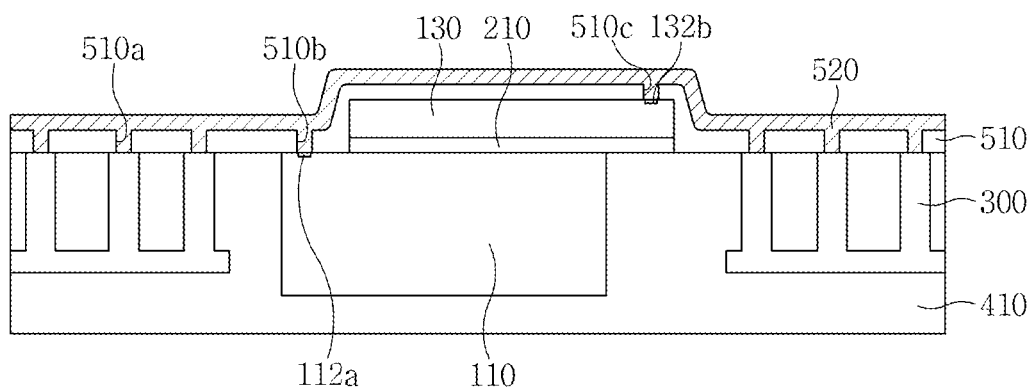

Referring to FIGS. 15A to 15C, the method of fabricating a semiconductor package in accordance with example embodiments of inventive concepts may include a process of forming a first redistribution layer 520 on the first upper insulating layer 510.

The process of forming the first redistribution layer 520 on the first upper insulating layer 510 may include a process of filling the first upper via holes 510a, the second upper via holes 510b, and the third upper via holes 510c with the first redistribution layer 520. The first redistribution layer 520 may be in direct contact with the upper surfaces of the conductive pillars 320 through the first upper via holes 510a. The first redistribution layer 520 may be in direct contact with the upper surfaces of the lower chip pads 112a and 112b through the second upper via holes 510b. The first redistribution layer 520 may be in direct contact with the upper surfaces of the upper chip pads 132a and 132b through the third upper via holes 510c.

Figure 16A:
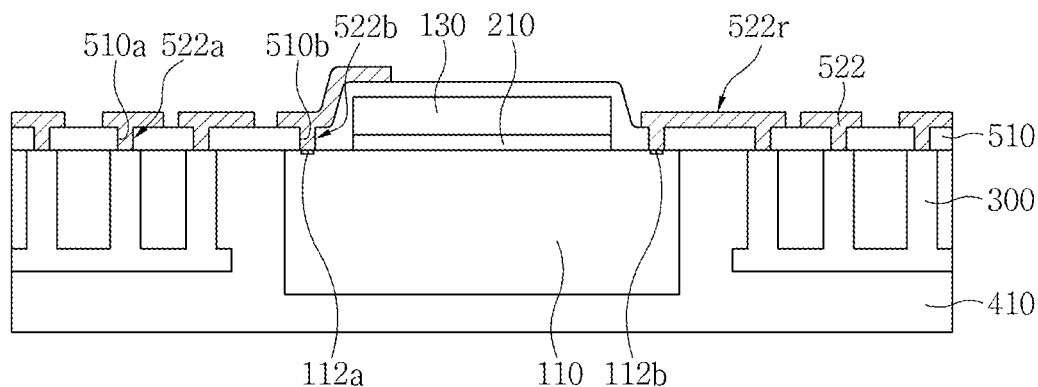
Figure 16B:
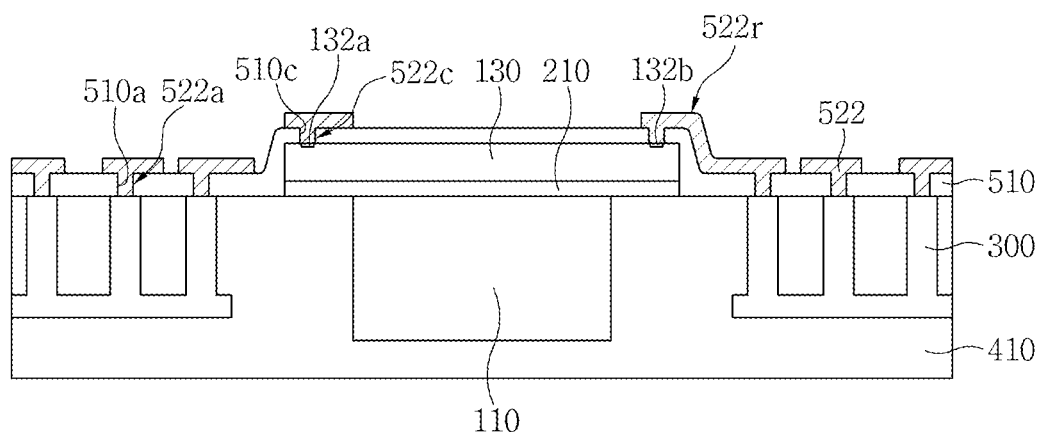
Figure 16C:
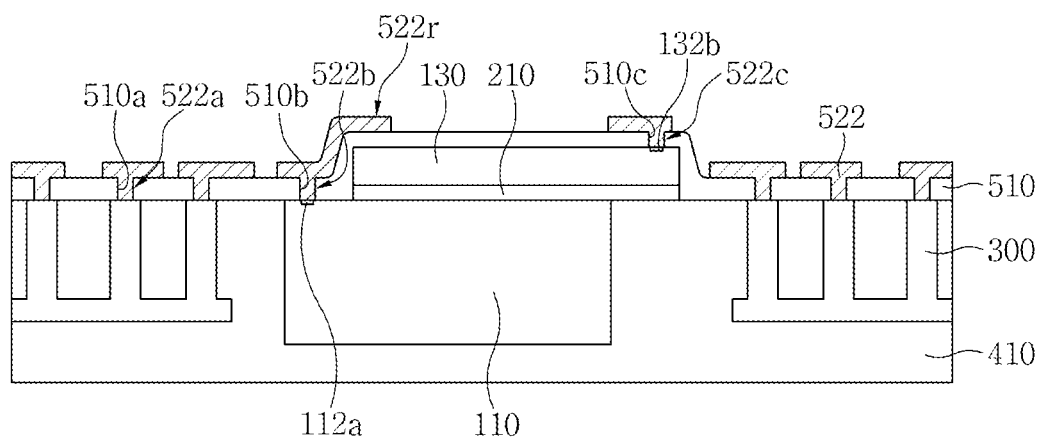

Referring to FIGS. 16A to 16C, the method of fabricating a semiconductor package in accordance with example embodiments of inventive concepts may include a process of forming a first redistribution pattern 522 on the first upper insulating layer 510.

The process of forming the first redistribution pattern 522 on the first upper insulating layer 510 may include a process of patterning the first redistribution layer 520. The first redistribution pattern 522 may include first contact plugs 522a disposed in the first upper via holes 510a, second contact plugs 522b disposed in the second upper via holes 510b, third contact plugs 522c disposed in third upper via holes 510c, and a first interconnection portion 522r disposed on an upper surface of the first upper insulating layer 510. The first interconnection portion 522r may selectively connect the first contact plugs 522a, the second contact plugs 522b, and the third contact plugs 522c.

Figure 17A:
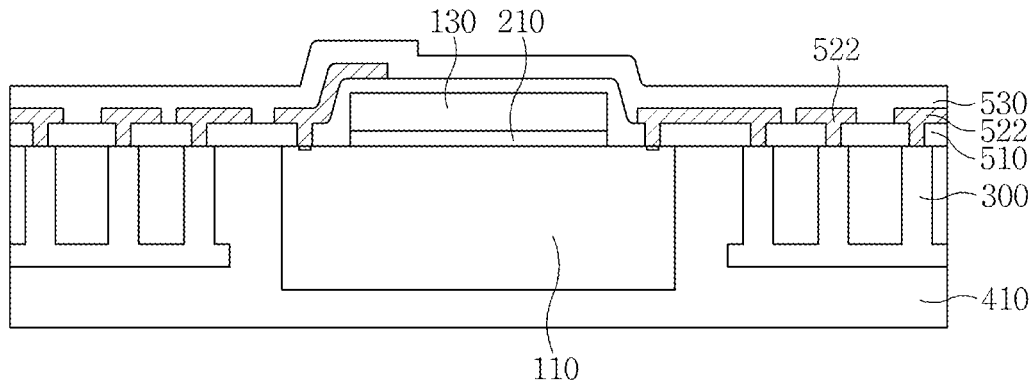
Figure 17B:
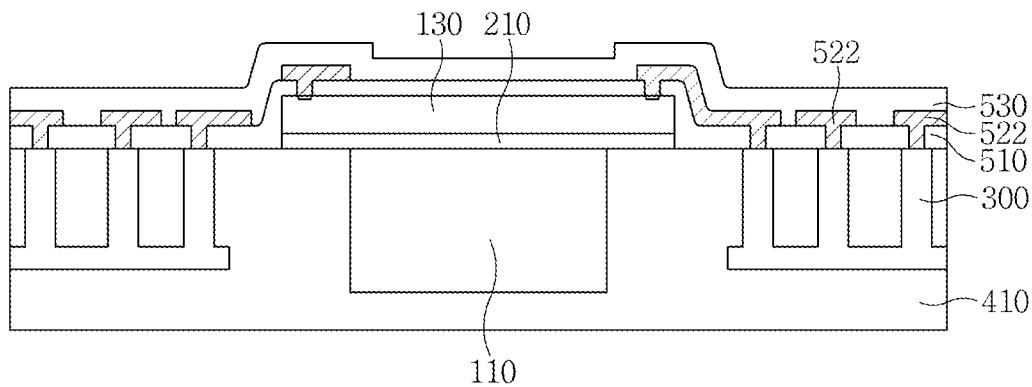
Figure 17C:
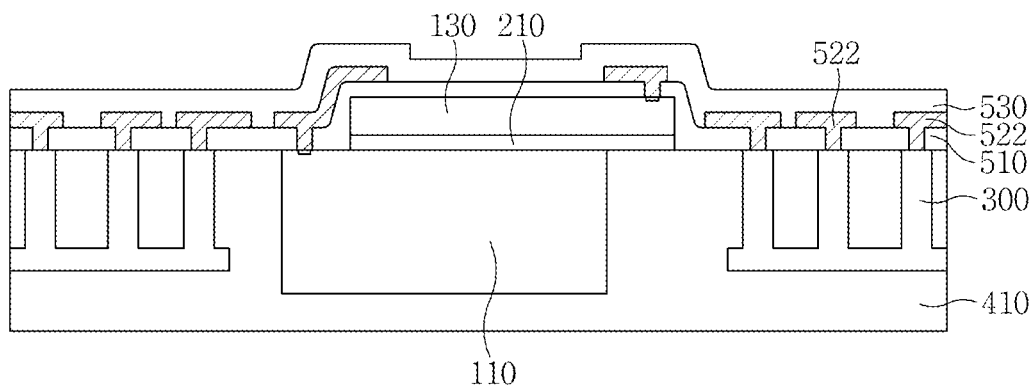

Referring to FIGS. 17A to 17C, the method of fabricating a semiconductor package in accordance with example embodiments of inventive concepts may include a process of forming a second upper insulating layer 530 on the first redistribution pattern 522.

The process of forming the second upper insulating layer 530 on the first redistribution pattern 522 may include a process of covering side and upper surfaces of the first redistribution pattern 522 with the second upper insulating layer 530.

Figure 18A:
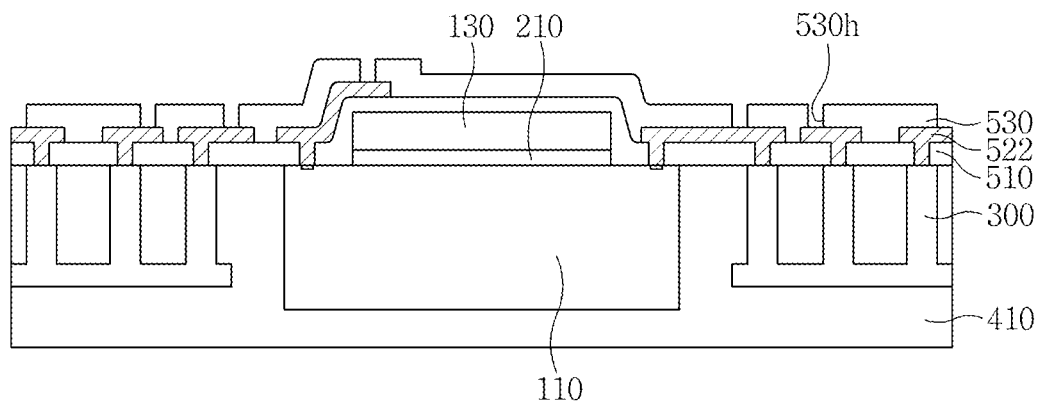
Figure 18B:
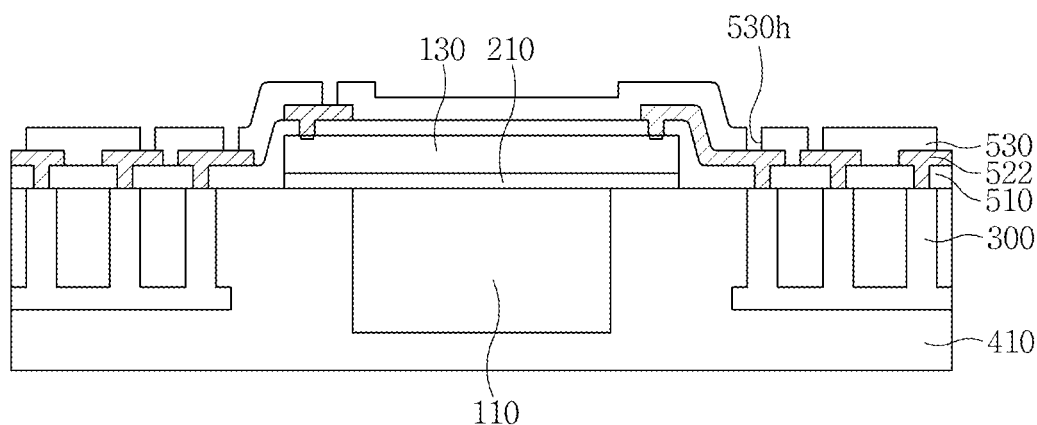
Figure 18C:
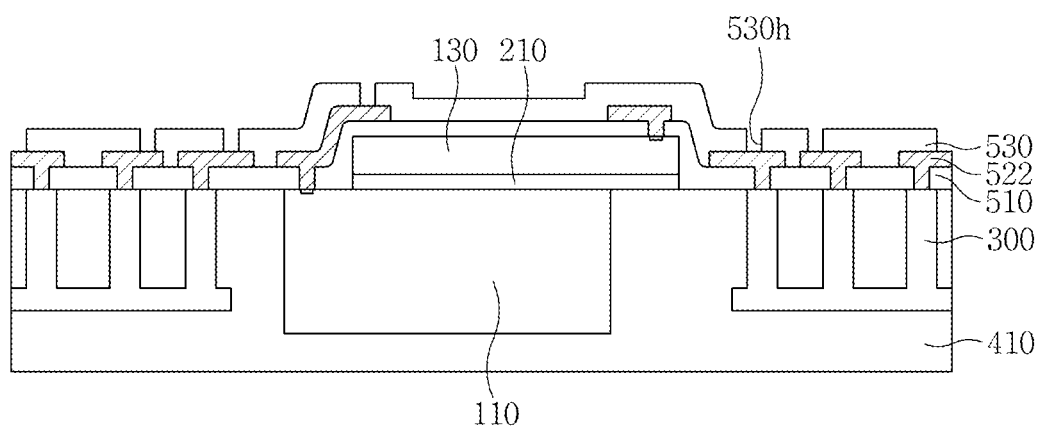

Referring to FIGS. 18A to 18C, the method of fabricating a semiconductor package in accordance with example embodiments of inventive concepts may include a process of forming fourth upper via holes 530h in the second upper insulating layer 530.

The process of forming the fourth upper via holes 530h in the second upper insulating layer 530 may include a process of forming the fourth upper via holes 530h in the second upper insulating layer 530 disposed on an upper surface of the first interconnection portion 522r.

Figure 19A:
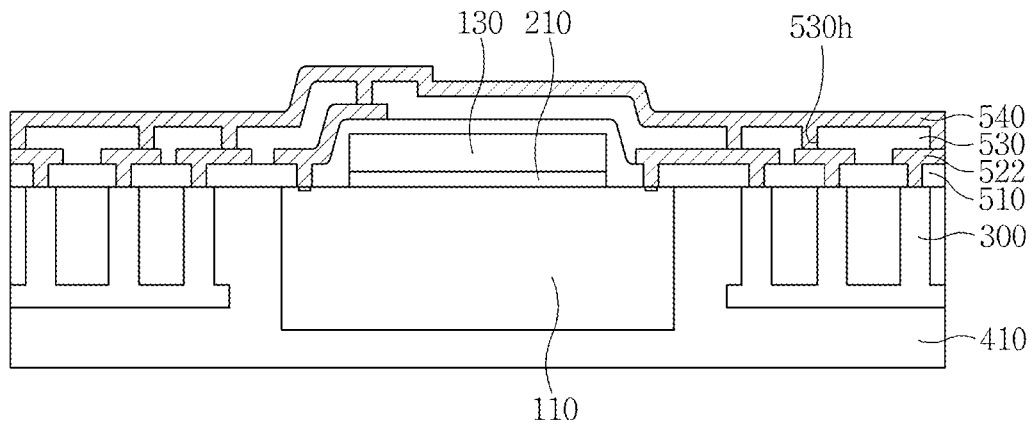
Figure 19B:
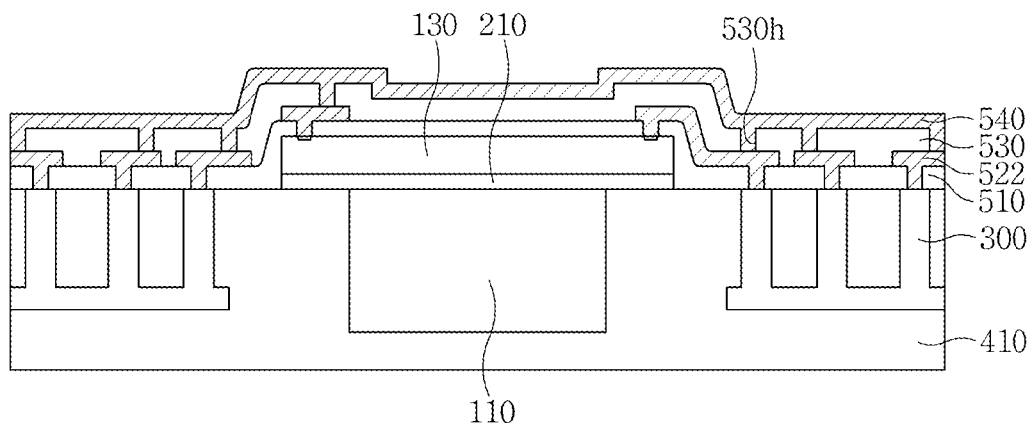
Figure 19C:
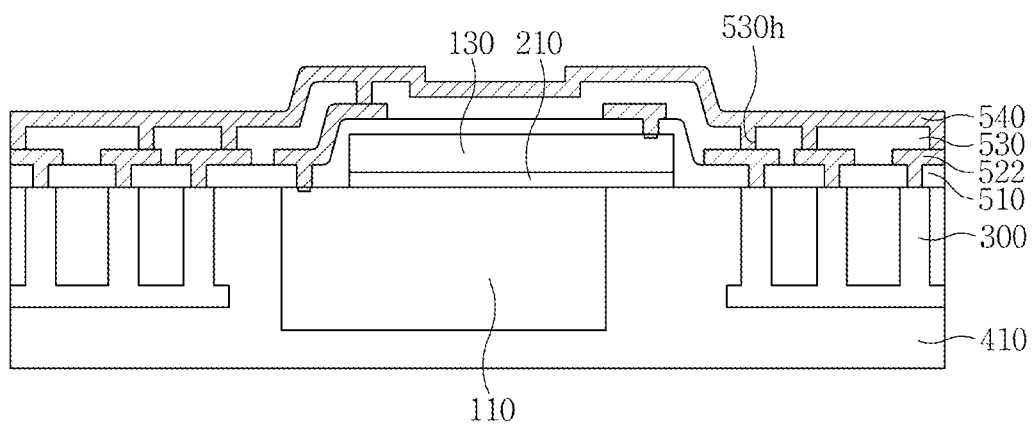

Referring to FIGS. 19A to 19C, the method of fabricating a semiconductor package in accordance with example embodiments of inventive concepts may include a process of forming a second redistribution layer 540 on the second upper insulating layer 530.

The process of forming the second redistribution layer 540 on the second upper insulating layer 530 may include a process of filling the fourth upper via holes 530h with the second redistribution layer 540. The second redistribution layer 540 may be in direct contact with the upper surface of the first interconnection portion 522r of the first redistribution pattern 522 through the fourth upper via holes 530h.

Figure 20A:
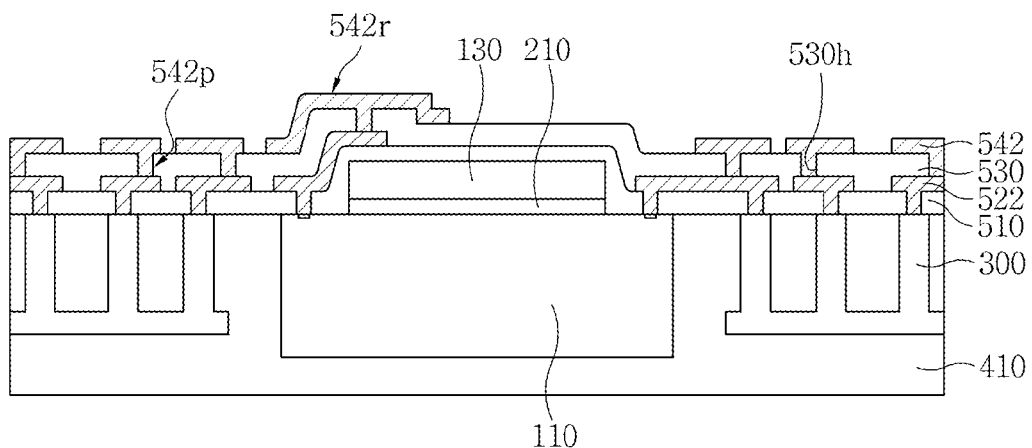
Figure 20B:
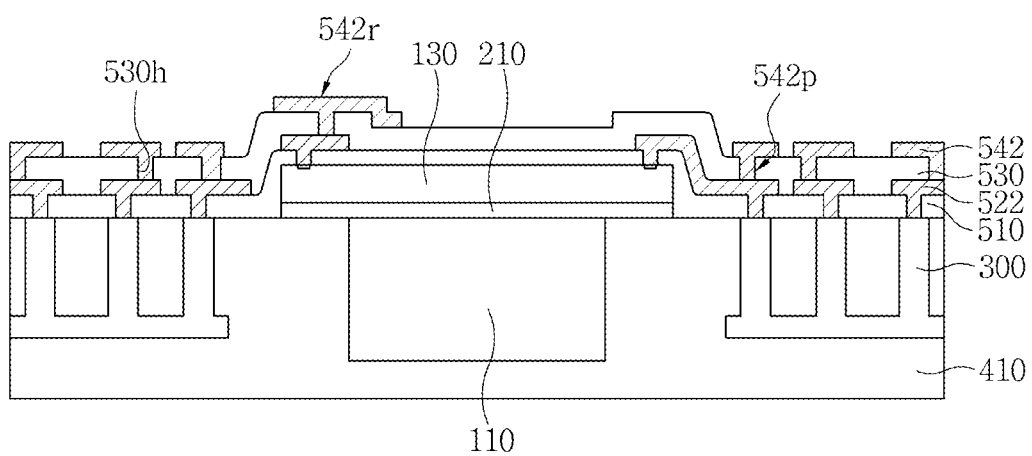
Figure 20C:
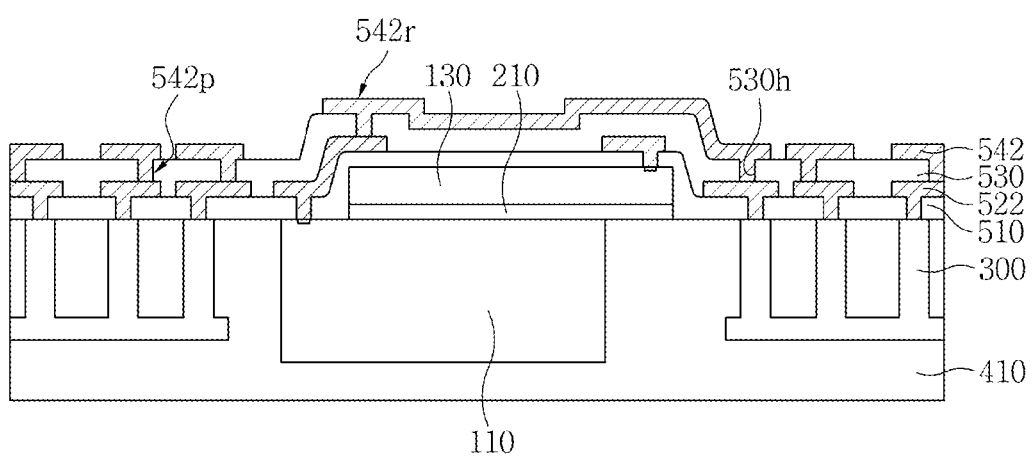

Referring to FIGS. 20A to 20C, the method of fabricating a semiconductor package in accordance with example embodiments of inventive concepts may include a process of forming a second redistribution pattern 542 on the second upper insulating layer 530.

The process of forming the second redistribution pattern 542 on the second upper insulating layer 530 may include a process of patterning the second redistribution layer 540. The second redistribution pattern 542 may include fourth contact plugs 542p disposed in the fourth upper via holes 530h and a second interconnection portion 542r disposed on an upper surface of the second upper insulating layer 530. The second interconnection portion 542r may selectively connect the fourth contact plugs 542p.

Figure 21A:
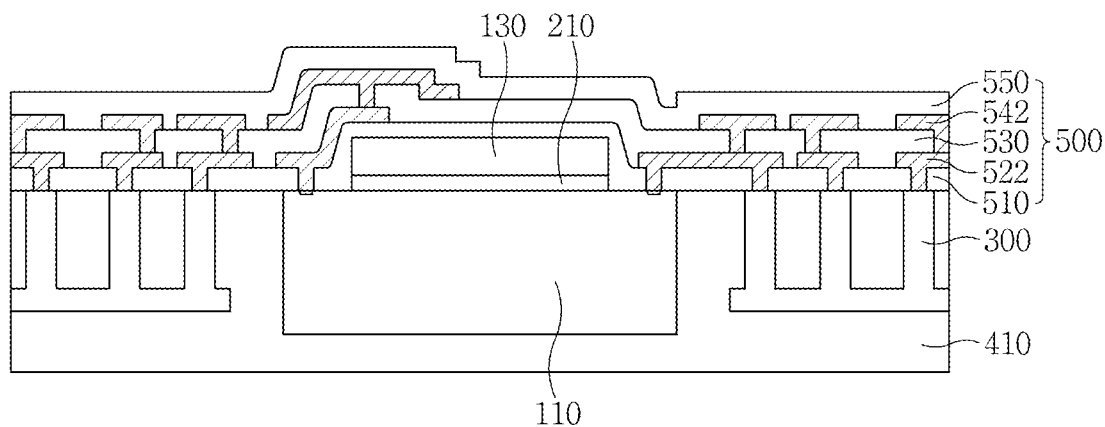
Figure 21B:
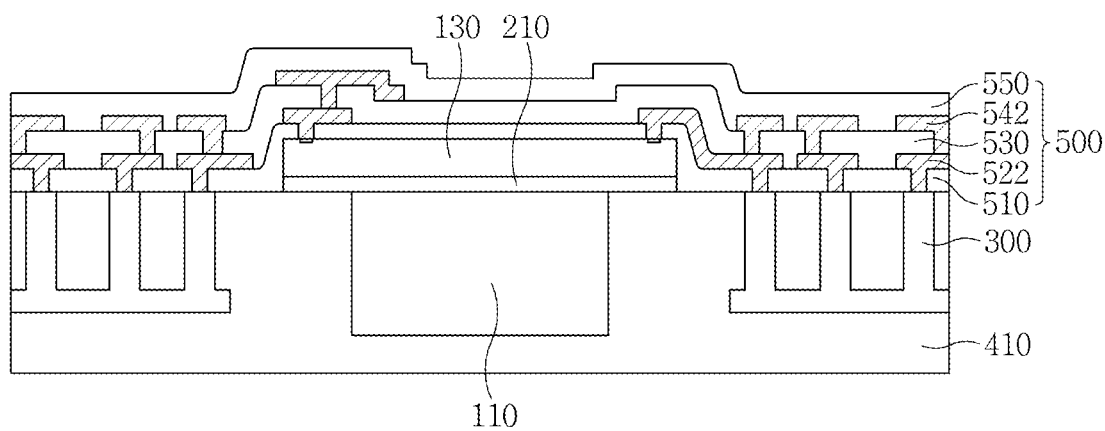
Figure 21C:
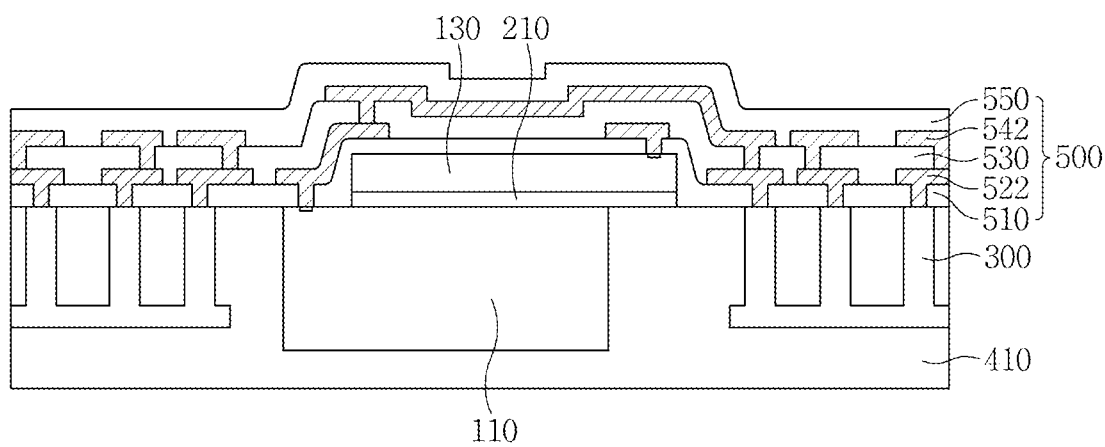

Referring to FIGS. 21A to 21C, the method of fabricating a semiconductor package in accordance with example embodiments of inventive concepts may include a process of forming a third upper insulating layer 550 on the second redistribution pattern 542.

The process of forming the third upper insulating layer 550 on the second redistribution pattern 542 may include a process of covering side and upper surfaces of the second redistribution pattern 542 with the third upper insulating layer 550. The first upper insulating layer 510, the first redistribution pattern 522, the second upper insulating layer 530, the second redistribution pattern 542, and the third upper insulating layer 550 may configure a connecting structure 500.

Figure 22A:
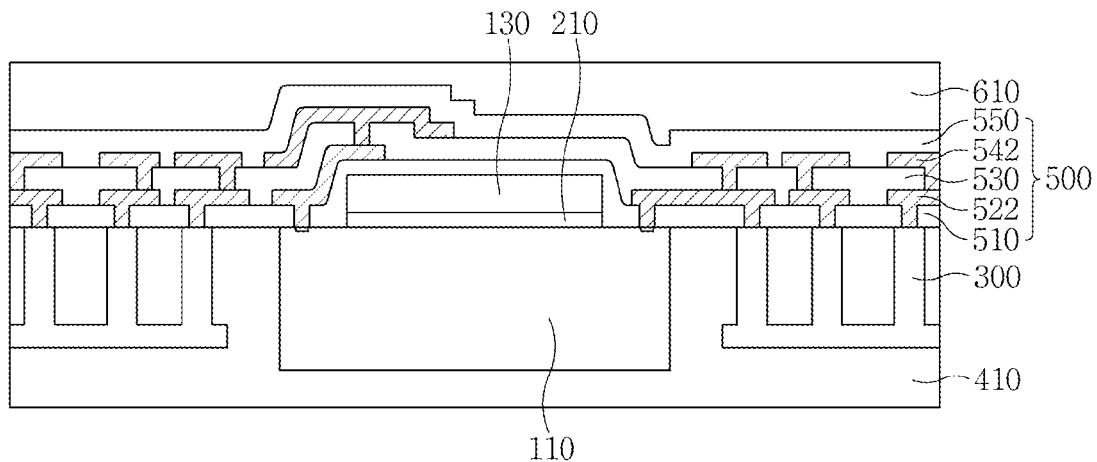
Figure 22B:
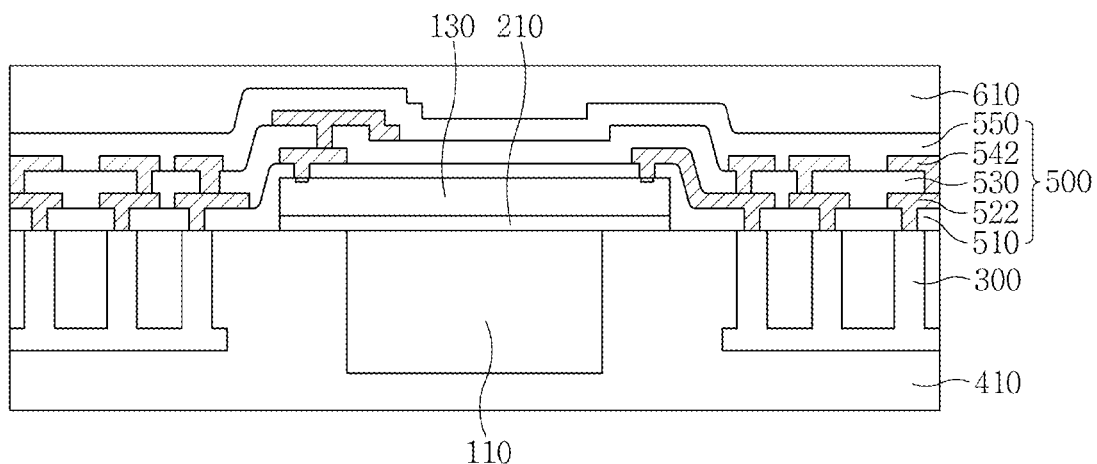
Figure 22C:
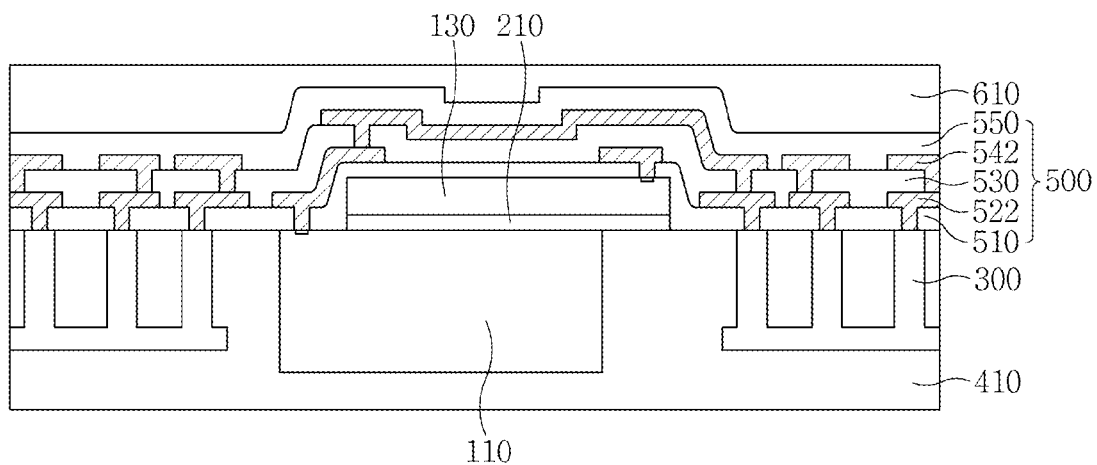

Referring to FIGS. 22A to 22C, the method of fabricating a semiconductor package in accordance with example embodiments of inventive concepts may include a process of forming an upper molding element 610 on the third upper insulating layer 550 of the connecting structure 500.

Figure 23A:
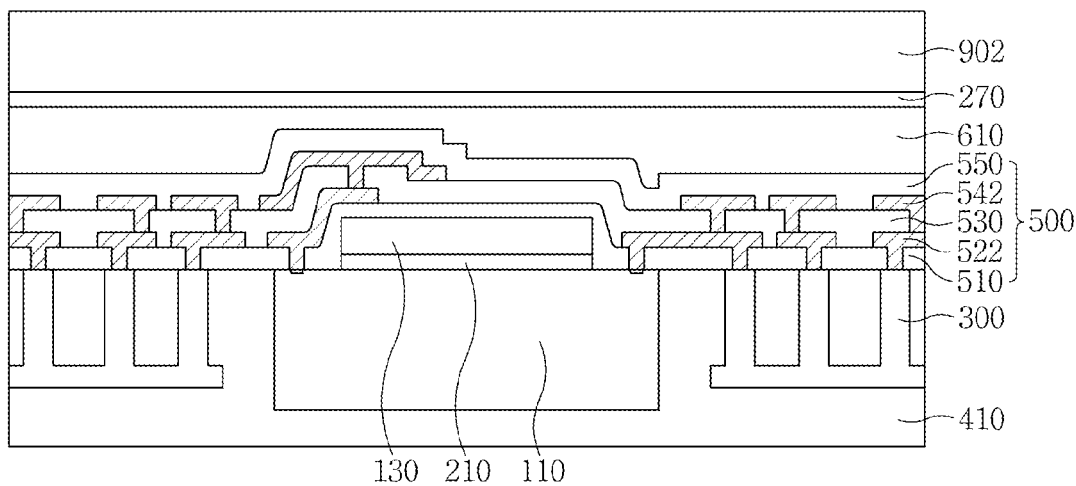
Figure 23B:
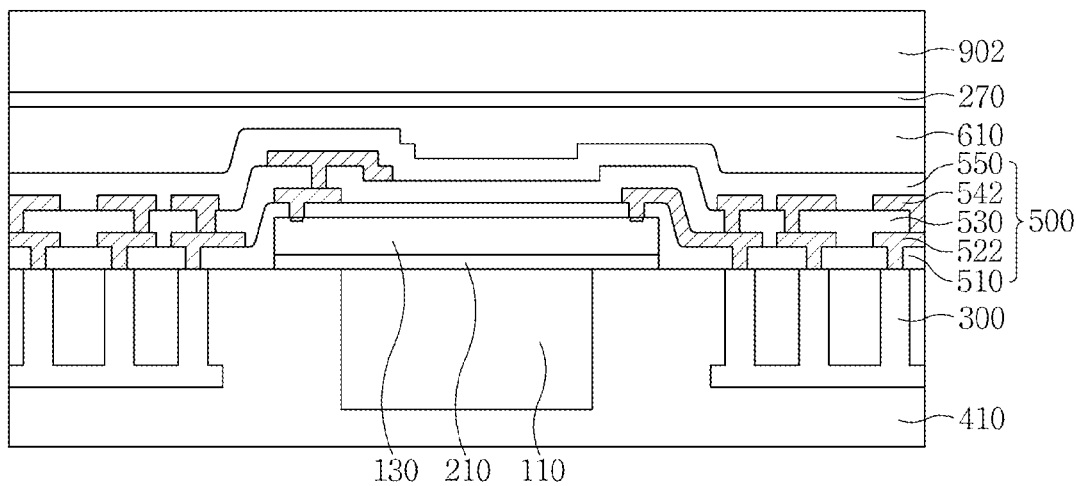
Figure 23C:
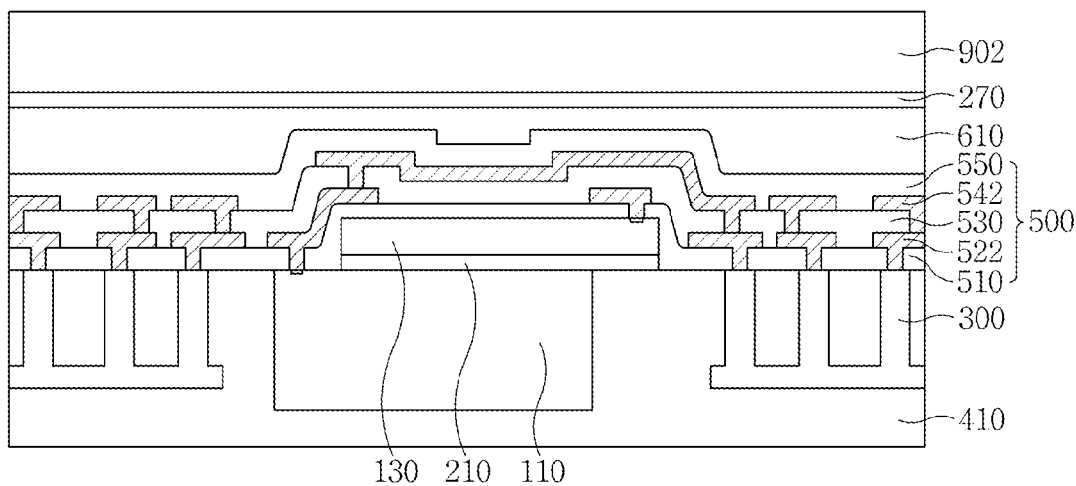

Referring to FIGS. 23A to 23C, the method of fabricating a semiconductor package in accordance with example embodiments of inventive concepts may include a process of arranging a second carrier 902 on an upper surface of the upper molding element 610.

The process of arranging the second carrier 902 on the upper surface of the upper molding element 610 may include a process of providing the second carrier 902, a process of forming a second carrier adhesive layer 270 on a lower surface of the second carrier 902, and a process of attaching the second carrier 902 to the upper surface of the upper molding element 610 using the second carrier adhesive layer 270.

Figure 24A:
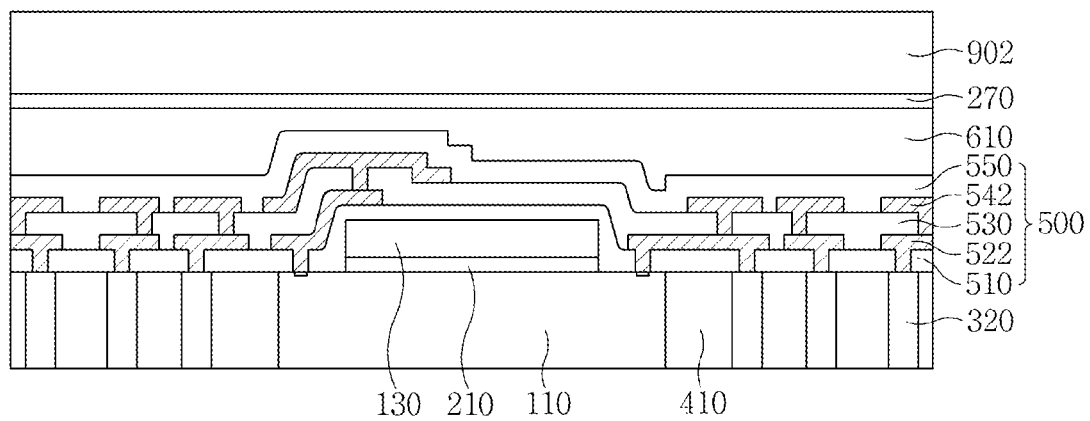
Figure 24B:
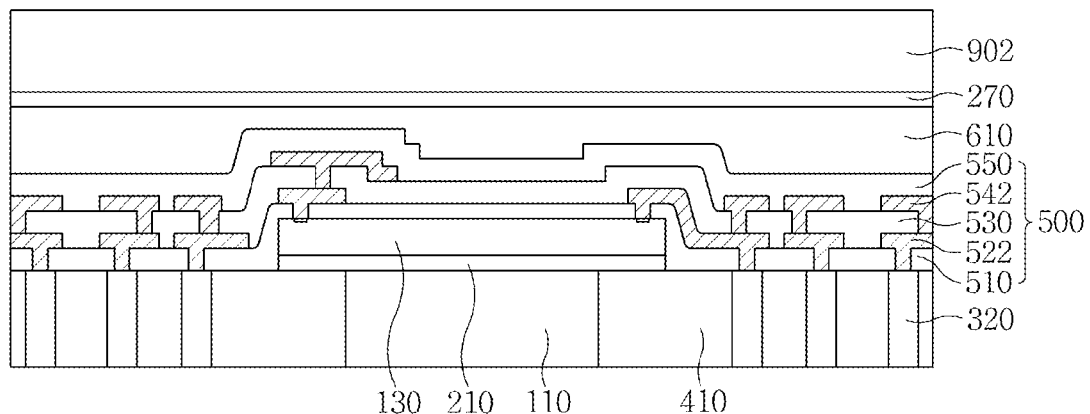
Figure 24C:
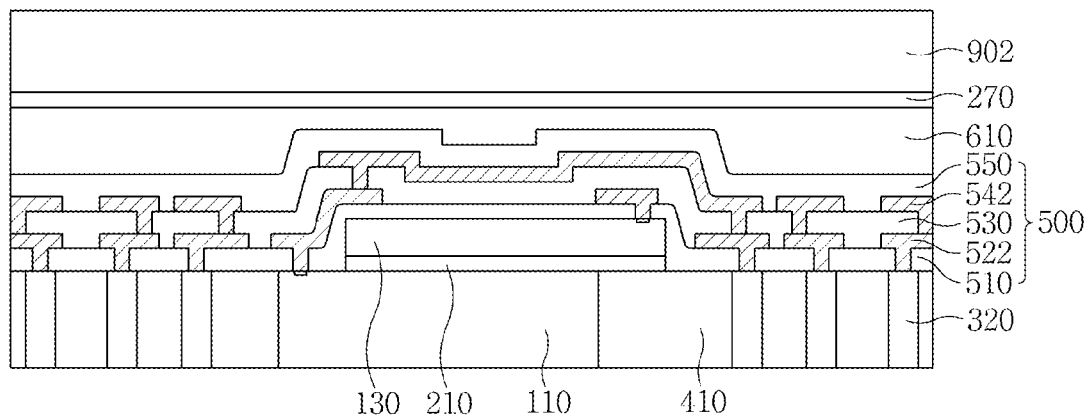

Referring to FIGS. 24A to 24C, the method of fabricating a semiconductor package in accordance with example embodiments of inventive concepts may include a process of removing the pillar connection part 340 of the conductive structure 300.

The process of removing the pillar connection part 340 of the conductive structure 300 may include a process of making the vertical height of the lower molding element 410 the same as that of the lower semiconductor chip 110. The process of removing the pillar connection part 340 of the conductive structure 300 may include a process of making the vertical height of the conductive pillars 320 the same as that of the lower semiconductor chip 110. The process of removing the pillar connection part 340 of the conductive structure 300 may include a process of grinding or etching back lower surfaces of the lower semiconductor chip 110 and the lower molding element 410.

Figure 25A:
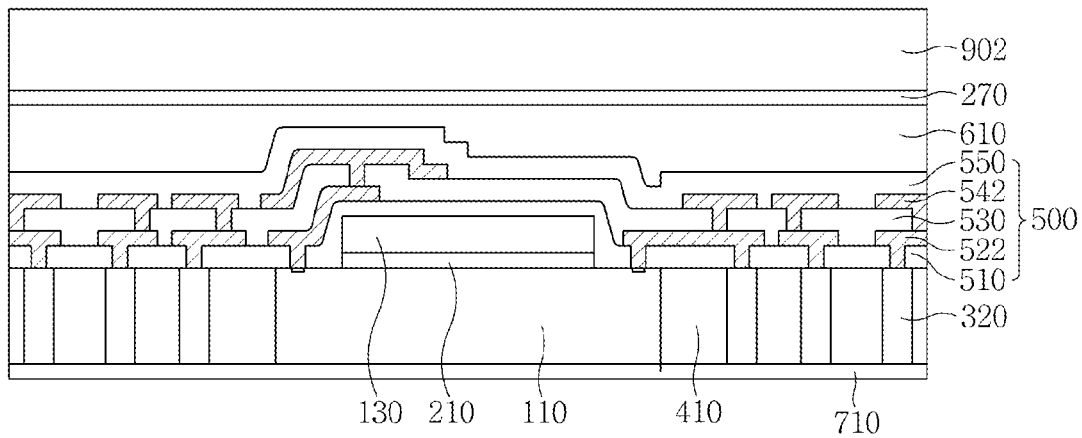
Figure 25B:
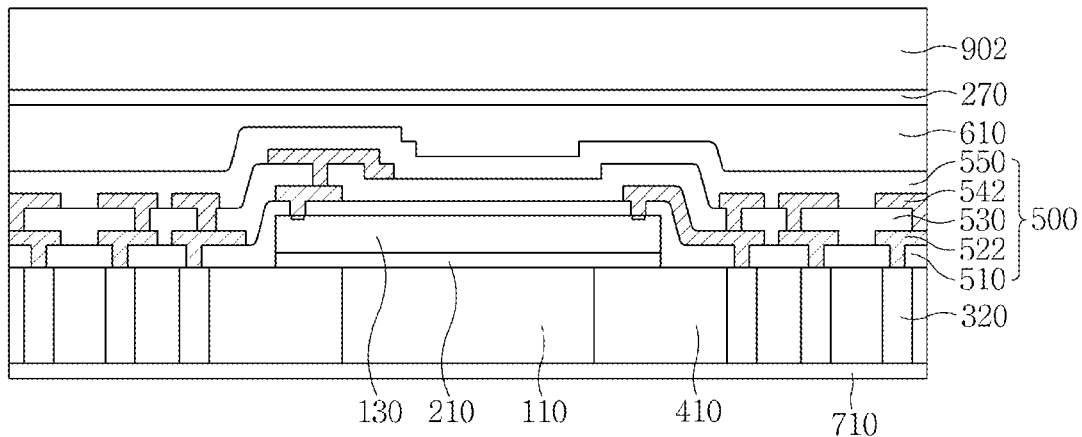
Figure 25C:
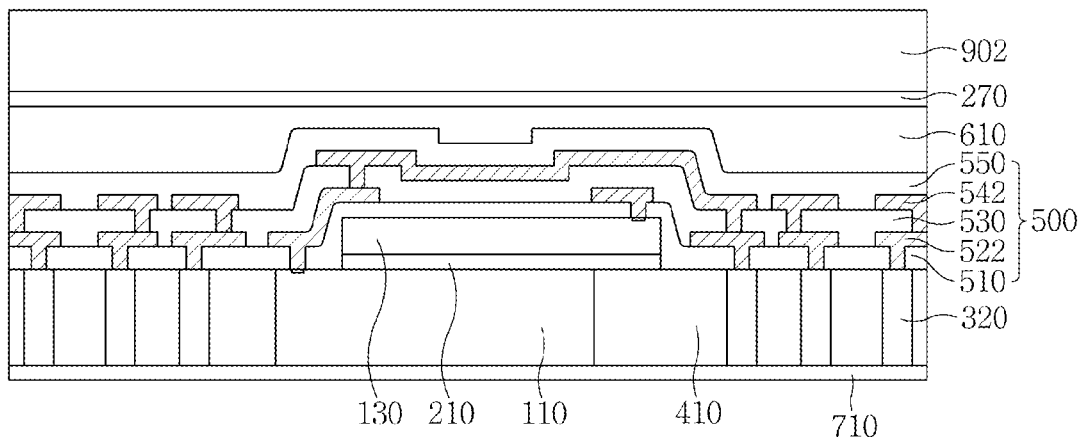

Referring to FIGS. 25A to 25C, the method of fabricating a semiconductor package in accordance with example embodiments of inventive concepts may include a process of forming a lower insulating layer 710 on the lower surfaces of the conductive pillars 320, the lower molding element 410, and the lower semiconductor chip 110.

The process of forming the lower insulating layer 710 on the lower surfaces of the lower molding element 410 may include a process of covering the lower surfaces of the conductive pillars 320, the lower molding element 410, and the lower semiconductor chip 110 with the lower insulating layer 710.

Figure 26A:
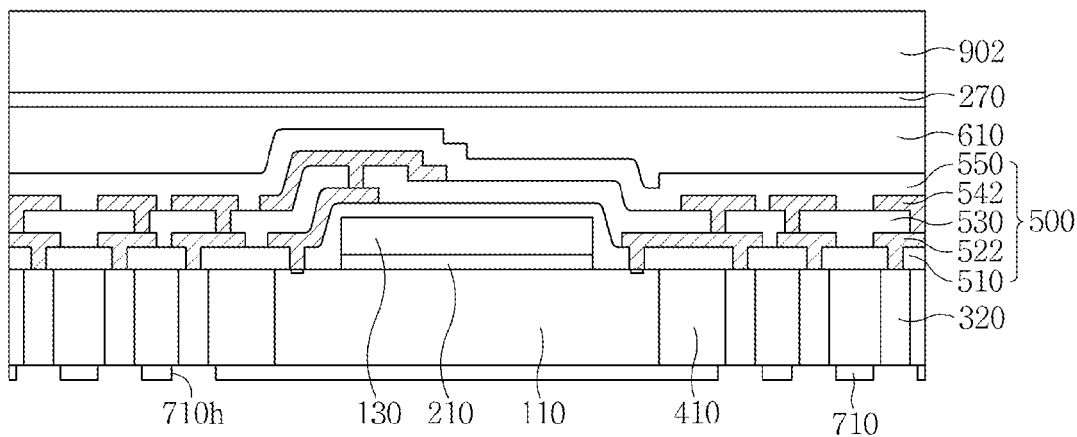
Figure 26B:
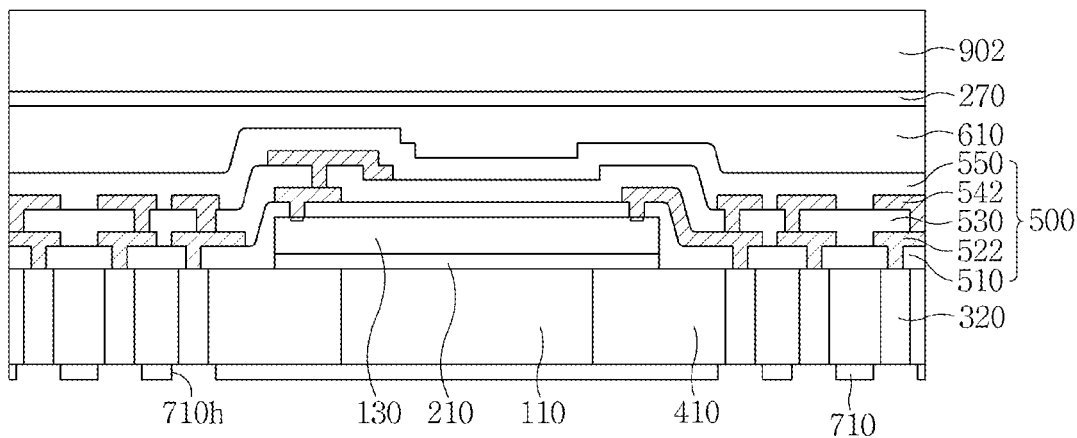
Figure 26C:
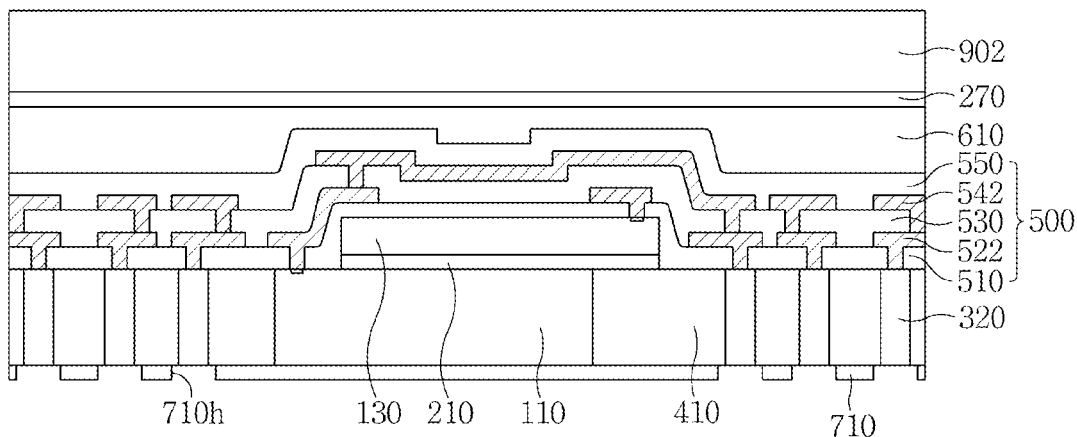

Referring to FIGS. 26A to 26C, the method of fabricating a semiconductor package in accordance with example embodiments of inventive concepts may include a process of forming lower via holes 710h in the lower insulating layer 710.

The process of forming the lower via holes 710h in the lower insulating layer 710 may include a process of forming the lower via holes 710h in the lower insulating layer 710 disposed on the lower surfaces of the conductive pillars 320. The horizontal width of the lower via holes 710h may be greater than that of the lower surfaces of the conductive pillars 320.

Figure 27A:
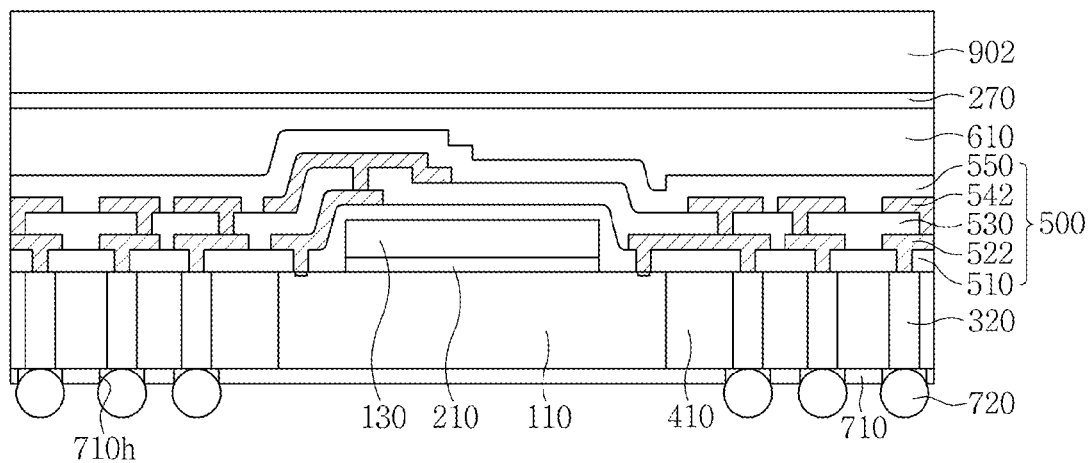
Figure 27B:
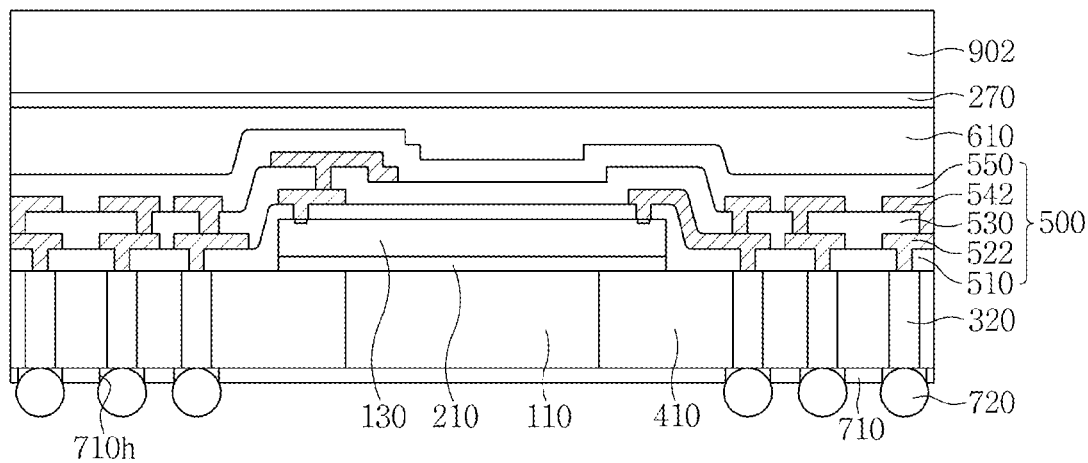
Figure 27C:
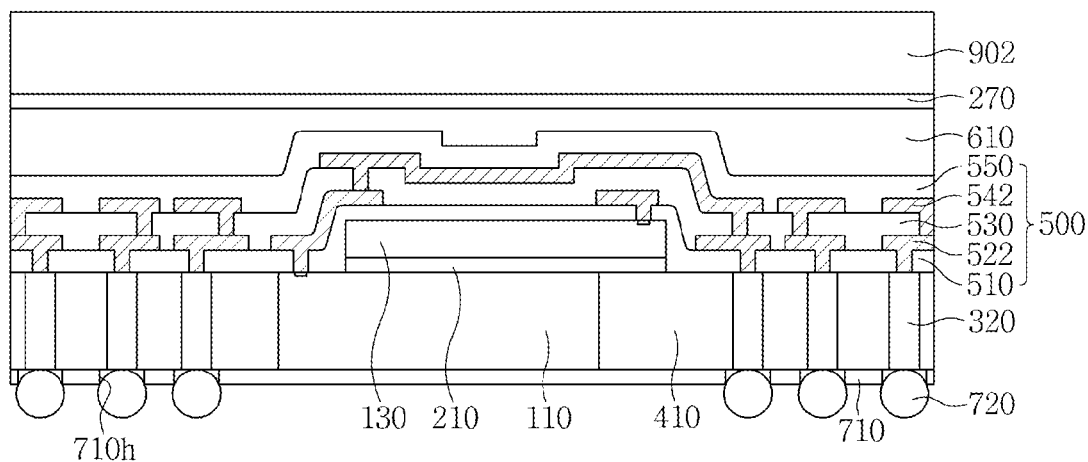

Referring to FIGS. 27A to 27C, the method of fabricating a semiconductor package in accordance with example embodiments of inventive concepts may include a process of forming external terminals 720 on the lower surfaces of the conductive pillars 320.

The process of forming the external terminals 720 on the lower surfaces of the conductive pillars 320 may include a process of forming external terminals 720 in the lower via holes 710h of the lower insulating layer 710.

Figure 28A:
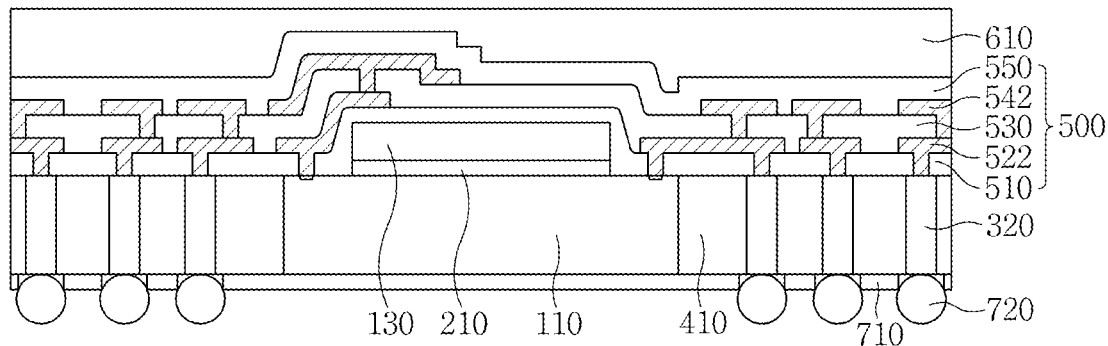
Figure 28B:
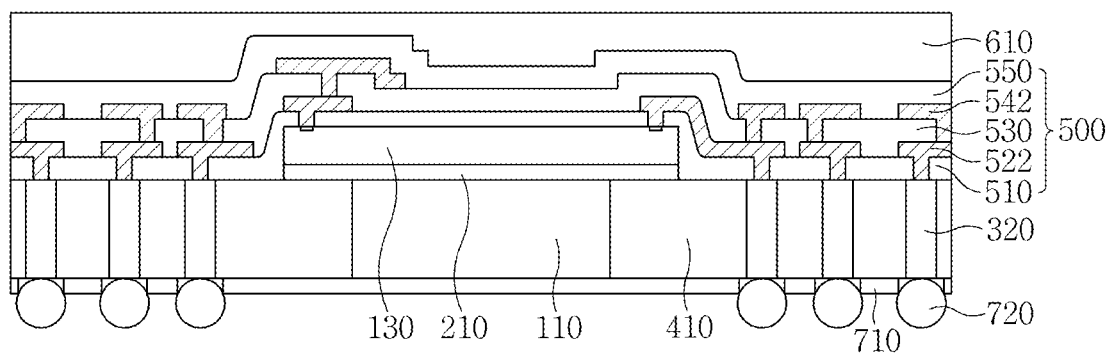
Figure 28C:
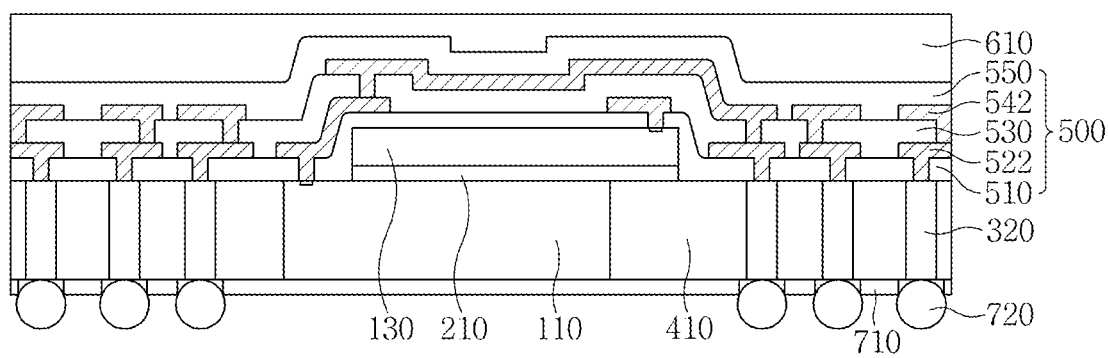
Figure 29A:
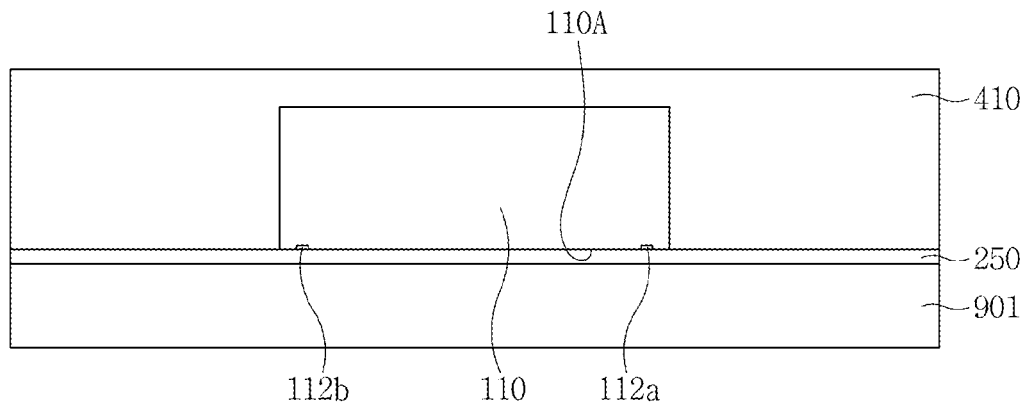
Figure 29B:
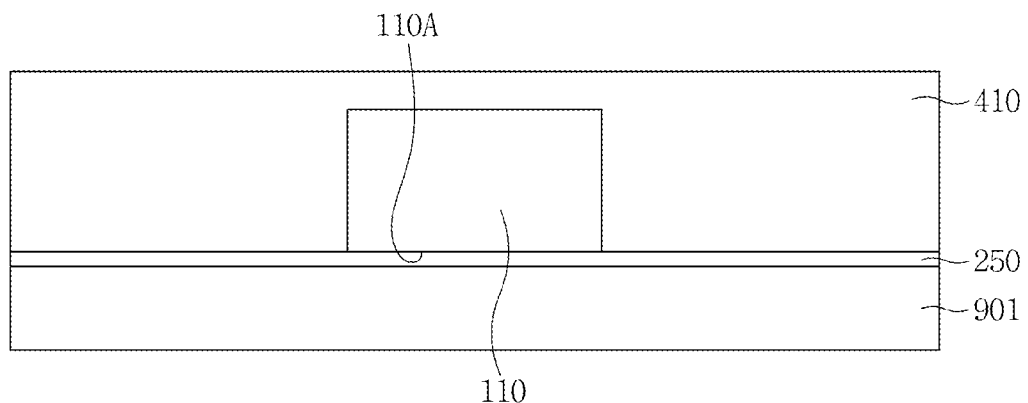
Figure 29C:
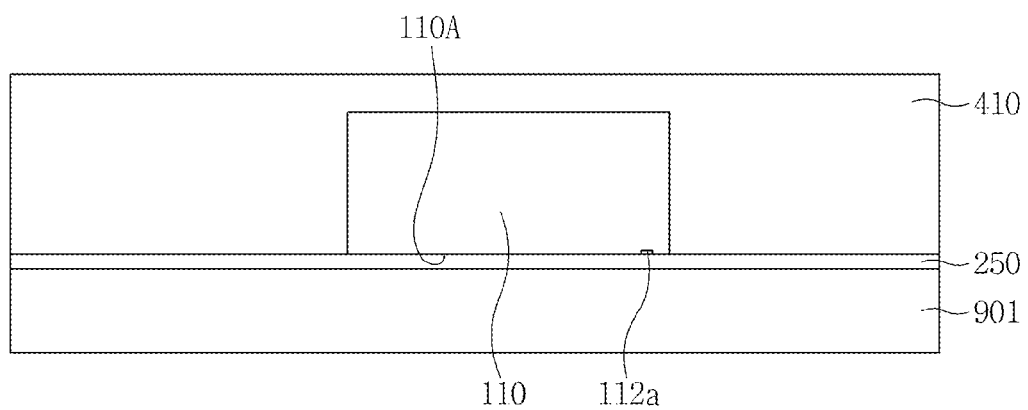

Referring to FIGS. 28A to 28C, the method of fabricating a semiconductor package in accordance with example embodiments of inventive concepts may include a process of removing the second carrier 902 and the second carrier adhesive layer 270.

Referring to FIGS. 1, and 2A to 2C, the method of fabricating a semiconductor package in accordance with example embodiments of inventive concepts may include a process of forming a unit package.

The process of forming the unit package may include a process of cutting the lower molding element 410, the connecting structure 500, and the upper molding element 610. The process of cutting the lower molding element 410, the connecting structure 500, and the upper molding element 610 may include a sawing process.

FIGS. 5A to 5C, 29A to 35A, 29B to 35B, and 29C to 35C are cross-sectional views sequentially describing a method of fabricating a semiconductor package in accordance with example embodiments of inventive concepts.

The method of fabricating a semiconductor package in accordance with example embodiments of inventive concepts will be described with reference to FIGS. 5A to 5C, 29A to 35A, 29B to 35B, and 29C to 35C. First, referring to FIGS. 29A to 29C, the method of fabricating a semiconductor package in accordance with example embodiments of inventive concepts may include a process of arranging a lower semiconductor chip 110 on an upper surface of a first carrier adhesive layer 250 of a first carrier 901 and a process of forming a lower molding element 410 covering side and upper surfaces of the lower semiconductor chip 110 on the upper surface of the first carrier adhesive layer 250.

The process of arranging the lower semiconductor chip 110 on the upper surface of the first carrier adhesive layer 250 may include a process of providing the lower semiconductor chip 110 having lower chip pads 112a and 112b, a process of aligning the lower semiconductor chip 110 on the upper surface of the first carrier adhesive layer 250 so that an active surface 110A in which the lower chip pads 112a and 112b are disposed faces the first carrier adhesive layer 250, and a process of attaching the active surface 110A of the lower semiconductor chip 110 to the upper surface of the first carrier adhesive layer 250.

Figure 30A:
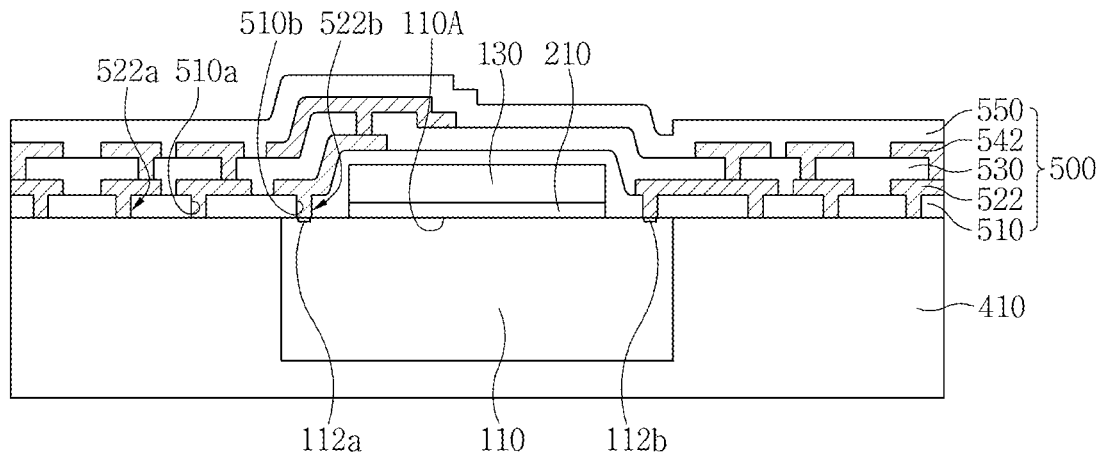
Figure 30B:
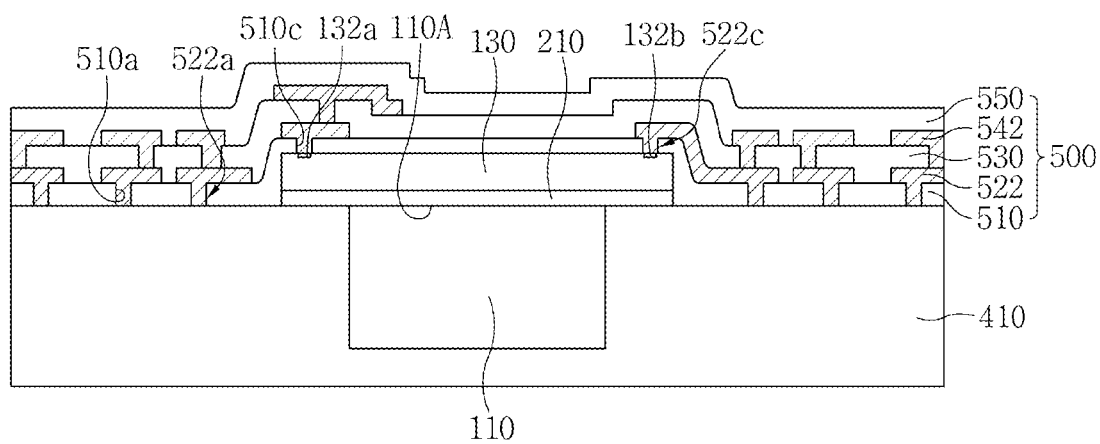
Figure 30C:
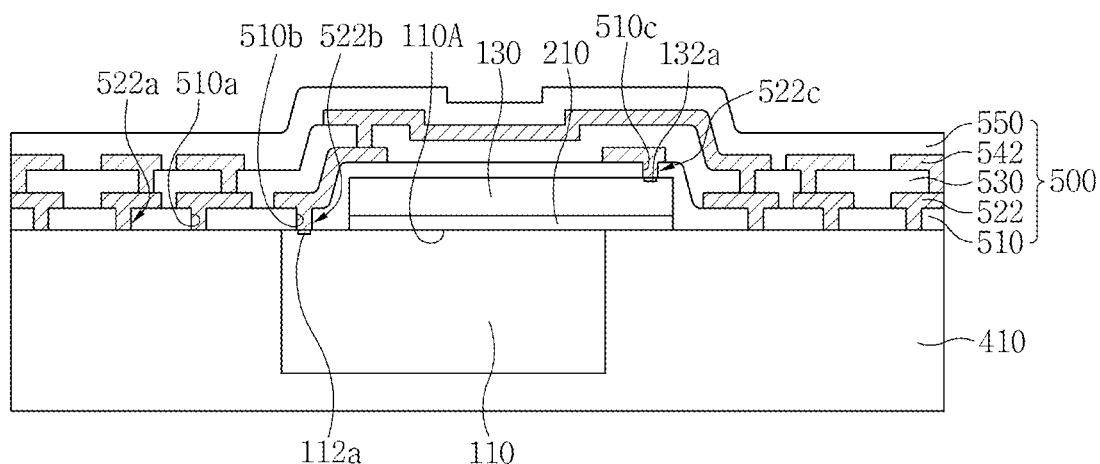

Referring to FIG. 30A to 30C, the method of fabricating a semiconductor package in accordance with example embodiments of inventive concepts may include a process of orthogonally stacking an upper semiconductor chip 130 on the active surface 110A of the lower semiconductor chip 110, and a process of forming a connecting structure 500 on the lower molding element 410 and the upper semiconductor chip 130.

The process of orthogonally stacking the upper semiconductor chip 130 on the active surface 110A of the lower semiconductor chip 110 may include a process of rotating the lower semiconductor chip 110 and the lower molding element 410 up and down, removing the first carrier 901 and the first carrier adhesive layer 250, a process of providing the upper semiconductor chip 130 having upper chip pads 132a and 132b on an upper surface thereof, forming an adhesive layer 210 on a lower surface of the upper semiconductor chip 130, a process of aligning the upper semiconductor chip 130 so that the adhesive layer 210 faces the active surface 110A of the lower semiconductor chip 110, a process of aligning the upper semiconductor chip 130 to be orthogonal to the lower semiconductor chip 110, and a process of attaching the upper semiconductor chip 130 to the active surface 110A of the lower semiconductor chip 110 using the adhesive layer 210.

The process of forming the connecting structure 500 may include a process of forming a first upper insulating layer 510 on the lower molding element 410 and the upper semiconductor chip 130, a process of forming a first redistribution pattern 522 on the first upper insulating layer 510, a process of forming a second upper insulating layer 530 on the first redistribution pattern 522, a process of forming a second redistribution pattern 542 on the second upper insulating layer 530, and a process of forming a third upper insulating layer 550 on the second redistribution pattern 542.

The process of forming the first upper insulating layer 510 on the lower molding element 410 and the upper semiconductor chip 130 may include a process of forming the first upper insulating layer 510 having first upper via holes 510a, second upper via holes 510b, and third upper via holes 510c. The first upper via holes 510a may be disposed on an upper surface of the lower molding element 410 which is not overlapped by the upper semiconductor chip 130. The first upper via holes 510a may be disposed on upper surfaces of conductive pillars 320 formed in a subsequent process. The second upper via holes 510b may be disposed on upper surfaces of the lower chip pads 112a and 112b. The third upper via holes 510c may be disposed on upper surfaces of the upper chip pads 132a and 132b.

The process of forming the first redistribution pattern 522 on the first upper insulating layer 510 may include a process of forming the first redistribution pattern 522 having first contact plugs 522a, second contact plugs 522b, and third contact plugs 522c. The first contact plugs 522a may be disposed in the first upper via holes 510a. The second contact plugs 522b may be disposed in the second upper via holes 510b. The third contact plugs 522c may be disposed in the third upper via holes 510c.

Figure 31A:
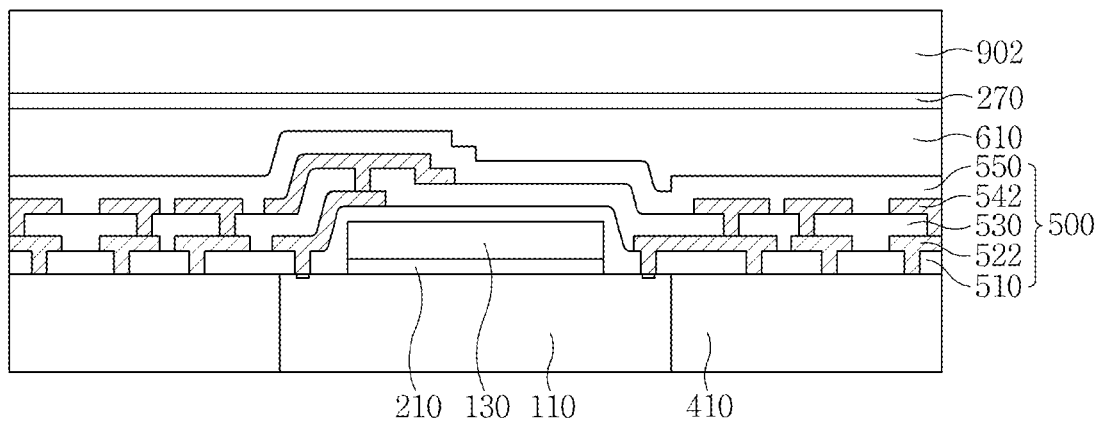
Figure 31B:
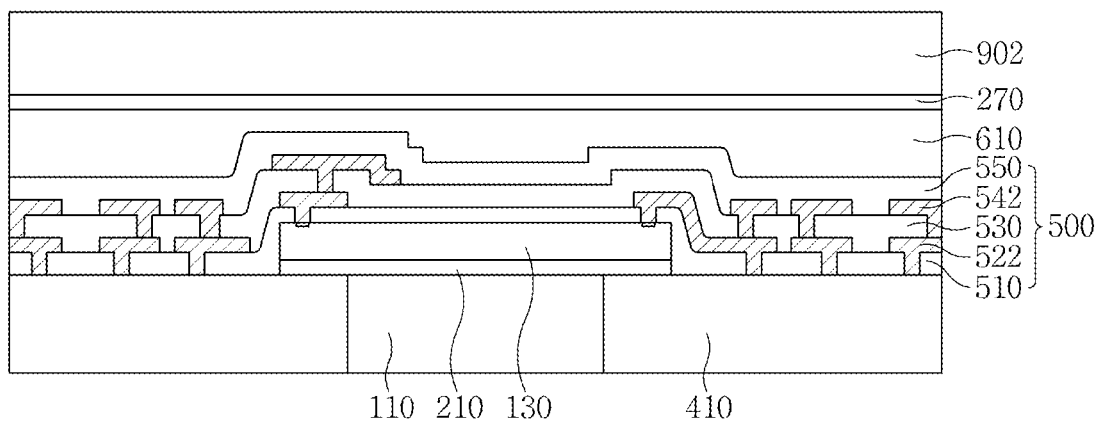
Figure 31C:
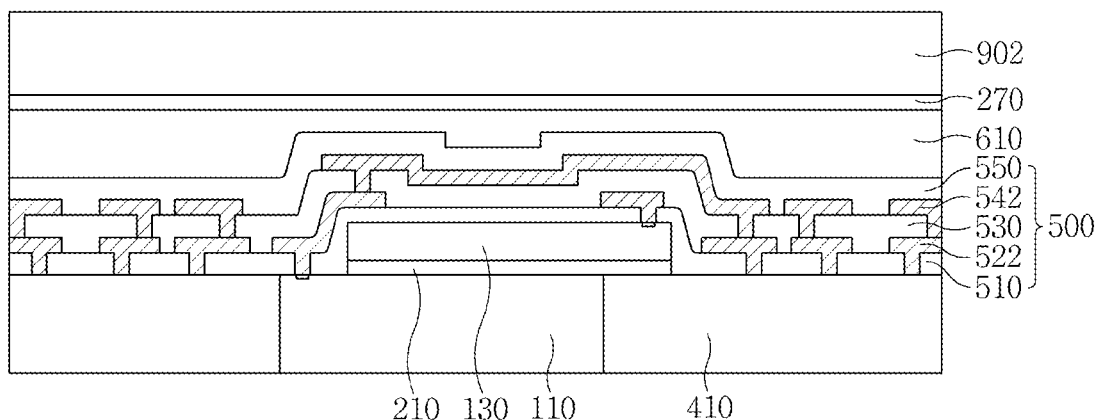

Referring to FIGS. 31A to 31C, the method of fabricating a semiconductor package in accordance with example embodiments of inventive concepts may include a process of forming an upper molding element 610 on the connecting structure 500, a process of forming a second carrier adhesive layer 270 and a second carrier 902 on the upper molding element 610, and a process of etching lower surfaces of the lower molding element 410 and lower semiconductor chip 110.

The process of etching the lower surfaces of the lower molding element 410 and the lower semiconductor chip 110 may include a process of grinding or etching back the lower surfaces of the lower molding element 410 and the lower semiconductor chip 110. The process of etching the lower surfaces of the lower molding element 410 and the lower semiconductor chip 110 may include a process of making the vertical height of the lower molding element 410 the same as that of the lower semiconductor chip 110.

Figure 32A:
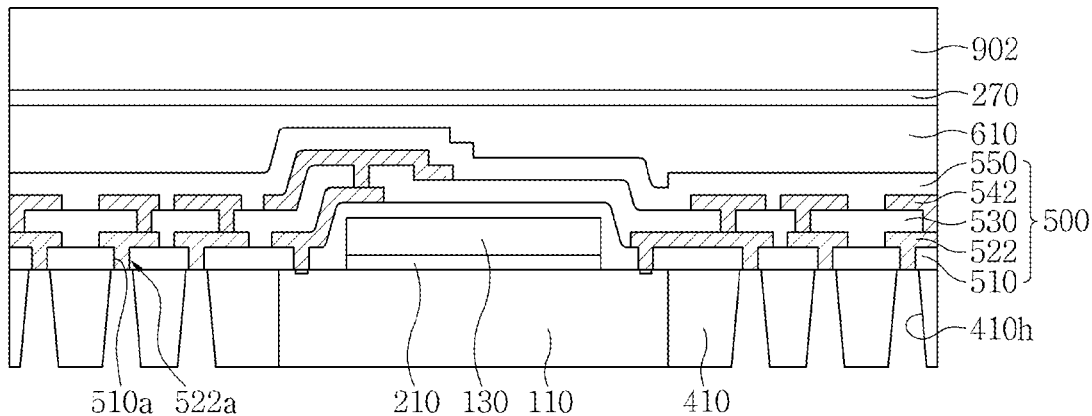
Figure 32B:
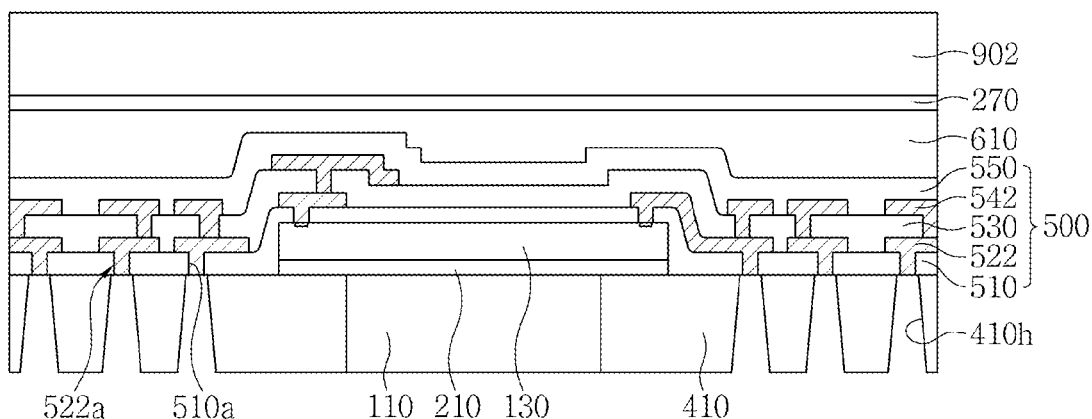
Figure 32C:
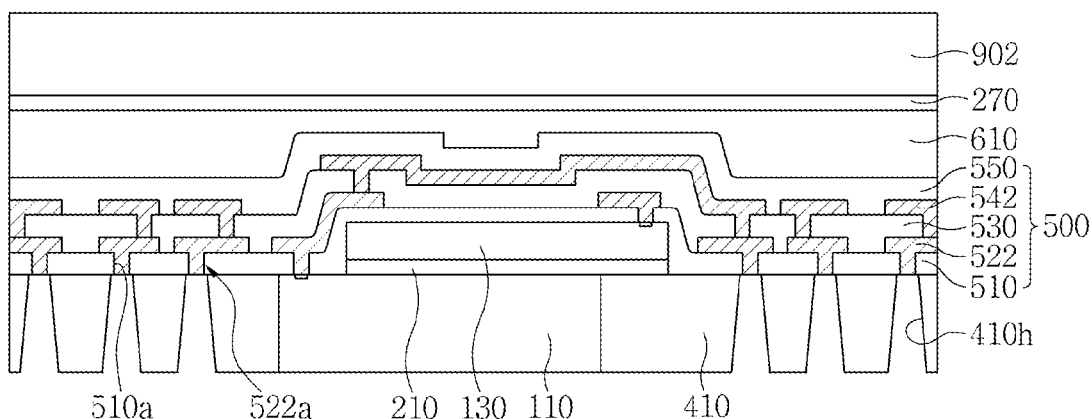

Referring to FIGS. 32A to 32C, the method of fabricating a semiconductor package in accordance with example embodiments of inventive concepts may include a process of forming pillar via holes 410h in the lower molding element 410.

The process of forming the pillar via holes 410h in the lower molding element 410 may include a process of exposing lower surfaces of the first contact plugs 522a. The horizontal width of the upper surface of the lower molding element 410 of the pillar via holes 410h may be greater than that of the first upper via holes 510a.

The process of exposing the lower surface of the first contact plugs 522a may include a process of etching the lower molding element 410 disposed under the first contact plugs 522a. The process of etching the lower molding element 410 disposed under the first contact plugs 522a may include a laser drilling process. The horizontal width of the lower surface of the lower molding element 410 of the pillar via holes 410h may be greater than that of the upper surface of the lower molding element 410 of the pillar via holes 410h.

Figure 33A:
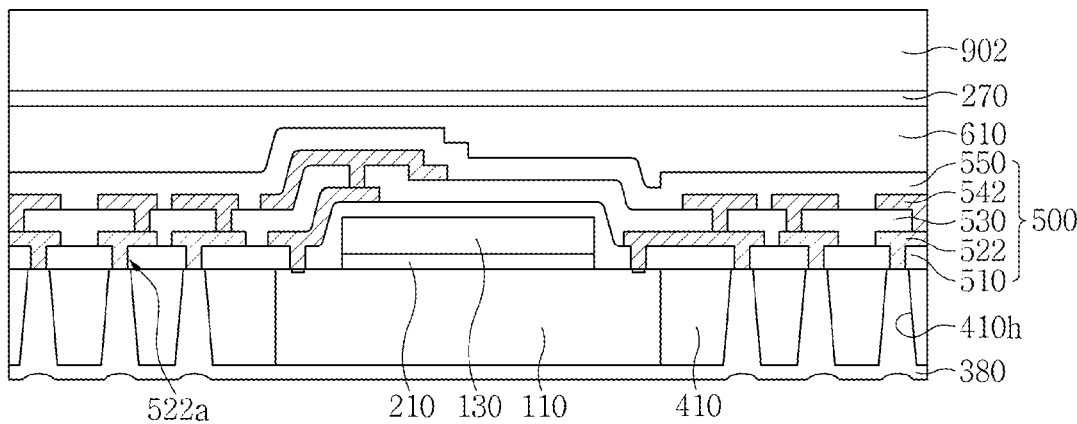
Figure 33B:
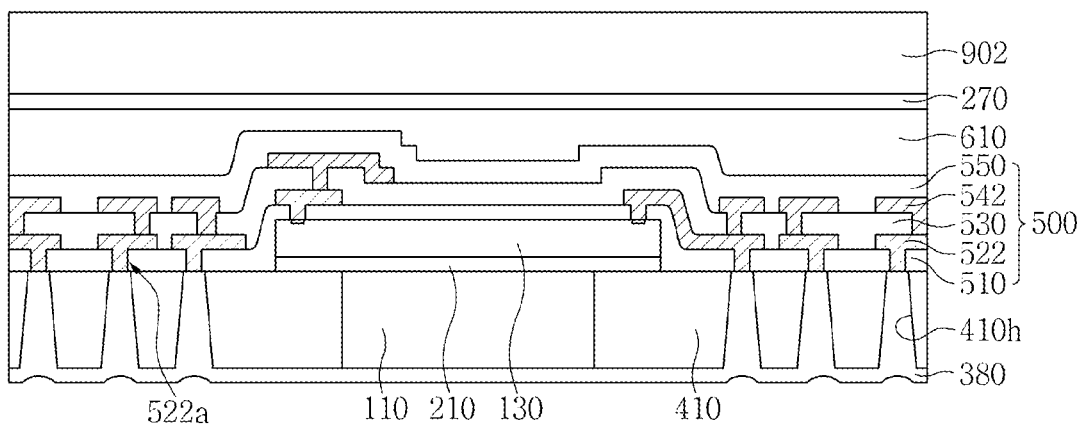
Figure 33C:
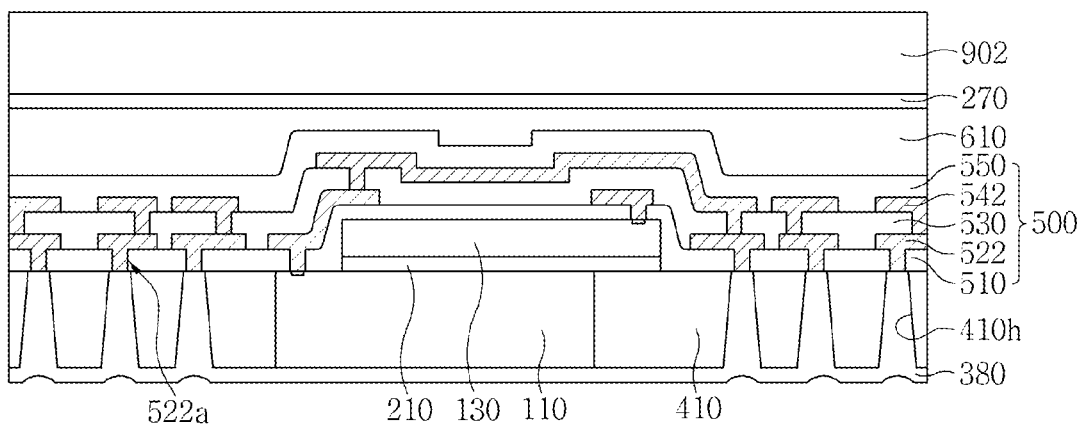

Referring to FIGS. 33A to 33C, the method of fabricating a semiconductor package in accordance with example embodiments of inventive concepts may include a process of forming a conductive layer 380 on the lower surfaces of the lower molding element 410 and the lower semiconductor chip 110.

The process of forming the conductive layer 380 on the lower surface of the lower molding element 410 and the lower surface of the lower semiconductor chip 110 may include a process of filling the pillar via holes 410h with the conductive layer 380. The conductive layer 380 may be in direct contact with the lower surface of the first contact plugs 522a through the pillar via holes 410h.

Figure 34A:
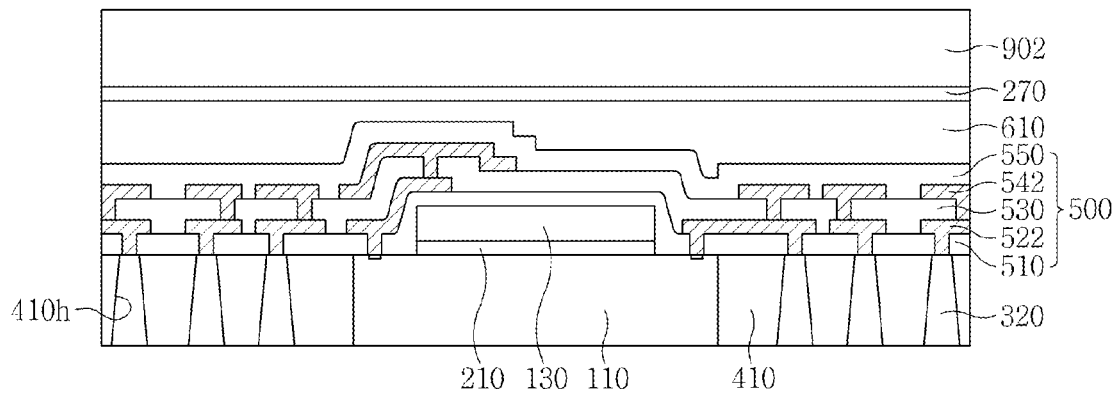
Figure 34B:
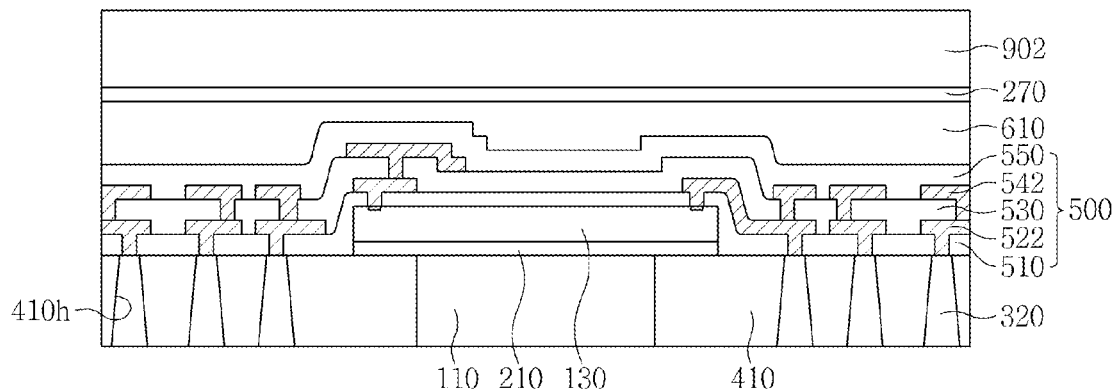
Figure 34C:
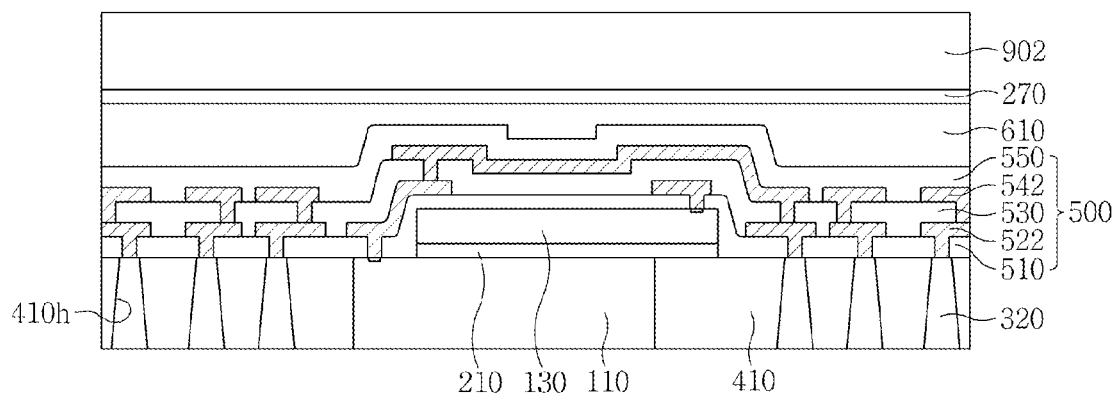

Referring to FIGS. 34A to 34C, the method of fabricating a semiconductor package in accordance with example embodiments of inventive concepts may include a process of forming conductive pillars 320 in the pillar via holes 410h.

The process of forming the conductive pillars 320 in the pillar via holes 410h may include a process of removing the conductive layer 380 disposed on the lower surface of the lower molding element 410 and the lower surface of the lower semiconductor chip 110. The process of removing the conductive layer 380 disposed on the lower surface of the lower molding element 410 and the lower surface of the lower semiconductor chip 110 may include a process of planarizing a lower surface of the conductive layer 380 until the lower surface of the lower molding element 410 and the lower surface of the lower semiconductor chip 110 are exposed. The process of planarizing the lower surface of the conductive layer 380 may include a Chemical Mechanical Polishing (CMP) process.

Figure 35A:
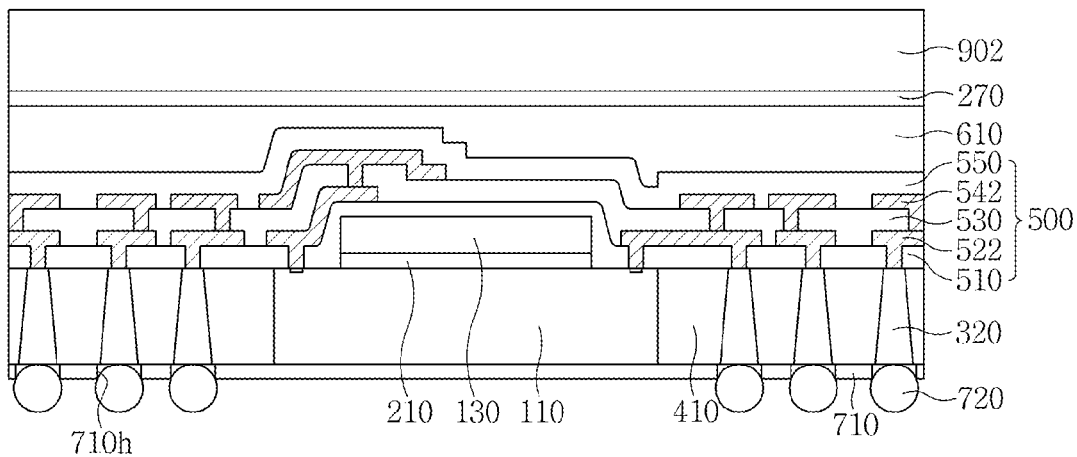
Figure 35B:
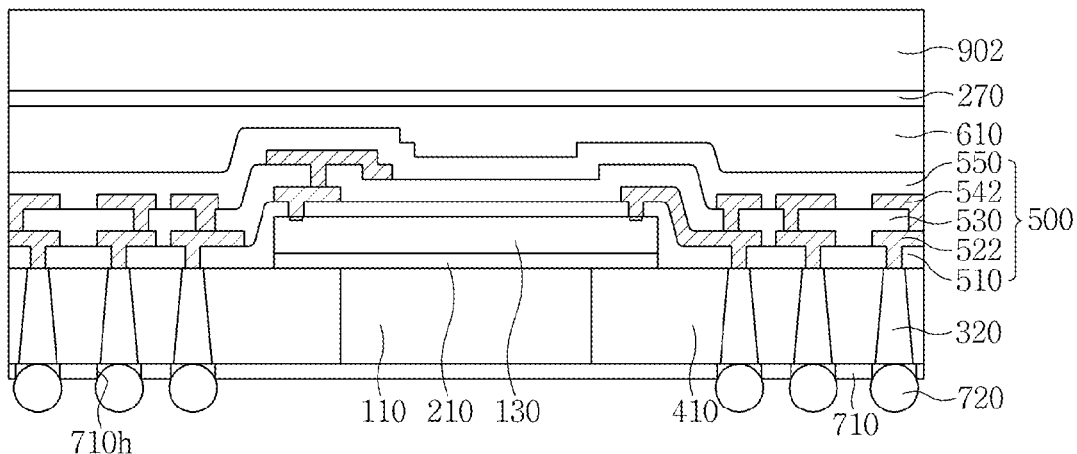
Figure 35C:
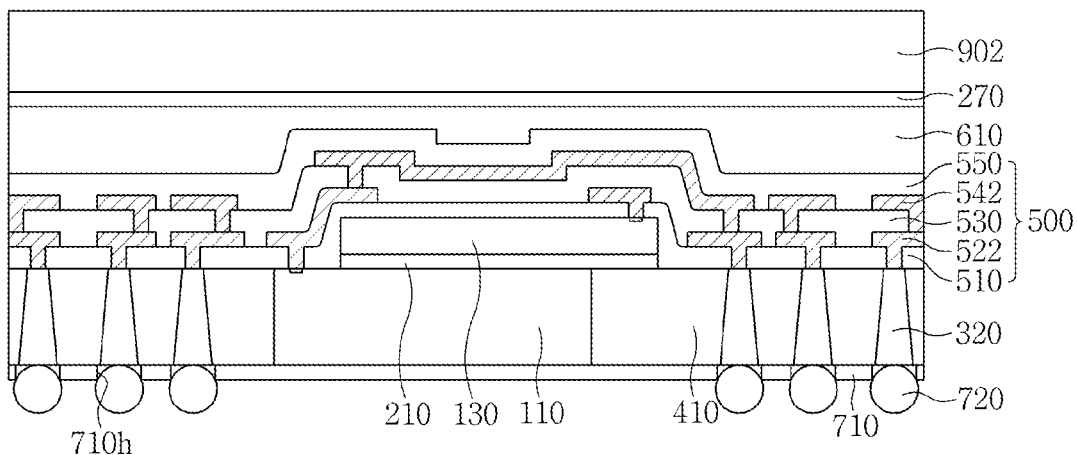
Figure 36A:
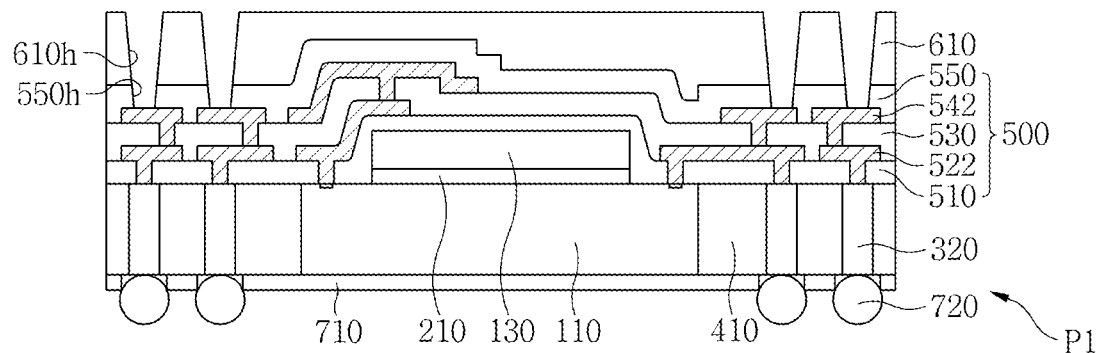
FIGS. 36A to 36C, and 37A to 37C are cross-sectional views sequentially describing a method of fabricating a semiconductor package in accordance with example embodiments of inventive concepts.
Figure 36B:
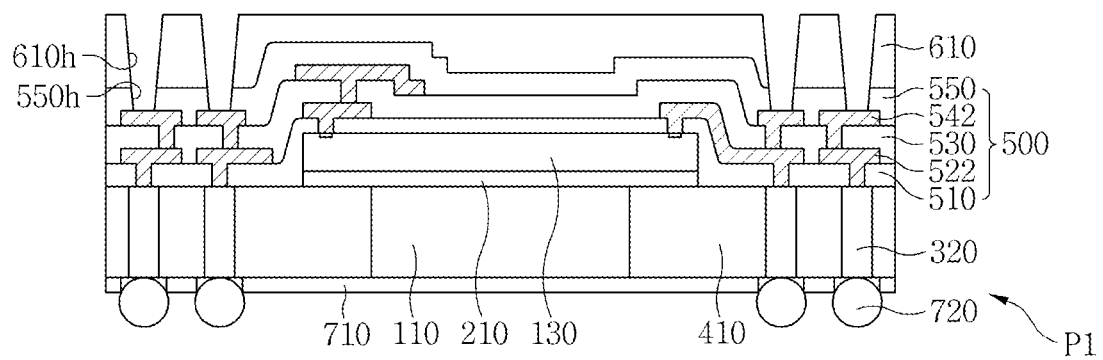
Figure 36C:
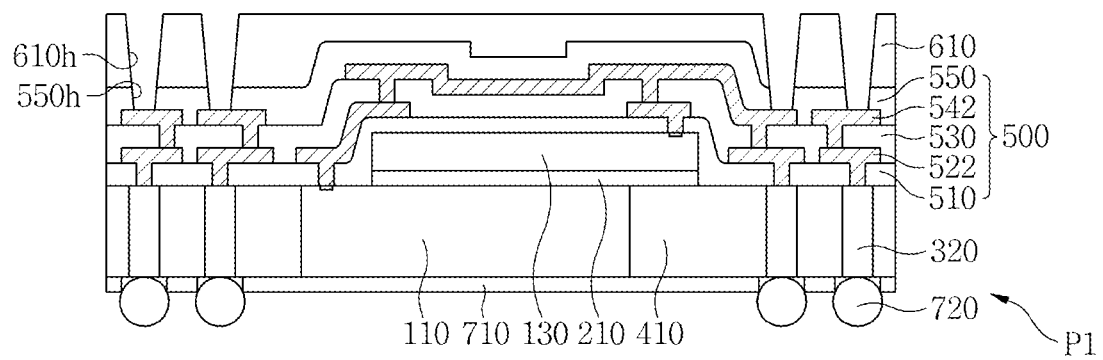

Referring to FIGS. 35A to 35C, the method of fabricating a semiconductor package in accordance with example embodiments of inventive concepts may include a process of forming a lower insulating layer 710 on lower surfaces of the conductive pillars 320, the lower molding element 410, and the lower semiconductor chip 110, a process of forming lower via holes 710h exposing the lower surfaces of the conductive pillars 320 in the lower insulating layer 710, and a process of forming external terminals 720 in direct contact with the lower surfaces of the conductive pillars 320 in the lower via holes 710h.

Referring to FIGS. 5A to 5C, the method of fabricating a semiconductor package in accordance with example embodiments of inventive concepts may include a process of forming a unit package by removing the second carrier 902 and the second carrier adhesive layer 270, and by a sawing process.

FIGS. 6A to 6C, 36A to 36C, and 37A to 37C are cross-sectional views sequentially describing a method of fabricating a semiconductor package in accordance with example embodiments of inventive concepts.

The method of fabricating a semiconductor package in accordance with example embodiments of inventive concepts will be described with reference to FIGS. 6A to 6C, 36A to 36C, and 37A to 37C. First, referring to FIGS. 36A to 36C, the method of fabricating a semiconductor package in accordance with example embodiments of inventive concepts may include a process of forming first package via holes 550h and second package via holes 610h in a lower package P1.

The process of forming the first package via holes 550h and the second package via holes 610h in the lower package P1 may include a process of providing the lower package P1 having a lower semiconductor chip 110, an upper semiconductor chip 130, conductive pillars 320, a lower molding element 410, a connecting structure 500, an upper molding element 610, and external terminals 720, a process of forming the second package via holes 610h in the upper molding element 610 of the lower package P1, and a process of forming the first package via holes 550h in a third upper insulating layer 550 of the connecting structure 500. The first package via holes 550h and the second package via holes 610h may be disposed on upper surfaces of the conductive pillars 320. The first package via holes 550h and the second package via holes 610h may expose an upper surface of a second redistribution pattern 542 of the connecting structure 500.

The process of forming the second package via holes 610h in the upper molding element 610 may include a process of etching the upper molding element 610 disposed on the upper surfaces of the conductive pillars 320. The process of forming the first package via holes 550h on the third upper insulating layer 550 may include a process of etching the third upper insulating layer 550 disposed on the upper surfaces of the conductive pillars 320

The process of etching the upper molding element 610 disposed on the upper surface of the conductive pillars 320, and the process of etching the third upper insulating layer 550 disposed on the upper surfaces of the conductive pillars 320 may be performed in succession. The process of etching the upper molding element 610 disposed on the upper surfaces of the conductive pillars 320, and the process of etching the third upper insulating layer 550 disposed on the upper surfaces of the conductive pillars 320 may include a laser-drilling process. Sidewalls of the first package via holes 550h may continue to sidewalls of the second package via holes 610h.

Figure 37A:
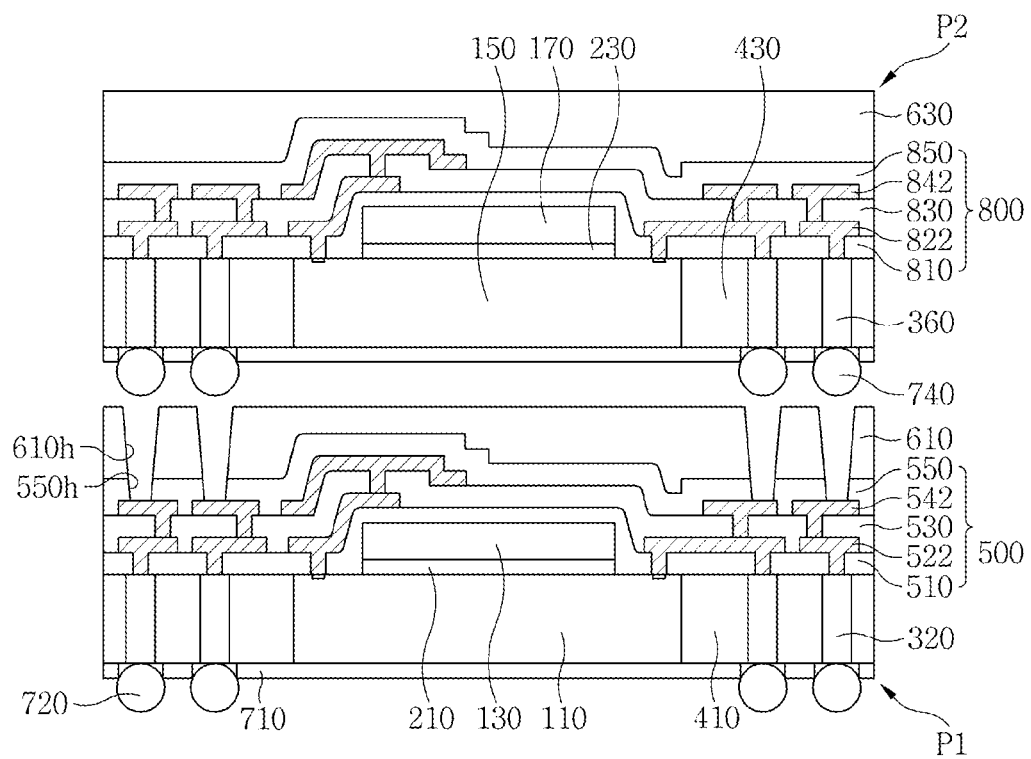
Figure 37B:
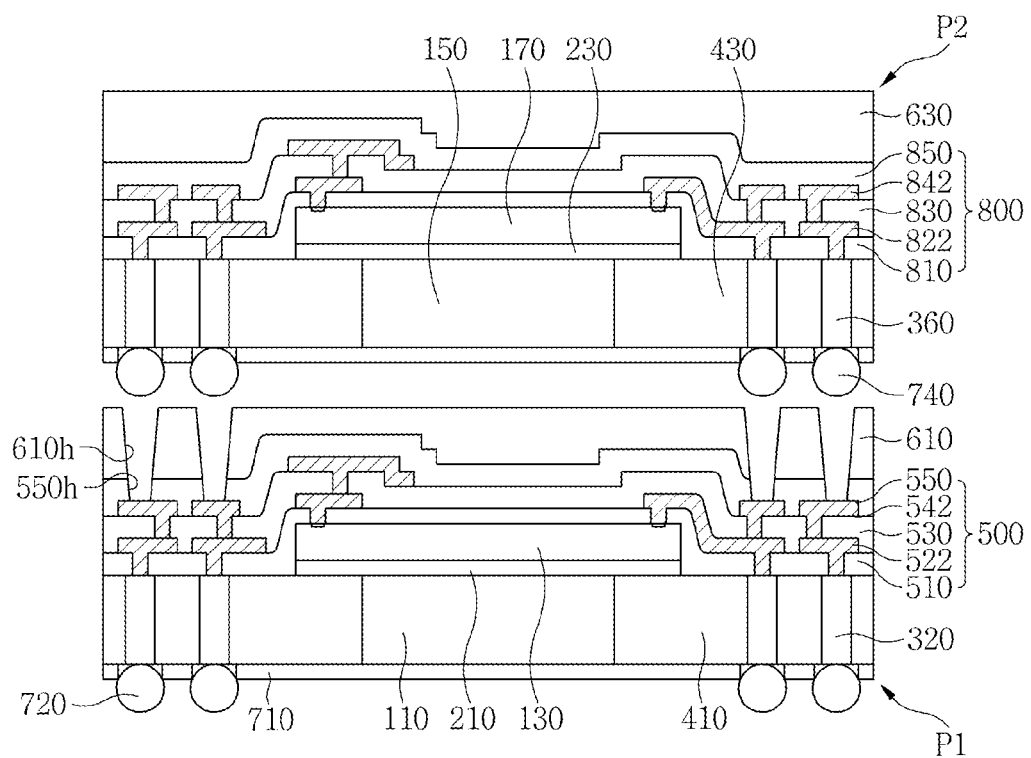
Figure 37C:
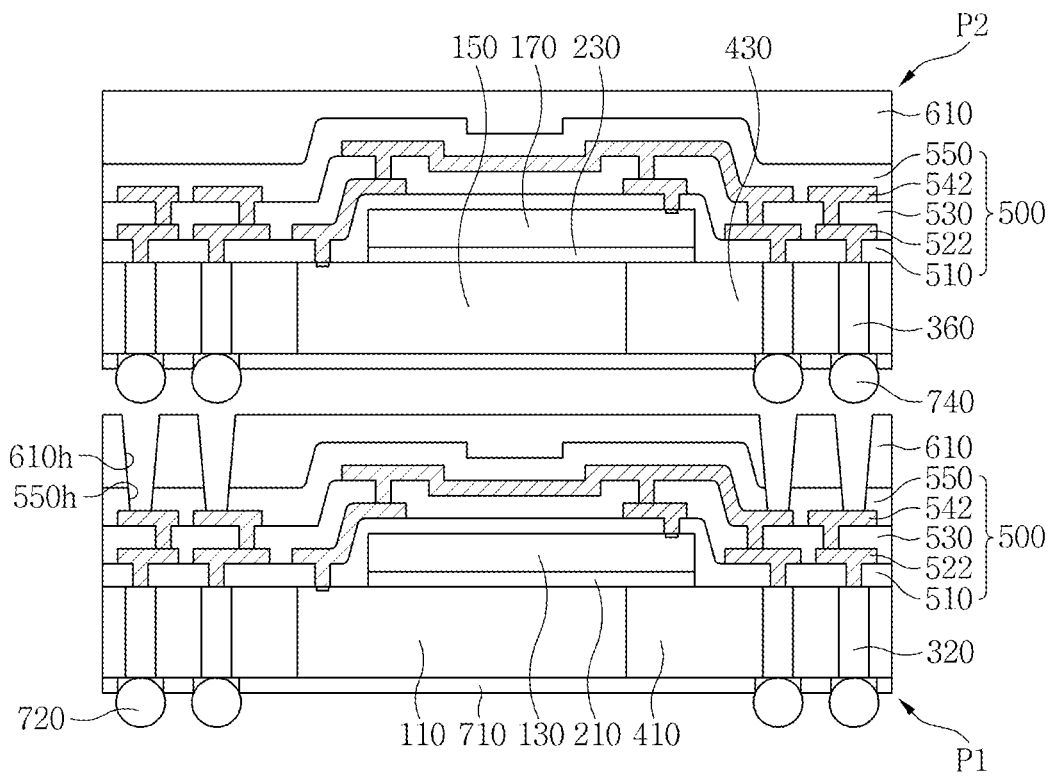

Referring to FIGS. 37A to 37C, the method of fabricating a semiconductor package in accordance with example embodiments of inventive concepts may include a process of aligning the upper package P2 on an upper surface of the lower package P1.

The process of aligning the upper package P2 on the upper surface of the lower package P1 may include a process of providing the upper package P2 having a lower semiconductor chip 150, an upper semiconductor chip 170, conductive pillars 360, a lower molding element 430, a connecting structure 800, an upper molding element 630, and package connecting elements 740, and a process of aligning the upper package P2 so that the package connecting elements 740 of the upper package P2 are disposed on upper surfaces of the second package via holes 610h of the lower package P1.

The process of providing the upper package P2 may include a process of forming the package connecting elements 740 on lower surfaces of the conductive pillars 360 before forming the unit package.

Referring to FIGS. 6A to 6C, the method of fabricating a semiconductor package in accordance with example embodiments of inventive concepts may include a process of electrically connecting the package connecting elements 740 to the second redistribution pattern 542 of the connecting structure 500 of the lower package P1 through the first package via holes 550h and second package via holes 610h of the lower package P1.

The process of electrical connecting the package connecting elements 740 to the second redistribution pattern 542 of the connecting structure 500 of the lower package P1 may include a process of filling the first package via holes 550h and second package via holes 610h of the lower package P1 with the package connecting elements 740.

The process of filling the first package via holes 550h and second package via holes 610h of the lower package P1 with the package connecting elements 740 may include a process of adjusting a space between the lower package P1 and the upper package P2 so that some of the package connecting elements 740 are inserted in the second package via holes 610h, and a process of reflowing the package connecting elements 740.

Figure 38:
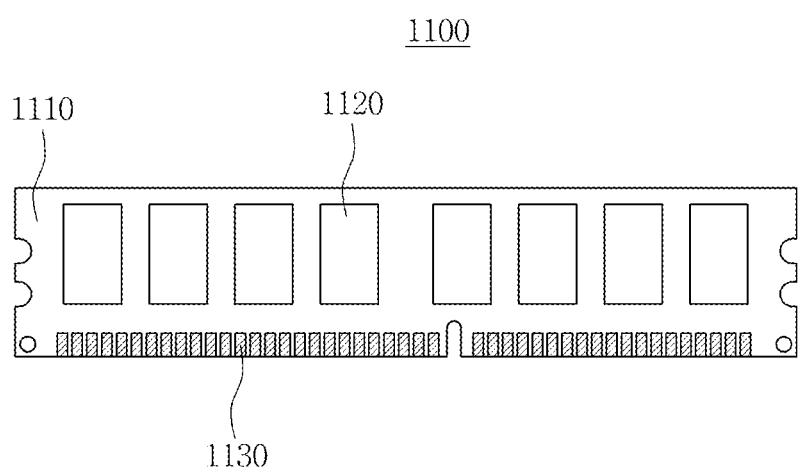
FIG. 38 is a configuration diagram showing a memory module including a semiconductor package in accordance with example embodiments of inventive concepts.

FIG. 38 is a configuration diagram showing a memory module including a semiconductor package in accordance with example embodiments of inventive concepts.

Referring to FIG. 38, the memory module 1100 in accordance with example embodiments of inventive concepts may include a module substrate 1100, semiconductor packages 1120, and module contact terminals 1130. The semiconductor packages 1120 may be the semiconductor packages in accordance with example embodiments of inventive concepts. Accordingly, the memory module 1100 may achieve high integration and small size. The module substrate 1110 may be a system board. The semiconductor packages 1120 may be arranged parallel to the module substrate 1110. The semiconductor packages 1120 may be arranged in both sides of the module substrate 1110. The module contact terminals 1130 may be formed in parallel in an edge of the module substrate 1110. The module contact terminals 1130 may be electrically connected to the semiconductor packages 1120.

Figure 39:
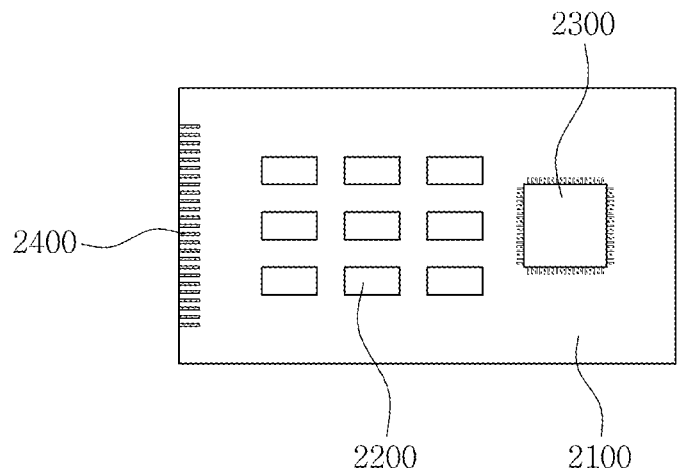
FIG. 39 is a configuration diagram showing a semiconductor module including a semiconductor package in accordance with example embodiments of inventive concepts.

FIG. 39 is a configuration diagram showing a semiconductor module including a semiconductor package in accordance with example embodiments of inventive concepts.

Referring to FIG. 39, the semiconductor module 2000 may include a module substrate 2100, memories 2200, microprocessors 2300, and input/output terminals 2400. The memories 2200 and the microprocessors 2300 may be mounted on the module substrate 2100. The memories 2200 may include semiconductor packages in accordance with example embodiments of inventive concepts. Accordingly, the semiconductor module 2000 may achieve high integration and small size. The semiconductor module 2000 may include a memory card or a card package.

Figure 40:
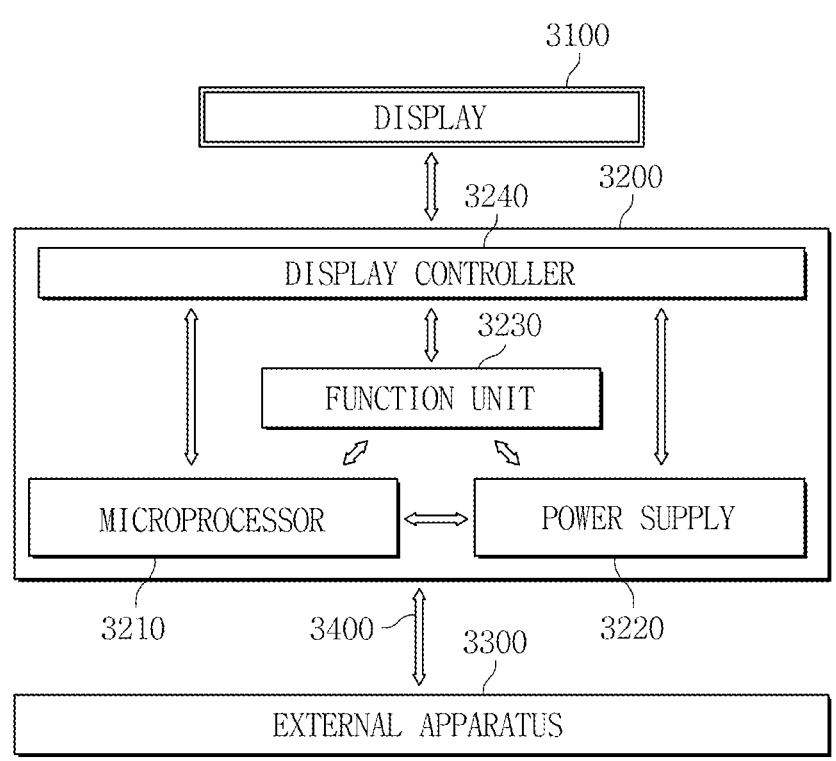
FIG. 40 is a configuration diagram showing a mobile system including a semiconductor package in accordance with example embodiments of inventive concepts.

FIG. 40 is a configuration diagram showing a mobile system including a semiconductor package in accordance with example embodiments of inventive concepts.

Referring to FIG. 40, the mobile system 3000 may include a display unit 3100, a body 3200, and an external apparatus 3300. The body 3200 may be a system board or a mother board including a printed circuit board (PCB). The body 3200 may include a microprocessor unit 3210, a power supply 3220, a function unit 3230, and a display controller unit 3240. The microprocessor unit 3210, the power supply 3220, the function unit 3230, and the display controller unit 3240 may be mounted or installed on the body 3200. The microprocessor unit 3210 may receive a voltage from the power supply 3220 to control the function unit 3230 and the display controller unit 3240. The power supply 3220 may receive a constant voltage from an external power source (not shown), etc., divide the voltage into various levels, and supply those voltages to the microprocessor unit 3210, the function unit 3230, and the display controller unit 3240. The function unit 3230 may perform various functions of the mobile systems 3000. For example, the function unit 3230 may have several components which can perform functions of a mobile phone such as dialing, video output to the display unit 3100 through communication with an external apparatus 3300, and sound output to a speaker, and if a camera is installed, the function unit 3230 may function as an image processor. The microprocessor unit 3210 and the function unit 3230 may include a semiconductor package in accordance with example embodiments of inventive concepts, in order to process various signals. Accordingly, the mobile system 3000 may achieve high integration and small size. The display unit 3100 may be located on a surface of the body 3200. The display unit 3100 may be connected to the body 3200. The display unit 3100 may display an image processed by the display controller unit 3240 of the body 3200. The mobile system 3000 may be connected to a memory card, etc. in order to expand capacity. In this case, the function unit 3230 may include a memory card controller. The function unit 3230 may exchange signals with the external apparatus 3300 through a wired or wireless communication unit 2400. In addition, the mobile system 3000 2000 may include a universal serial bus (USB) in order to expand functionality. In this case, the function unit 3230 may function as an interface controller.

Figure 41:
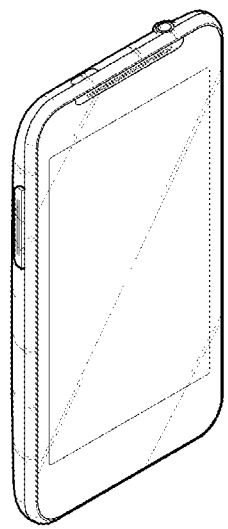
FIG. 41 is a configuration diagram showing a mobile apparatus including a semiconductor package in accordance with example embodiments of inventive concepts.

FIG. 41 is a configuration diagram showing a mobile apparatus including a semiconductor package in accordance with example embodiments of inventive concepts.

Referring to FIG. 41, the mobile apparatus 4000 may be a mobile wireless phone, or a tablet PC. The mobile apparatus 4000 may include a semiconductor package in accordance with example embodiments of inventive concepts. Accordingly, the mobile apparatus 4000 may achieve high integration and small size.

Figure 42:
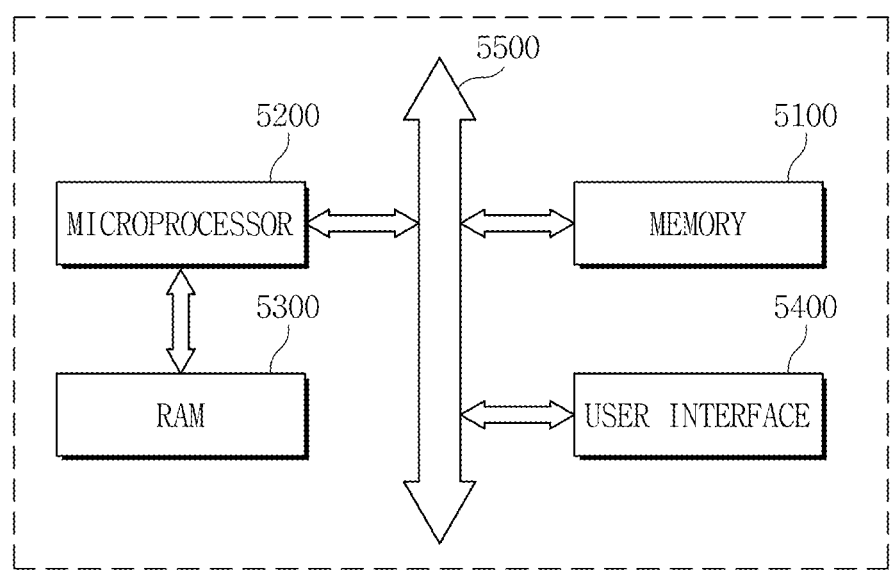
FIG. 42 is a configuration diagram showing an electronic system including a semiconductor package in accordance with example embodiments of inventive concepts.

FIG. 42 is a configuration diagram showing an electronic system including a semiconductor package in accordance with example embodiments of inventive concepts.

Referring to FIG. 42, the electronic system 5000 may include a semiconductor package in accordance with example embodiments of inventive concepts. The electronic system 5000 may be used to fabricate a mobile apparatus or a computer. For example, the electronic system 5000 may include a memory system 5100, a microprocessor 5200, a random access memory (RAM) 5300, and a user interface 5400 performing data communication using a bus 5500. The microprocessor 5200 may program and control the electronic system 5000. The RAM 5300 may be used as an operation memory of the microprocessor 5200. For example, the microprocessor 5200 or the RAM 5300 may include a semiconductor package in accordance with example embodiments of inventive concepts. Accordingly, the electronic system 5000 may achieve high integration and small size. The microprocessor 5200, the RAM 5300, and/or other components can be assembled in a single package. The user interface 5400 may be used to input data to, or output data from the electronic system 5000. The memory system 5100 may store codes for operating the microprocessor 5200, data processed by the microprocessor 5200, or external input data. The memory system 5100 may include a controller and a memory.

While some example embodiments have been particularly shown and described, it will be understood by one of ordinary skill in the art that variations in form and detail may be made therein without departing from the spirit and scope of the claims.

What is claimed is:

1. A semiconductor package, comprising:
a lower molding element including a first side, a second side opposite the first side, a third side substantially perpendicular to the first side, and a fourth side opposite the third side;
a lower semiconductor chip in the lower molding element,
the lower semiconductor chip including lower chip pads on an upper surface of the lower semiconductor chip and at areas close to the first side and the second side of the lower molding element, the lower semiconductor chip having an upper surface at a same level as an upper surface of the lower molding element;
conductive pillars passing through the lower molding element,
the conductive pillars surrounding the lower semiconductor chip;
an upper semiconductor chip on the upper surface of the lower molding element and the lower semiconductor chip,
the upper semiconductor chip including upper chip pads on a top surface of the upper semiconductor chip and at areas close to the third side and the fourth side of the lower molding element,
the upper semiconductor chip being substantially orthogonal to the lower semiconductor chip; and
a connecting structure on the lower molding element and the upper semiconductor chip,
the connecting structure electrically connecting each of the lower chip pads and upper chip pads to a corresponding conductive pillar,
the connecting structure including a first upper insulating layer in direct contact with the upper surface of the lower molding element, the upper surface of the lower semiconductor chip, and side and upper surfaces of the upper semiconductor chip,
the connecting structure including a first redistribution pattern on the first upper insulating layer, and a second upper insulating layer on the first redistribution pattern, and
the first redistribution pattern including first contact plugs in direct contact with upper surfaces of the conductive pillars, second contact plugs in direct contact with upper surfaces of the lower chip pads, and third contact plugs in direct contact with upper surfaces of the upper chip pads.

2. The semiconductor package of claim 1, wherein sides of the second upper insulating layer are farther away from the upper semiconductor chip than outermost sides of the first redistribution pattern.

3. The semiconductor package of claim 2, wherein the sides of the second upper insulating layer are vertically aligned with sides of the first upper insulating layer.

4. The semiconductor package of claim 1, wherein
the connecting structure further comprises a second redistribution pattern on the second upper insulating layer,
the second redistribution pattern comprises fourth contact plugs in direct contact with an upper surface of the first redistribution pattern, and
the connecting structure further comprises a third insulating layer on the second redistribution pattern.

5. The semiconductor package of claim 4, wherein
sides of the third upper insulating pattern are farther away from the upper semiconductor chip than outermost sides of the second redistribution pattern, and
the sides of the third upper insulating pattern are vertically aligned with the sides of the second upper insulating layer.

6. The semiconductor package of claim 4, wherein
some of the lower chip pads are electrically connected to corresponding upper chip pads, and
the second redistribution pattern is configured to supply a same signal to the some of the lower chip pads and the corresponding upper chip pads.

7. The semiconductor package of claim 1, further comprising:
external terminals, wherein each of the external terminals is in direct contact with a lower surface of one of the conductive pillars.

8. The semiconductor package of claim 1, wherein a vertical height of the upper semiconductor chip is smaller than a vertical height of the lower semiconductor chip.

9. The semiconductor package of claim 8, wherein the vertical height of the lower semiconductor chip is the same as a vertical height of the lower molding element.

10. The semiconductor package of claim 1, further comprising:
an adhesive layer between the lower semiconductor chip and the upper semiconductor chip, wherein
the adhesive layer is in direct contact with the upper surface of the lower semiconductor chip, and
the adhesive layer is in direct contact with a lower surface of the upper semiconductor chip.

11. The semiconductor package of claim 10, wherein the adhesive layer extends between the upper semiconductor chip and the lower molding element.

12. A semiconductor package, comprising:
a lower semiconductor chip including lower chip pads on an upper surface thereof, the lower chip pads being close to two opposite sides of the lower semiconductor chip;

a lower molding element surrounding sides of the lower semiconductor chip;

conductive pillars penetrating the lower molding element along edges of the lower molding element;

external terminals in direct contact one-to-one with lower surfaces of the conductive pillars;

an upper semiconductor chip on the upper surface of the lower semiconductor chip, the upper semiconductor chip including upper chip pads on an upper surface thereof, the upper semiconductor chip not covering the lower chip pads;

a connecting structure on the lower molding element and the upper semiconductor chip, the connecting structure including sides that are vertically aligned with sides of the lower molding element, the connecting structure electrically connecting each of the lower chip pads and the upper chip pads to corresponding ones of the external terminals through corresponding ones of the conductive pillars; and an upper molding element on an upper surface of the connecting structure, the upper molding element including sides that are vertically aligned with sides of the connecting structure.

13. The semiconductor package of claim 12, wherein a coefficient of the thermal expansion of the lower molding element is smaller than a coefficient of the thermal expansion of the upper molding element.

14. The semiconductor package of claim 12, wherein the lower molding element is harder than the upper molding element.

15. A semiconductor package, comprising:

a lower semiconductor chip including a plurality of lower chip pads on two opposite ends of an upper surface, and a plurality of sides;

a lower molding element surrounding the plurality of sides of the lower semiconductor chip and exposing the upper surface of the lower semiconductor chip;

an upper semiconductor chip orthogonally crossing over the upper surface of the semiconductor chip between the plurality of lower chip pads on opposite ends, the upper semiconductor chip including a plurality of upper chip pads on two portions of the upper semiconductor chip, the two portions of the upper semiconductor chip extending over the lower molding element from two sides of the plurality of sides of the lower semiconductor chip;

a plurality of conductive pillars that are spaced apart from the lower semiconductor chip and extend through the lower molding element; and a connecting structure that electrically connects upper surfaces of the plurality of lower chip pads and upper surfaces of the plurality of upper chip pads to upper surfaces of the plurality of conductive pillars.

16. The semiconductor package of claim 15, further comprising:

a plurality of external terminals electrically connected one-to-one to bottom surfaces of the plurality of conductive pillars.

17. The semiconductor package of claim 15, wherein the connecting structure includes a first insulating layer on the molding layer, the two opposite ends of the lower semiconductor chip, and the upper semiconductor chip;

the first insulating layer defines first upper via holes that expose the upper surfaces of the plurality of conductive pillars, second upper via holes that expose the upper surfaces of the plurality of lower chip pads, and third upper via holes that expose the upper surfaces of the plurality of upper chip pads; and the connecting structure includes a first redistribution pattern on the first insulating layer.

18. The semiconductor package of claim 17, wherein the connecting structure further includes a second insulating layer on the first redistribution pattern, sides of the second insulating layer being farther away from the upper semiconductor chip than outermost sides of the first redistribution pattern.

19. The semiconductor package of claim 15, further comprising:

an upper molding element on the upper semiconductor chip and the lower molding element, wherein at least one of a coefficient of the thermal expansion of the lower molding element is smaller than a coefficient of the thermal expansion of the upper molding element, and a hardness of the lower molding element is harder than a hardness of the upper molding element.

* * * * *